(12) United States Patent
Ishizaki et al.

(10) Patent No.: US 12,193,165 B2
(45) Date of Patent: *Jan. 7, 2025

(54) DETECTION DEVICE

(71) Applicant: Japan Display Inc., Tokyo (JP)

(72) Inventors: Koji Ishizaki, Tokyo (JP); Daisuke Sonoda, Tokyo (JP); Toshimasa Ishigaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/378,796

(22) Filed: Oct. 11, 2023

(65) Prior Publication Data

US 2024/0040707 A1 Feb. 1, 2024

Related U.S. Application Data

(63) Continuation of application No. 17/738,183, filed on May 6, 2022, now Pat. No. 11,818,848, which is a
(Continued)

(30) Foreign Application Priority Data

Apr. 15, 2014 (JP) .................................. 2014-083824

(51) Int. Cl.
*H05K 3/28* (2006.01)
*G02F 1/1333* (2006.01)
(Continued)

(52) U.S. Cl.
CPC ............ *H05K 3/28* (2013.01); *G06F 3/0412* (2013.01); *G06F 3/044* (2013.01); *G06F 3/0443* (2019.05);
(Continued)

(58) Field of Classification Search
None
See application file for complete search history.

(56) References Cited

U.S. PATENT DOCUMENTS 8,512,847 B2 8/2013 Ito et al.
8,514,356 B2 8/2013 Shiromoto et al.
(Continued)

FOREIGN PATENT DOCUMENTS

EP 0718644 6/1996
JP H05196961 8/1993
(Continued)

OTHER PUBLICATIONS

Japanese Office Action issued Aug. 31, 2017 in Japanese Application No. 2014-083824.
(Continued)

*Primary Examiner* — Ifedayo B Iluyomade
(74) *Attorney, Agent, or Firm* — K&L Gates LLP

(57) ABSTRACT

A detection device is provided including first substrate including first region, second region and third region arranged in first direction, second region arranged between first and third regions; first detection electrode arranged on first substrate; second detection electrode arranged on first substrate and being adjacent to first detection electrode; first electrode coupled to first detection electrode and continuously formed from first to third regions; second electrode coupled to second detection electrode, and continuously formed from first to third regions, convex portions located between first electrode and second electrode in second region and spaced away from first and second electrodes; and protective layer formed on first and second electrodes in first region and not formed on first electrode and second electrode in third region, wherein at least one of convex
(Continued)

portions is covered with protective layer, and at least another one of convex portions is not covered with protective layer.

20 Claims, 32 Drawing Sheets

Related U.S. Application Data continuation of application No. 17/010,252, filed on Sep. 2, 2020, now Pat. No. 11,330,720, which is a continuation of application No. 16/394,559, filed on Apr. 25, 2019, now Pat. No. 10,768,761, which is a continuation of application No. 14/686,155, filed on Apr. 14, 2015, now Pat. No. 10,310,678.

(51) Int. Cl.
*G06F 3/041* (2006.01)
*G06F 3/044* (2006.01)
*H05K 1/11* (2006.01)

(52) U.S. Cl.
CPC .......... *G06F 3/0445* (2019.05); *G06F 3/0446* (2019.05); *G02F 1/13338* (2013.01); *G06F 2203/04103* (2013.01); *H05K 1/11* (2013.01); *H05K 2201/09381* (2013.01)

(56) References Cited

U.S. PATENT DOCUMENTS

| | | | |
|---|---|---|---|
| 9,019,219 B2 | 4/2015 | Cheong et al. | |
| 9,054,244 B2 | 6/2015 | Naganawa et al. | |
| 9,256,307 B2 | 2/2016 | Oh et al. | |
| 9,349,981 B2 | 5/2016 | Kim et al. | |
| 10,310,678 B2 | 6/2019 | Ishizaki et al. | |
| 10,768,761 B2 | 9/2020 | Ishizaki et al. | |
| 11,818,848 B2* | 11/2023 | Ishizaki | G06F 3/0448 |
| 2011/0176097 A1 | 7/2011 | Shiromoto et al. | |
| 2013/0016054 A1 | 1/2013 | Cheong et al. | |
| 2013/0314625 A1 | 11/2013 | Tsai et al. | |
| 2013/0330858 A1 | 12/2013 | Shiromoto et al. | |
| 2015/0268776 A1* | 9/2015 | Ishizaki | G02F 1/13338 427/466 |
| 2017/0222180 A1 | 8/2017 | Sato et al. | |

FOREIGN PATENT DOCUMENTS

| | | |
|---|---|---|
| JP | 08-227012 | 9/1996 |
| JP | 09-203803 | 8/1997 |
| JP | 2006323292 | 11/2006 |
| JP | 2008-183489 | 8/2008 |
| JP | 2011-145535 | 7/2011 |
| JP | 201438580 | 2/2014 |
| KR | 10-2013-0108027 | 10/2013 |
| TW | 200937457 | 9/2009 |
| TW | 201133613 | 10/2011 |
| TW | 201213954 | 4/2012 |

OTHER PUBLICATIONS

Taiwanese Office Action issued Sep. 21, 2016 in Taiwanese Application No. 104109443.

* cited by examiner

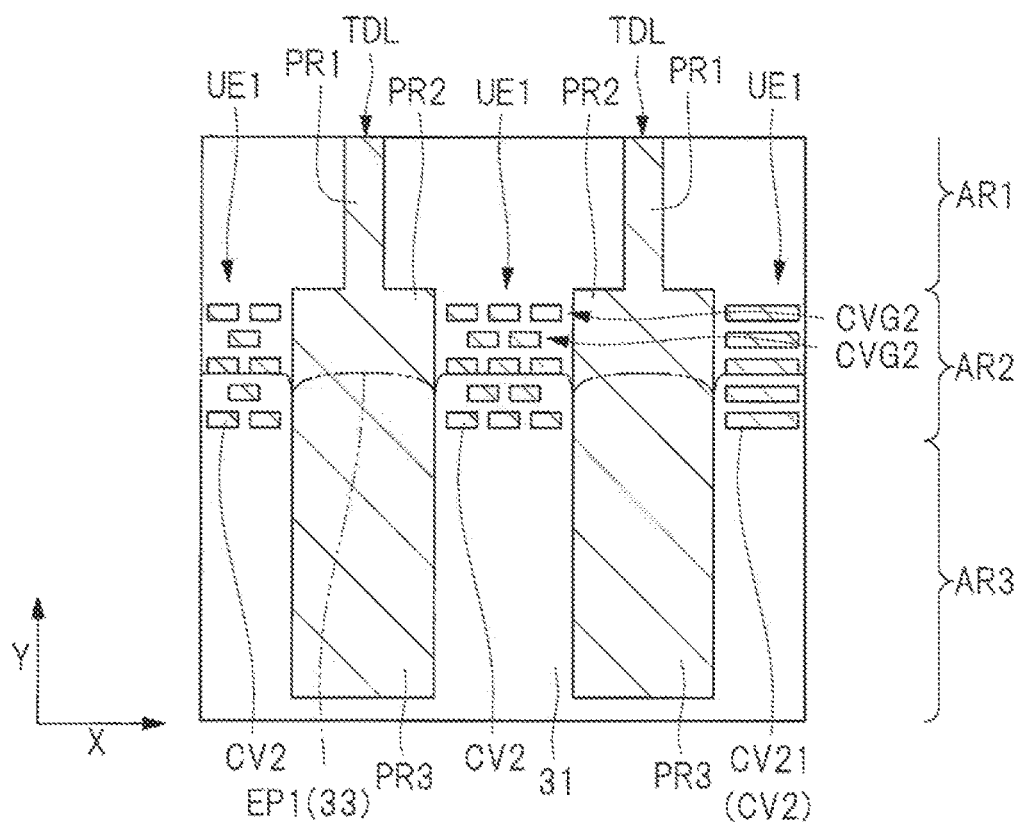
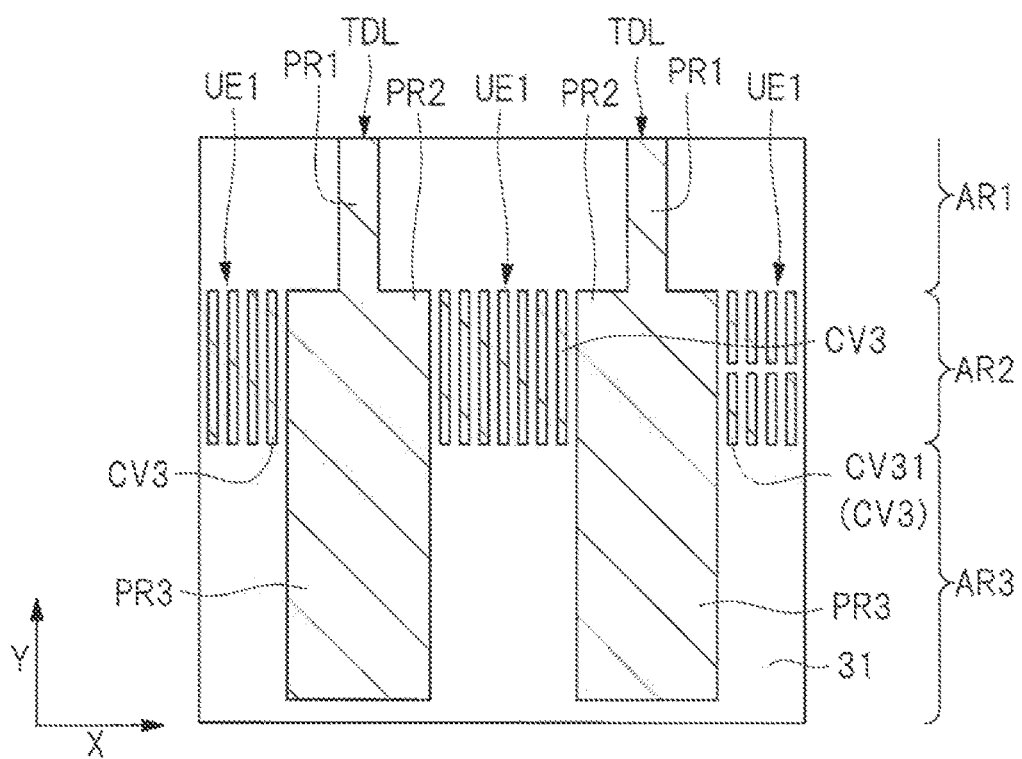

FIG. 28
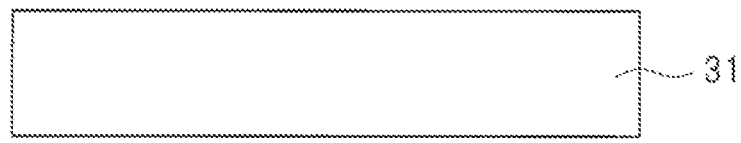
(a)
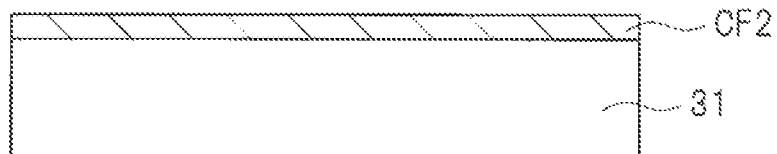
(b)
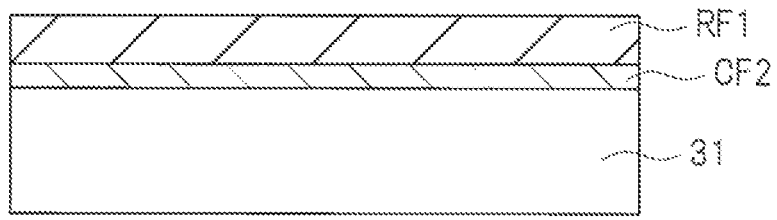
(c)
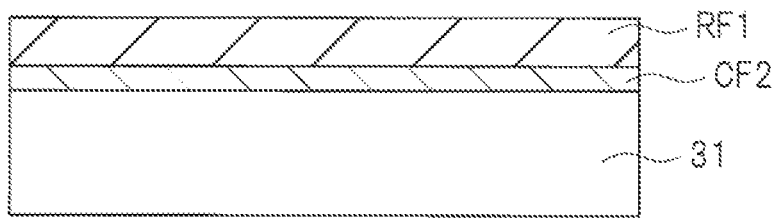
(d)
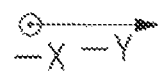

DETECTION DEVICE

CROSS REFERENCES TO RELATED APPLICATIONS

The present application is a continuation of U.S. patent application Ser. No. 17/738,183, filed on May 6, 2022, which application is a continuation of U.S. patent application Ser. No. 17/010,252, filed on Sep. 2, 2020, and issued as U.S. Pat. No. 11,330,720 on May 10, 2022, which application is a continuation of U.S. patent application Ser. No. 16/394,559, filed on Apr. 25, 2019, and issued as U.S. Pat. No. 10,768,761 on Sep. 8, 2020, which application is a continuation of U.S. patent application Ser. No. 14/686,155, filed on Apr. 14, 2015, and issued as U.S. Pat. No. 10,310,678 on Jun. 4, 2019, which application claims priority to Japanese Priority Patent Application JP 2014-083824 filed in the Japan Patent Office on Apr. 15, 2014, the entire content of which is hereby incorporated by reference.

BACKGROUND

The present invention relates to an electrode substrate, a display device, an input device, and a method of manufacturing an electrode substrate.

In recent years, a technique of attaching an input device referred to as a touch panel or a touch sensor to a display surface side of a display device and detecting and outputting an input position when input operations are performed by contacting the touch panel with a finger or an input tool such as a touch pen has been known. Such display devices having a touch panel are widely used in portable information terminals such as mobile phones in addition to computers.

One detecting method for detecting contact positions at which a finger or the like has contacted the touch panel is the electrostatic capacitance method. In an electrostatic capacitive touch panel, a plurality of capacitive elements each made up of a pair of electrodes disposed to be opposed to each other with a dielectric layer interposed therebetween, that is, a driving electrode and a sensing electrode are provided in a plane of the touch panel. Then, the input positions are detected by utilizing the characteristics that the electrostatic capacitance of capacitive elements changes when performing input operations by contacting the capacitive elements with a finger or an input tool such as a touch pen.

In the display device to which an input device such as a touch panel is attached, it is desirable to reduce electric resistance of the sensing electrodes for improving the detection performance, and thus a conductive film such as a metal film is sometimes used as a material of the sensing electrode. Thus, in an electrode substrate included in the display device and formed of a base and the sensing electrode formed on the base, a protective film is formed so as to cover the sensing electrode for preventing corrosion of the sensing electrode. At this time, for example, a protective film is formed by applying coating liquid by the use of an ink jet method so as to cover the sensing electrode formed on the substrate and then curing a coating film formed of the applied coating liquid.

As the method of applying the coating liquid by the use of the ink jet method, for example, Japanese Patent Application Laid-Open Publication No. 8-227012 (Patent Document 1) and Japanese Patent Application Laid-Open Publication No. 9-203803 (Patent Document 2) each describe a method of forming a color filter of a liquid crystal display device by an ink jet method. In addition, Japanese Patent Application Laid-Open Publication No. 2008-183489 (Patent Document 3) describes a method of forming a desired pattern by forming a lyophilic region and a repellant region on a surface of a substrate and then discharging liquid drops to the surface of the substrate by the use of an ink jet method. Further, Japanese Patent Application Laid-Open Publication No. 2011-145535 (Patent Document 4) describes a method of forming an alignment film of a liquid crystal display device by an ink jet method.

SUMMARY

However, when the coating liquid is applied on the substrate by using the ink jet method, it is difficult to highly accurately adjust the position of an end portion of the coating liquid spread over the substrate. Consequently, it is difficult to highly accurately adjust the position of the end portion of the protective film formed by curing the applied coating liquid. Therefore, there is a possibility of fluctuations of the area of a portion of a sensing electrode exposed from the protective film among a plurality of sensing electrodes.

The above-described portion of the sensing electrode exposed from the protective film is electrically connected to a wiring substrate. Therefore, with fluctuations of the area of the portion of the sensing electrode exposed from the protective film, a connection resistance between the sensing electrode and the wiring substrate fluctuates among a plurality of sensing electrodes, thereby possibly decreasing the performance as an electrode substrate.

The present invention has been made to solve the problem in existing techniques described above, and an object of the present invention is to provide an electrode substrate capable of highly accurately adjusting the position of an end portion of a protective film when forming the protective film so as to cover electrodes in an electrode substrate.

The typical ones of the inventions disclosed in the present application will be briefly described as follows.

An electrode substrate in an aspect of the present invention includes a first substrate, and a first electrode continuously formed on the first substrate from a first region on a first main surface of the first substrate via a second region on the first main surface of the first substrate over a third region on the first main surface of the first substrate. Also, the electrode substrate includes a concave/convex pattern formed on the first electrode or the first substrate in the second region, and a protective film formed in the first region and the second region so as to cover the first electrode. An end portion of the protective film on a third region side is positioned on the concave/convex pattern.

Also, an electrode substrate manufacturing method in another aspect of the present invention includes the steps of (a) preparing a first substrate and (b) continuously forming a first electrode on the first substrate from a first region of a first main surface of the first substrate via a second region of the first main surface of the first substrate over a third region of the first main surface of the first substrate. The electrode substrate manufacturing method includes (c) forming a concave/convex pattern on the first electrode or the first substrate in the second region, and (d) after the step (c), forming a protective film in the first region and the second region so as to cover the first electrode. An end portion of the protective film formed in the step (d) on a third region side is positioned on the concave/convex pattern.

Additional features and advantages are described herein, and will be apparent from the following Detailed Description and the figures.

BRIEF DESCRIPTION OF THE FIGURES

FIG. 26 is a cross-sectional view illustrating an eighth modification example of the concave/convex patterns of the electrode substrate according to the first embodiment;

FIG. 27 is a cross-sectional view illustrating a ninth modification example of the concave/convex patterns of the electrode substrate according to the first embodiment;

FIG. 28 is a cross-sectional view illustrating the electrode substrate according to the first embodiment during the manufacturing process thereof;

DETAILED DESCRIPTION

Figure 1:
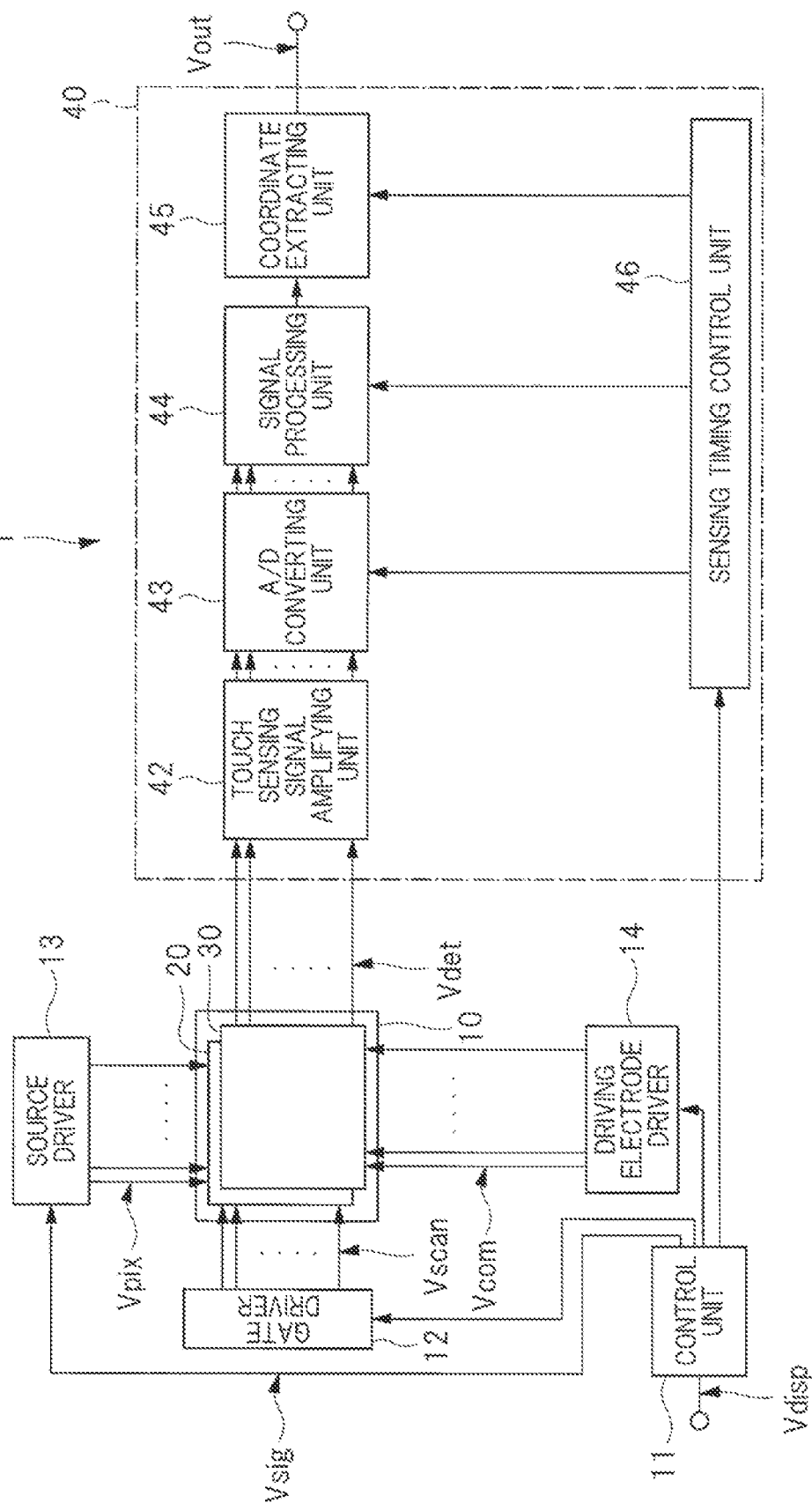
FIG. 1 is a block diagram illustrating a configuration example of a display device according to the first embodiment.

Hereinafter, embodiments of the present invention will be described with reference the accompanied drawings.

Note that the disclosure is merely an example and suitable changes which may be easily derived by a person skilled in the art while the gist of invention is maintained are included in the scope of the present invention as a matter of course. In addition, while the width, thickness, shape, etc. of respective parts may be schematically illustrated in the drawings as compared with the embodiments for clarity in the description, they are merely examples and do not limit the interpretation of the present invention.

In the specification and the drawings, the same components as those having been already mentioned in already-mentioned drawings are denoted by the same reference symbols and detailed descriptions thereof may be appropriately omitted.

In addition, in some drawings used in the embodiments, hatching is omitted so as to make a difference among the structures.

Moreover, in the embodiments described below, when a range is shown as A to B, that range means A or more and B or less unless specifically mentioned.

First Embodiment

First, an example in which a display device provided with a touch panel as an input device is applied to an in-cell liquid crystal display device with a touch sensing function will be described as the first embodiment. Note that the input device is at least an input device for detecting electrostatic capacitance which changes in accordance with a capacitance of a substance approaching or contacting the electrode in the specification of the present application. Here, modes for detecting the electrostatic capacitance includes not only a mutual capacitance type for detecting the electrostatic capacitance between two electrodes but also a self capacitance type for detecting the capacitance of one electrode. Also, the liquid crystal display device with the touch sensing function is a liquid crystal display device having a sensing electrode for touch sensing provided on either a first substrate or a second substrate on which a display unit is formed. Further, the first embodiment describes the in-cell liquid crystal display device with the touch sensing function having such feature that a common electrode is provided so as to be functioned as a driving electrode of the display unit and so as to be operated as a driving electrode of the input device.

<Overall Configuration>

First, the overall configuration of the display device according to the present first embodiment will be described with reference to FIG. 1. FIG. 1 is a block diagram illustrating one configuration example of a display device according to the first embodiment.

A display device 1 includes a display device 10 with a touch sensing function, a control unit 11, a gate driver 12, a source driver 13, a driving electrode driver 14, and a touch sensing unit 40.

The display device 10 with a touch sensing function includes a liquid crystal display device 20 and a touch sensing device 30.

In the present example, the liquid crystal display device 20 is a display device using liquid crystal display elements as display elements. The touch sensing device 30 is a touch sensing device of electrostatic capacitance type, that is, an electrostatic capacitive touch sensing device. Therefore, the display device 1 is a display device including an input device with a touch sensing function. Further, the display device 10 with a touch sensing function is a display device in which the liquid crystal display device 20 and the touch sensing device 30 are integrated, and is a display device incorporating a touch sensing function, namely, an in-cell display device with a touch sensing function.

Further, the display device 10 with a touch sensing function may be a display device in which the touch sensing device 30 is attached on the liquid crystal display device 20. Further, as the liquid crystal display device 20, it is also possible to use such as an organic EL (Electroluminescence) display device instead of the display device using the liquid crystal display element.

The liquid crystal display device 20 performs display by sequentially scanning each horizontal line in the display region in accordance with scanning signals Vscan supplied from the gate driver 12. The touch sensing device 30 operates in accordance with a principle of electrostatic capacitive touch sensing and outputs sensing signals Vdet as will be described later.

The control unit 11 is a circuit which respectively supplies control signals to the gate driver 12, the source driver 13, the driving electrode driver 14 and the touch sensing unit 40 based on video signals Vdisp supplied from outside for controlling them so that they are operated in synchronization with each other.

The gate driver 12 has a function of sequentially selecting one horizontal line, which is an object of display driving of the display device 10 with a touch sensing function, based on control signals supplied from the control unit 11.

The source driver 13 is a circuit which supplies pixel signals Vpix to sub-pixels SPix included in the display device 10 with a touch sensing function (see FIG. 10 to be described later) based on control signals of image signals Vsig supplied from the control unit 11.

The driving electrode driver 14 is a circuit which supplies driving signals Vcom to common electrodes COML included in the display device 10 with a touch sensing function (see FIG. 7 or FIG. 8 to be described later) based on control signals supplied from the control unit 11.

The touch sensing unit 40 is a circuit which senses presence/absence of touches of a finger or an input tool such as a touch pen to the touch sensing device 30, namely, a state of contact or approach to be described later based on control signals supplied from the control unit 11 and sensing signals Vdet supplied from the touch sensing device 30 of the display device 10 with a touch sensing function. Also, the touch sensing unit 40 is a circuit which obtains coordinates of touches, namely, input positions in the touch sensing region in the case where the touches are present. The touch sensing unit 40 includes a touch sensing signal amplifying unit 42, an A/D (Analog/Digital) converting unit 43, a signal processing unit 44, a coordinate extracting unit 45 and a sensing timing control unit 46.

The touch sensing signal amplifying unit 42 amplifies sensing signals Vdet supplied from the touch sensing device 30. The touch sensing signal amplifying unit 42 may be provided with a low pass analog filter which removes high frequency components, namely, noise components included in the sensing signals Vdet and extracts and respectively outputs touch components.

<Principle of Electrostatic Capacitive Touch Sensing>

Figure 2:
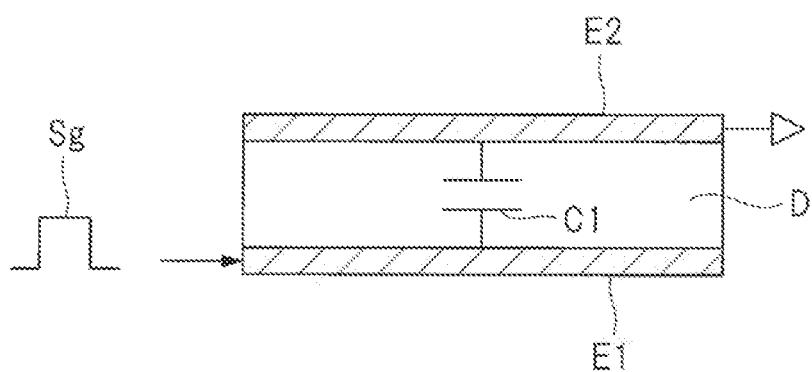
FIG. 2 is an explanatory diagram illustrating a state in which no finger contacts or approaches a touch sensing device.
Figure 3:
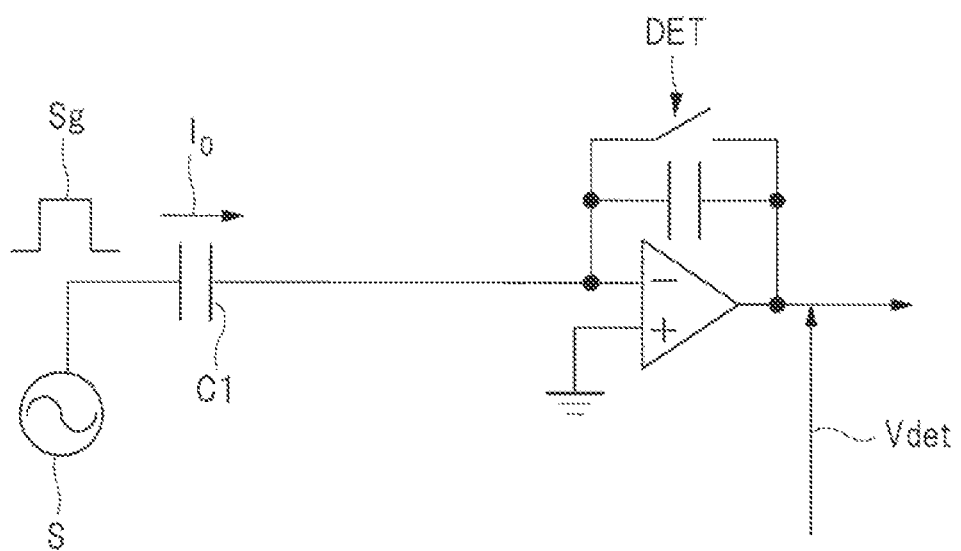
FIG. 3 is an explanatory diagram illustrating an example of an equivalent circuit in a state in which no finger contacts or approaches a touch sensing device.
Figure 4:
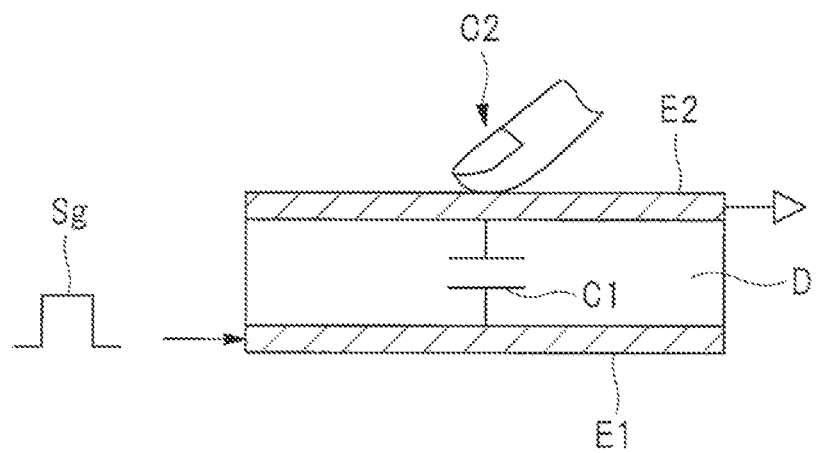
FIG. 4 is an explanatory diagram illustrating a state in which a finger has contacted or approached the touch sensing device.
Figure 5:
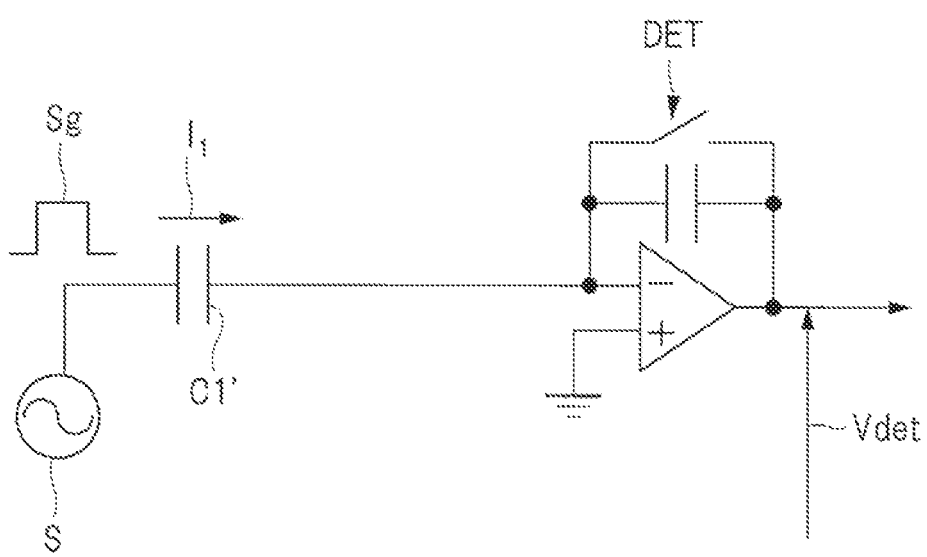
FIG. 5 is an explanatory diagram illustrating an example of an equivalent circuit in a state in which a finger has contacted or approached the touch sensing device.
Figure 6:
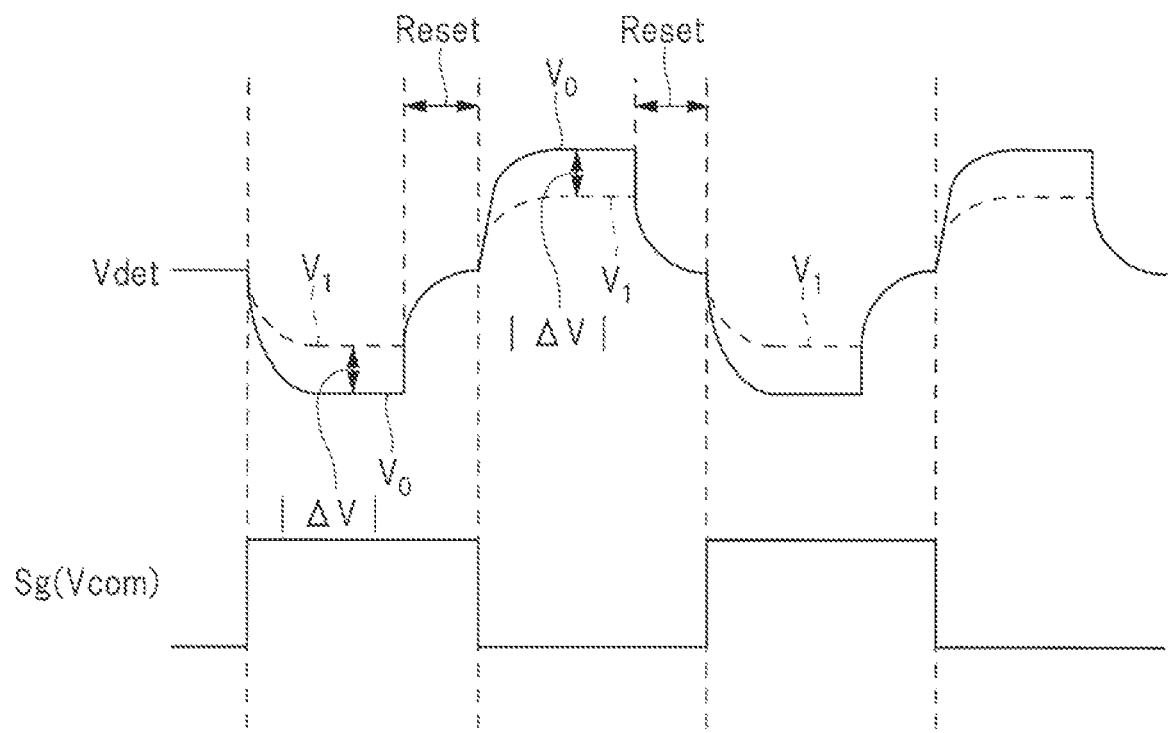
FIG. 6 is a diagram illustrating one example of waveforms of a driving signal and a sensing signal.

Next, the principle of touch sensing in the display device 1 according to the present first embodiment will be described with reference to FIG. 1 to FIG. 6. FIG. 2 is an explanatory diagram illustrating a state in which no finger contacts or approaches a touch sensing device. FIG. 3 is an explanatory diagram illustrating an example of an equivalent circuit in a state in which no finger contacts or approaches the touch sensing device. FIG. 4 is an explanatory diagram illustrating a state in which a finger has contacted or approached the touch sensing device. FIG. 5 is an explanatory diagram illustrating an example of an equivalent circuit in a state in which a finger has contacted or approached the touch sensing device. FIG. 6 is a diagram illustrating one example of waveforms of a driving signal and a sensing signal.

As illustrated in FIG. 2, in the electrostatic capacitive touch sensing, an input device referred to as a touch panel or a touch sensor includes a driving electrode E1 and a sensing electrode E2 which are disposed to be opposed to each other with a dielectric body D interposed therebetween. A capacitive element C1 is formed by the driving electrode E1 and the sensing electrode E2. As illustrated in FIG. 3, one end of the capacitive element C1 is connected to an AC signal source S which is a driving signal source, and the other end of the capacitive elements C1 is connected to a voltage sensor DET which is the touch sensing unit. The voltage sensor DET is, for example, an integrating circuit included in the touch sensing signal amplifying unit 42 illustrated in FIG. 1.

When an AC rectangular wave Sg having a frequency in the range of, for example, several kHz to several hundreds kHz is applied from the AC signal source S to the one end of the capacitive element C1, namely, the driving electrode E1, a sensing signal Vdet which is an output waveform is generated via the voltage sensor DET connected to the other end of the capacitive element C1, namely, the sensing electrodes E2. Note that the AC rectangular wave Sg corresponds to, for example, the driving signal Vcom illustrated in FIG. 6.

In the state in which no finger contacts or approaches, namely, in the non-contact state illustrated in FIG. 2, current $I_0$ corresponding to the capacitance value of the capacitive element C1 flows in accordance with charge and discharge of the capacitive element C1 as illustrated in FIG. 3. The voltage sensor DET converts the fluctuation in the current $I_0$ in accordance with the AC rectangular wave Sg into the fluctuation in voltage. The voltage fluctuation is represented as the waveform $V_0$ indicated by a solid line in FIG. 6.

On the other hand, in a state in which a finger contacts or approaches, namely, in the contact state illustrated in FIG. 4, the capacitive element is affected by the electrostatic capacitance, and the capacitive element C2 is added in series to the capacitive element C1. In this state, with the charge/discharge to the capacitive elements C1 and C2, when viewed in the equivalent circuit illustrated in FIG. 5, current $I_1$ flows through the capacitive element C1'. Here, the capacitive element C1' is sum of the capacitive element C1 and the capacitive element C2. The voltage sensor DET converts the fluctuation in the current $I_1$ in accordance with the AC rectangular wave Sg into the fluctuation in voltage. This voltage fluctuation is represented as the waveform $V_1$ indicated by a broken line in FIG. 6. In this case, the amplitude of the waveform $V_1$ is smaller than that of the above-described waveform $V_0$. Accordingly, the absolute value $|\Delta V|$ of the voltage difference between the waveform $V_0$ and waveform $V_1$ is varied in accordance with influences of an object such as a finger which approaches from outside. Note that, in order to accurately sense the absolute value $|\Delta V|$ of the voltage difference between the waveform $V_0$ and the waveform $V_1$, it is preferable that a period Reset during which charge and discharge of the capacitor are reset in accordance with a frequency of the AC rectangular wave Sg by the switching in the circuit is provided in the operation of the voltage sensor DET.

In the example illustrated in FIG. 1, the touch sensing device 30 performs touch sensing for each sensing block corresponding to one or a plurality of common electrodes COML in accordance with the driving signal Vcom supplied from the driving electrode driver 14. More specifically, the touch sensing device 30 outputs the sensing signal Vdet via the voltage sensor DET illustrated in FIG. 3 or FIG. 5 for each sensing block corresponding to each of the one or a plurality of common electrodes COML, and supplies the output sensing signal Vdet to the A/D converting unit 43 of the touch sensing unit 40.

The A/D converting unit 43 is a circuit which samples each analog signal output from the touch sensing signal amplifying unit 42 at a timing in synchronization with the driving signal Vcom, thereby converting it into a digital signal.

The signal processing unit 44 is provided with a digital filter which reduces frequency components other than the frequency at which the driving signal Vcom is sampled, namely, noise components included in the output signal of the A/D converting unit 43. The signal processing unit 44 is a logic circuit which senses presence/absence of touches to the touch sensing device 30 based on the output signal of the A/D converting unit 43. The signal processing unit 44 performs the process of extracting only differential voltage caused by the finger. The differential voltage caused by the finger is the absolute value $|\Delta V|$ of the difference between the waveform $V_0$ and waveform $V_1$ mentioned above. It is also possible that the signal processing unit 44 performs calculations of averaging absolute values $|\Delta V|$ per each sensing block to obtain the average value of the absolute values $|\Delta V|$. By this means, the signal processing unit 44 can reduce the influences of noise. The signal processing unit 44 compares the sensed differential voltage caused by the finger with a predetermined threshold voltage, and when the voltage is equal to or higher than the threshold voltage, it is determined to be the contact state of an externally approaching object which approaches from outside, and when the voltage is lower than the threshold voltage, it is determined to be the non-contact state of an externally approaching object. In this manner, touch sensing is performed by the touch sensing unit 40.

The coordinate extracting unit 45 is a logic circuit which obtains the coordinates of the position at which the touch has been sensed by the signal processing unit 44, namely, the input position on the touch panel. The sensing timing control unit 46 controls the A/D converting unit 43, the signal processing unit 44 and the coordinate extracting unit 45 so that they are operated in synchronization with each other. The coordinate extracting unit 45 outputs the touch panel coordinates as a signal output Vout.

<Module>

Figure 7:
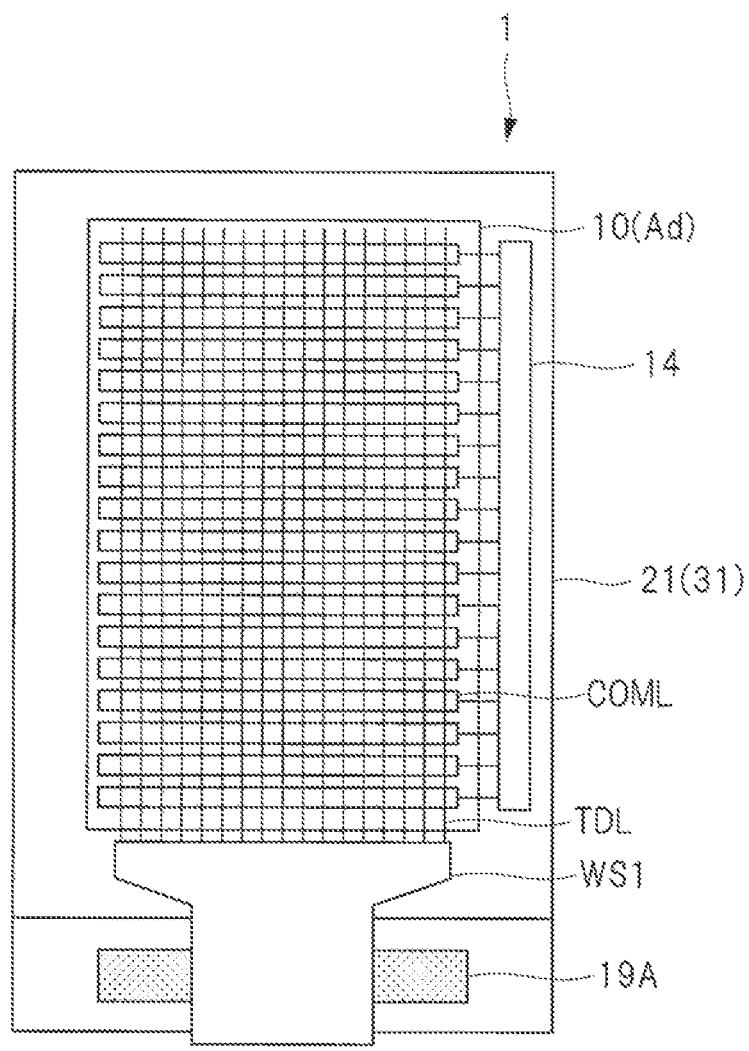
FIG. 7 is a plan view illustrating one example of a module having the display device according to the first embodiment mounted therein.
Figure 8:
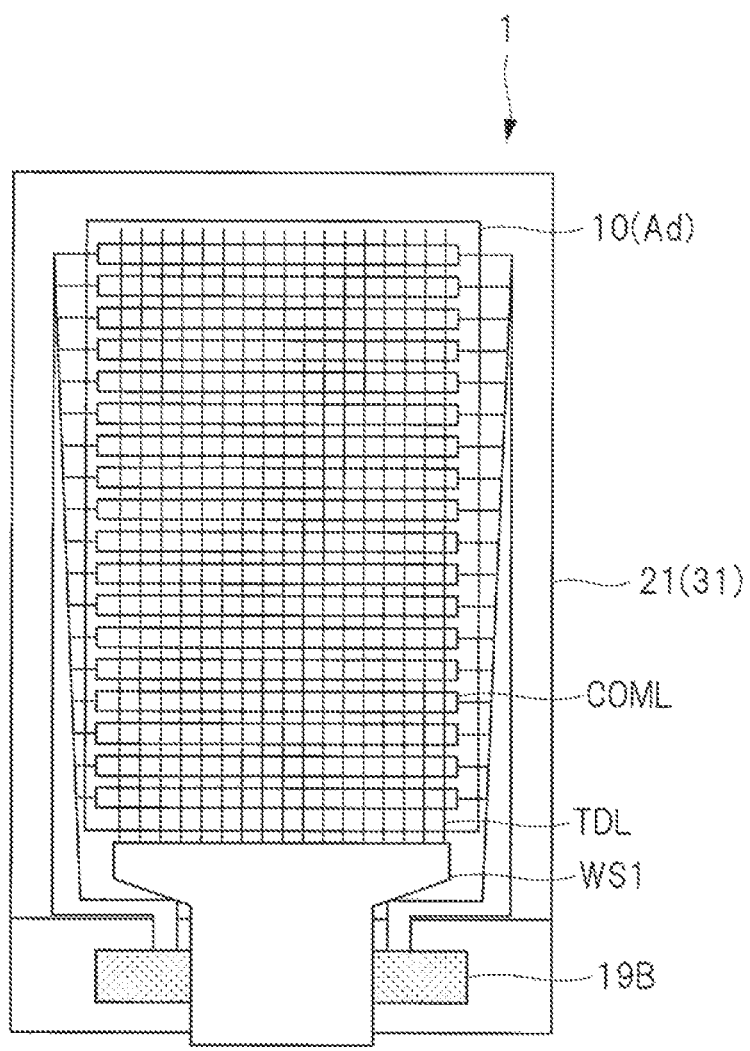
FIG. 8 is a plan view illustrating one example of a module having the display device according to the first embodiment mounted therein.

FIG. 7 and FIG. 8 are plan views illustrating one example of a module having the display device according to the first embodiment mounted therein. In the example illustrated in FIG. 7, the above-described driving electrode driver 14 is formed on a first substrate 21.

As illustrated in FIG. 7, the display device 1 includes the display device 10 with a touch sensing function, the driving electrode driver 14, a COG (chip on glass) 19A and the first substrate 21.

The display device 10 with a touch sensing function includes a plurality of common electrodes COML and a plurality of sensing electrodes TDL. Here, two directions which mutually intersect, preferably orthogonally, with each other within an upper surface serving as a main surface of the first substrate 21 are defined to be an X axis direction and a Y axis direction. At this time, the plurality of common electrodes COML respectively extend in the X axis direction and are arrayed in the Y axis direction when seen in a plan view. Further, the plurality of sensing electrodes TDL respectively extend in the Y axis direction and are arrayed in the X axis direction when see in a plan view. In other words, the plurality of sensing electrodes TDL intersect the plurality of common electrodes COML when seen in a plan view.

As will be described later with reference to FIG. 9 and FIG. 10, each of the plurality of common electrodes COML is provided so as to overlap the plurality of sub-pixels SPix arrayed in the X axis direction when seen in a plan view. More specifically, one common electrode COML is provided as a common electrode for the plurality of sub-pixels SPix.

Note that the expression "when seen in a plan view" in the present specification indicates the case in which components are seen from a direction perpendicular to the upper surface serving as the main surface of the first substrate 21 or a second substrate 31 included in an opposing substrate 3 described later.

In the example illustrated in FIG. 7, the display device 10 with a touch sensing function has a rectangular shape with two sides which respectively extend in the X axis direction and are opposed to each other and two sides which respectively extend in the Y axis direction and are opposed to each other when seen in a plan view. A wiring substrate WS1 is provided on one side of the display device 10 with a touch sensing function in the Y axis direction. The sensing electrode TDL is connected to the touch sensing unit 40 mounted on outside of this module via the wiring substrate WS1. As the wiring substrate WS1, a flexible print board can be used while described later by using FIGS. 12 and 13. Also, a connection structure between the sensing electrode TDL and the wiring substrate WS1 will be described later by using FIGS. 12 and 13.

The driving electrode driver 14 is formed on the first substrate 21. The COG 19A is a chip mounted on the first substrate 21 and incorporates respective circuits necessary for display operations such as the control unit 11, the gate driver 12 and the source driver 13 illustrated in FIG. 1.

Note that various substrates such as a transparent glass substrate or a film made of a resin can be used as the first substrate 21.

On the other hand, the display device 1 may incorporate the driving electrode driver 14 in the COG. An example in which the driving electrode driver 14 is incorporated in the COG is illustrated in FIG. 8. In the example illustrated in FIG. 8, the display device 1 includes a COG 19B in its module. In the COG 19B illustrated in FIG. 8, the driving electrode driver 14 is incorporated in addition to the above-described respective circuits necessary for the display operations.

Note that, as illustrated in FIG. 7 and FIG. 8, a planar shape of the second substrate 31 can be substantially the same as that of the first substrate 21.

<Display Device with Touch Sensing Function>

Next, a configuration example of the display device 10 with a touch sensing function will be described in details. FIG. 9 is a cross-sectional view illustrating the display device with a touch sensing function in the display device according to the first embodiment. FIG. 10 is a circuit diagram illustrating the display device with a touch sensing function in the display device according to the first embodiment.

The display device 10 with a touch sensing function includes a pixel substrate 2, an opposing substrate 3 and a liquid crystal layer 6. The opposing substrate 3 is disposed so that an upper surface serving as a main surface of the pixel substrate 2 and a lower surface serving as a main surface of the opposing substrate 3 oppose each other. The liquid crystal layer 6 is provided between the pixel substrate 2 and the opposing substrate 3.

The pixel substrate 2 includes the first substrate 21. As illustrated in FIG. 10, in the display region Ad, a plurality of scanning lines GCL, a plurality of signal lines SGL and a plurality of TFT elements Tr which are thin film transistors (TFT) are formed on the first substrate 21. Note that, in FIG. 9, the illustration of the scanning lines GCL, the signal lines SGL and the TFT elements Tr is omitted.

Figure 10:
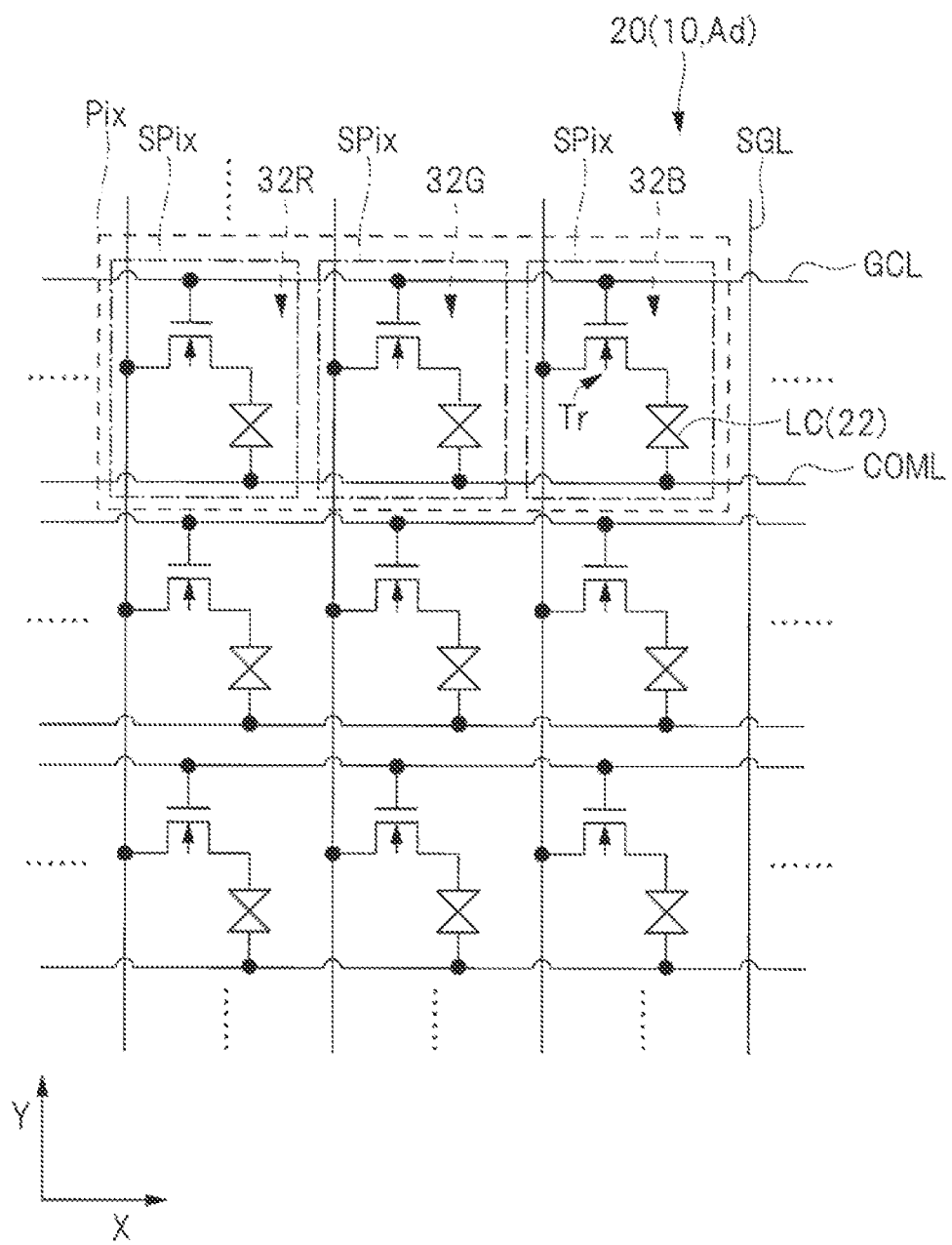
FIG. 10 is a circuit diagram illustrating a display device with a touch sensing function in the display device according to the first embodiment.

As illustrated in FIG. 10, the plurality of scanning lines GCL respectively extend in the X axis direction and are arrayed in the Y axis direction in the display region Ad. The plurality of signal lines SGL respectively extend in the Y axis direction and are arrayed in the X axis direction in the display region Ad. Accordingly, each of the plurality of signal lines SGL intersects the plurality of scanning lines GCL when seen in a plan view. In this manner, sub-pixels SPix are arranged at intersections between the plurality of scanning lines GCL and the plurality of signal lines SGL which intersect each other when seen in a plan view, and a single pixel Pix is formed by a plurality of sub-pixels SPix having different colors. More specifically, on the first substrate 21, the sub-pixels SPix are arrayed in a matrix form in the X axis direction and the Y axis direction in the display region Ad. In other words, the sub-pixels SPix are arrayed in a matrix form in the X axis direction and the Y axis direction in the display region Ad on a front surface side of the first substrate 21.

The TFT element Tr is formed at an intersecting portion at which each of the plurality of scanning lines GCL and each of the plurality of signal lines SGL intersect each other when seen in a plan view. Accordingly, in the display region Ad, the plurality of TFT elements Tr are formed on the first substrate 21, and the plurality of TFT elements Tr are arrayed in a matrix form in the X axis direction and the Y axis direction. More specifically, each of the plurality of sub-pixels SPix is provided with the TFT element Tr. Also, each of the plurality of sub-pixels SPix is provided with a liquid crystal element LC in addition to the TFT element Tr.

The TFT element Tr is made up of, for example, a thin film transistor such as a n-channel MOS (metal oxide semiconductor). The gate electrode of the TFT element Tr is connected to the scanning lines GCL. One of the source electrode and the drain electrode of the TFT element Tr is connected to the signal line SGL. The other one of the source electrode and the drain electrode of the TFT element Tr is connected to one end of the liquid crystal element LC. One end of the liquid crystal element LC is connected to the source electrode or the drain electrode of the TFT element Tr, and the other end thereof is connected to the common electrode COML.

Figure 9:
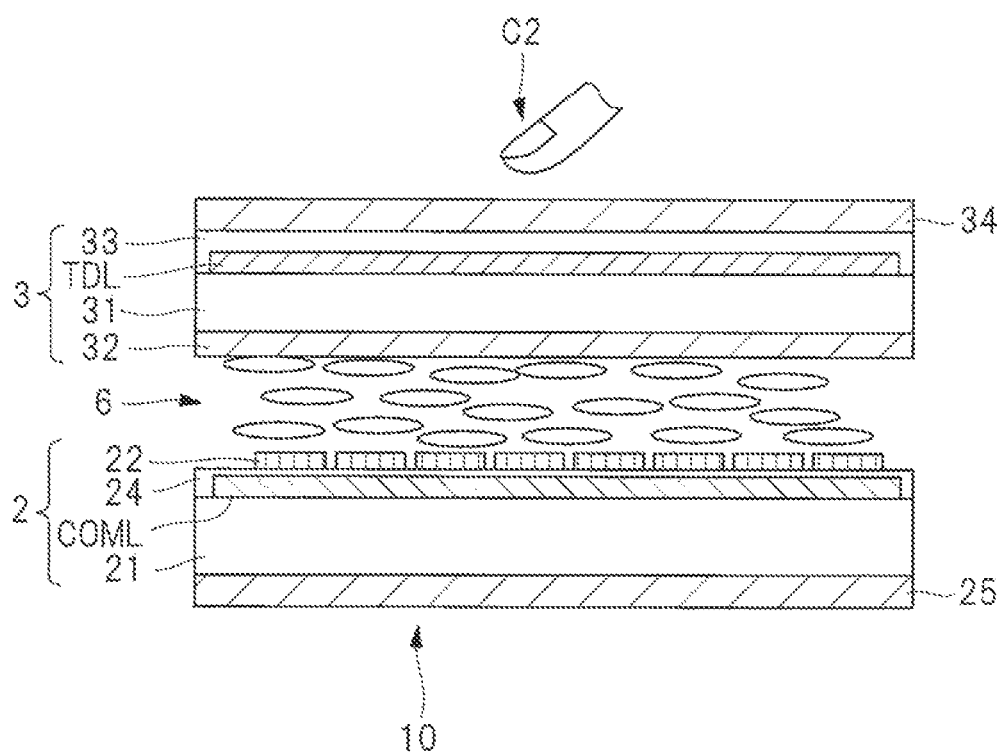
FIG. 9 is a cross-sectional view illustrating a display device with a touch sensing function in the display device according to the first embodiment.

As illustrated in FIG. 9, the pixel substrate 2 includes the plurality of common electrodes COML, an insulating film 24, and a plurality of pixel electrodes 22. The plurality of common electrodes COML are provided on the first substrate 21 in the display region Ad (see FIG. 7 or FIG. 8) on the front surface side of the first substrate 21. The insulating film 24 is formed on the first substrate 21 with the inclusion of the front surfaces of each of the plurality of common electrodes COML. In the display region Ad, a plurality of pixel electrodes 22 are formed on the insulating film 24. Accordingly, the insulating film 24 electrically insulates the common electrodes COML and the pixel electrodes 22.

As illustrated in FIG. 10, each of the plurality of pixel electrodes 22 is formed within each of the plurality of sub-pixels SPix arrayed in a matrix form in the X axis direction and the Y axis direction in the display region Ad on the front surface side of the first substrate 21. Accordingly, the plurality of pixel electrodes 22 are arrayed in a matrix form in the X axis direction and the Y axis direction.

In the example illustrated in FIG. 9, each of the plurality of common electrodes COML is formed between the first substrate 21 and the pixel electrodes 22. Also, as schematically illustrated in FIG. 10, each of the plurality of common electrodes COML is provided so as to overlap the plurality of pixel electrodes 22 when seen in a plan view. Then, by applying voltage between each of the plurality of pixel electrodes 22 and each of the plurality of common electrodes COML so that voltage is applied to the liquid crystal element LC provided in each of the plurality of sub-pixels SPix, an image is displayed in the display region Ad.

In this manner, when the display device 10 with a touch sensing function includes the liquid crystal display device 20, a display control unit which controls image display is formed of the liquid crystal element LC, the plurality of pixel electrodes 22, the common electrodes COML, the plurality of scanning lines GCL, and the plurality of signal lines SGL. The display control unit is provided between the pixel substrate 2 and the opposing substrate 3. Note that the display device 10 with a touch sensing function may include a display device as various display devices such as an organic EL display device in place of the liquid crystal display device 20 as a liquid crystal display device.

Note that each of the plurality of common electrodes COML may be formed on an opposite side of the first substrate 21 across the pixel electrodes 22. Also, in the example illustrated in FIG. 9, the arrangement of the common electrodes COML and the pixel electrodes 22 is an arrangement in which they are overlap as one example in a transverse electric field mode. However, the arrangement of the common electrodes COML and the pixel electrodes 22 may be an arrangement in which the common electrodes COML and the pixel electrodes 22 do not overlap when seen in a plan view. Alternatively, the arrangement of the common electrodes COML and the pixel electrodes 22 may be an arrangement in a TN (Twisted Nematic) mode or VA (Vertical Alignment) mode serving as a vertical electric field mode.

The liquid crystal layer 6 is provided to modulate light passing therethrough in accordance with the state of the electric field, and a liquid crystal layer adapted to a transverse electric field mode such as the above-described mode is used. More specifically, a liquid crystal display device of transverse electric field mode as the liquid crystal display device 20. Alternatively, as described above, a liquid crystal display device of vertical electric field mode such as the TN mode or the VA mode may be used. Note that an alignment film may be provided between the liquid crystal layer 6 and the pixel substrate 2 and between the liquid crystal layer 6 and the opposing substrate 3 illustrated in FIG. 9, respectively.

As illustrated in FIG. 10, the plurality of sub-pixels SPix arrayed in the X axis direction, that is, the plurality of sub-pixels SPix which belong to the same row of the liquid crystal display device 20 are connected to each other by the scanning line GCL. The scanning lines GCL are connected to the gate driver 12 (see FIG. 1) and scanning signals Vscan (see FIG. 1) are supplied thereto from the gate driver 12. Also, the plurality of sub-pixels SPix arrayed in the Y axis direction, that is, the plurality of sub-pixels SPix which belong to the same column of the liquid crystal display device 20 are connected to each other by the signal line SGL. The signal lines SGL are connected to the source driver 13 (see FIG. 1) and pixel signals Vpix (see FIG. 1) are supplied thereto from the source driver 13. Further, the plurality of sub-pixels SPix arrayed in the X axis direction, that is, the plurality of sub-pixels SPix which belong to the same row of the liquid crystal display device 20 are connected to each other by the common electrode COML.

The common electrodes COML are connected to the driving electrode driver 14 (see FIG. 1) and driving signals Vcom (see FIG. 1) are supplied thereto from the driving electrode driver 14. In other words, in the example illustrated in FIG. 10, the plurality of sub-pixels SPix which belong to the same row share one common electrode COML. The plurality of common electrodes COML respectively extend in the X axis direction and are arrayed in the Y axis direction in the display region Ad. As described above, since the plurality of scanning lines GCL respectively extend in the X axis direction and are arrayed in the Y axis direction in the display region Ad, the direction in which each of the plurality of common electrodes COML extends is parallel to the direction in which each of the plurality of scanning lines GCL extends. However, the direction in which each of the plurality of common electrodes COML extends is not limited, and for example, the direction in which each of the plurality of common electrodes COML extends may be a direction which is parallel to the direction in which each of the plurality of signal lines SGL extends.

The gate driver 12 illustrated in FIG. 1 sequentially selects one row, namely, one horizontal line from among the sub-pixels SPix which are arrayed in a matrix form in the liquid crystal display device 20 as an object of display driving by applying the scanning signals Vscan to the gate electrode of the TFT element Tr of each of the sub-pixels SPix via the scanning lines GCL illustrated in FIG. 10. The source driver 13 illustrated in FIG. 1 supplies the pixel signals Vpix to each of the plurality of sub-pixels SPix which constitute one horizontal line sequentially selected by the gate driver 12 via the signal lines SGL illustrated in FIG. 10. Then, displays in accordance with the supplied pixel signals Vpix are made at the plurality of sub-pixels SPix constituting one horizontal line.

The driving electrode driver 14 illustrated in FIG. 1 applies driving signals Vcom to drive the common electrodes COML for each of the sensing blocks corresponding to one or a plurality of common electrodes COML.

In the liquid crystal display device 20, the gate driver 12 is driven so as to sequentially scan the scanning lines GCL on time division basis, thereby sequentially selecting the sub-pixels SPix for each horizontal line. Also, in the liquid crystal display device 20, the source driver 13 supplies pixel signals Vpix to the sub-pixels SPix which belong to one horizontal line, so that displays are made for each horizontal line. In performing the display operation, the driving electrode driver 14 applies driving signals Vcom to a sensing block including the common electrodes COML corresponding to the one horizontal line.

Figure 11:
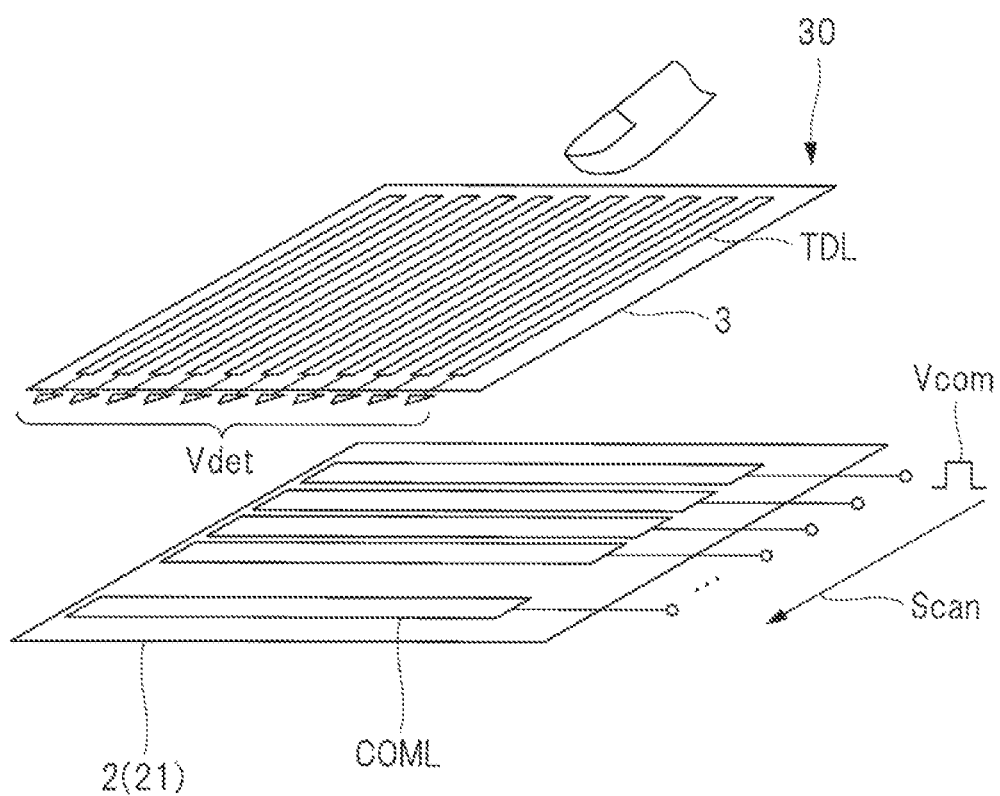
FIG. 11 is a perspective view illustrating one configuration example of driving electrodes and sensing electrodes of the display device according to the first embodiment.

The common electrodes COML of the display device 1 according to the present first embodiment operate as driving electrodes of the liquid crystal display device 20 and also operate as driving electrodes of the touch sensing device 30. FIG. 11 is a perspective view illustrating one configuration example of the driving electrodes and the sensing electrodes of the display device according to the present first embodiment.

The touch sensing device 30 includes a plurality of common electrodes COML provided on the pixel substrate 2 and a plurality of sensing electrodes TDL provided on the opposing substrate 3. The plurality of sensing electrodes TDL respectively extend in the direction which intersects the direction in which each of the plurality of common electrodes COML extends when seen in a plan view. In other words, the plurality of sensing electrodes TDL are provided at intervals so as to respectively overlap the plurality of common electrodes COML when seen in a plan view. Also, each of the plurality of sensing electrodes TDL opposes the common electrodes COML in a direction which is perpendicular to the front surface of the first substrate 21 included in the pixel substrate 2. Each of the plurality of sensing electrodes TDL is respectively connected to the touch sensing signal amplifying unit 42 (see FIG. 1) of the touch sensing unit 40. Electrostatic capacitance is generated at intersecting portions between each of the plurality of common electrodes COML and each of the plurality of sensing electrodes TDL seen in a plan view. Thus, input positions are sensed based on the electrostatic capacitance between each of the plurality of common electrodes COML and each of the plurality of sensing electrodes TDL. More specifically, by the electrode substrate as the second substrate 31 (see FIG. 9) on which the sensing electrode TDL is formed and the common electrodes COML, a sensing unit for sensing the input position, that is, an input device is formed.

Note that the electrode substrate in the first embodiment is not limited to the case of the usage as the opposing substrate 3, and, for example, a single input device can be formed as described later by using FIG. 38.

With the configuration described above, when performing the touch sensing operation in the touch sensing device 30, one sensing block corresponding to one or a plurality of common electrodes COML in a scanning direction Scan is sequentially selected by the driving electrode driver 14. Then, in the selected sensing block, driving signals Vcom for measuring the electrostatic capacitance between the common electrodes COML and the sensing electrodes TDL are input to the common electrodes COML, and sensing signals Vdet for sensing input positions are output from the sensing electrodes TDL. In this manner, the touch sensing device 30 is configured so as to perform the touch sensing for each sensing block. More specifically, one sensing block corresponds to the driving electrode E1 of the above-described principle of touch sensing, and the sensing electrode TDL corresponds to the sensing electrode E2.

Note that a range of the sensing block in the display operation and a range of the sensing block in the touch sensing operation may be common with or different from each other.

As illustrated in FIG. 11, the plurality of common electrodes COML and the plurality of sensing electrodes TDL which intersect each other when seen in a plan view form an electrostatic capacitive touch sensor having a matrix arrangement. Accordingly, by scanning the entire touch sensing surface of the touch sensing device 30, positions which have been contacted or approached by a finger or the like can be sensed.

As illustrated in FIG. 9, the opposing substrate 3 includes a second substrate 31, a color filter 32, sensing electrodes TDL and a protective film 33. The second substrate 31 has an upper surface serving as a main surface and a lower surface serving as a main surface opposed to the upper surface. The color filter 32 is formed on the lower surface serving as one main surface of the second substrate 31. The sensing electrodes TDL are the sensing electrodes of the touch sensing device 30, and are formed on the upper surface serving as the other main surface of the second substrate 31. The protective film 33 is formed on the upper surface of the second substrate 31 so as to cover the sensing electrodes TDL. Note that shapes of the sensing electrode TDL as an electrode and the protective film 33 will be described later.

For example, color filters colored in three colors of red (R), green (G) and blue (B) are arrayed in the X axis direction as the color filter 32. In this manner, as illustrated in FIG. a plurality of sub-pixels SPix corresponding to each of color regions 32R, 32G and 32B of the three colors of R, G and B are formed, and one pixel Pix is formed by one set of the plurality of sub-pixels SPix each corresponding to the color regions 32R, 32G and 32B. The pixels Pix are arrayed in a matrix form in the direction in which the scanning lines GCL extend (X axis direction) and the direction in which the signal lines SGL extend (Y axis direction). Further, the region in which the pixels Pix are arrayed in a matrix form is the above-described display region Ad. Note that a dummy region where the pixels Pis are arranged in a matrix form may be provided in periphery of the display region Ad.

The combination of colors of the color filter 32 may be another combination including a plurality of colors other than R, G and B. It is also possible to provide no color filter 32. Alternatively, one pixel Pix may include a sub-pixel SPix which is not provided with the color filter 32, that is, a white-colored sub-pixel SPix. Further, a color filter may be provided to the pixel substrate 2 by use of a COA (Color filter On Array) technique.

Note that, as illustrated in FIG. 9, a polarizing plate 25 may be provided on the opposite side of the opposing substrate 3 with the pixel substrate 2 interposed therebetween. In addition, a polarizing plate 34 may be provided on the opposite side of the pixel substrate 2 with the opposing substrate 3 interposed therebetween.

<Configuration of Electrode Substrate>

Next, a configuration of the electrode substrate will be described with reference to FIGS. 12 to 15. Note that, in the description of the first embodiment, an electrode substrate used as an opposing substrate to which sensing electrodes are formed in a display device with an input device is taken as an example.

Figure 12:
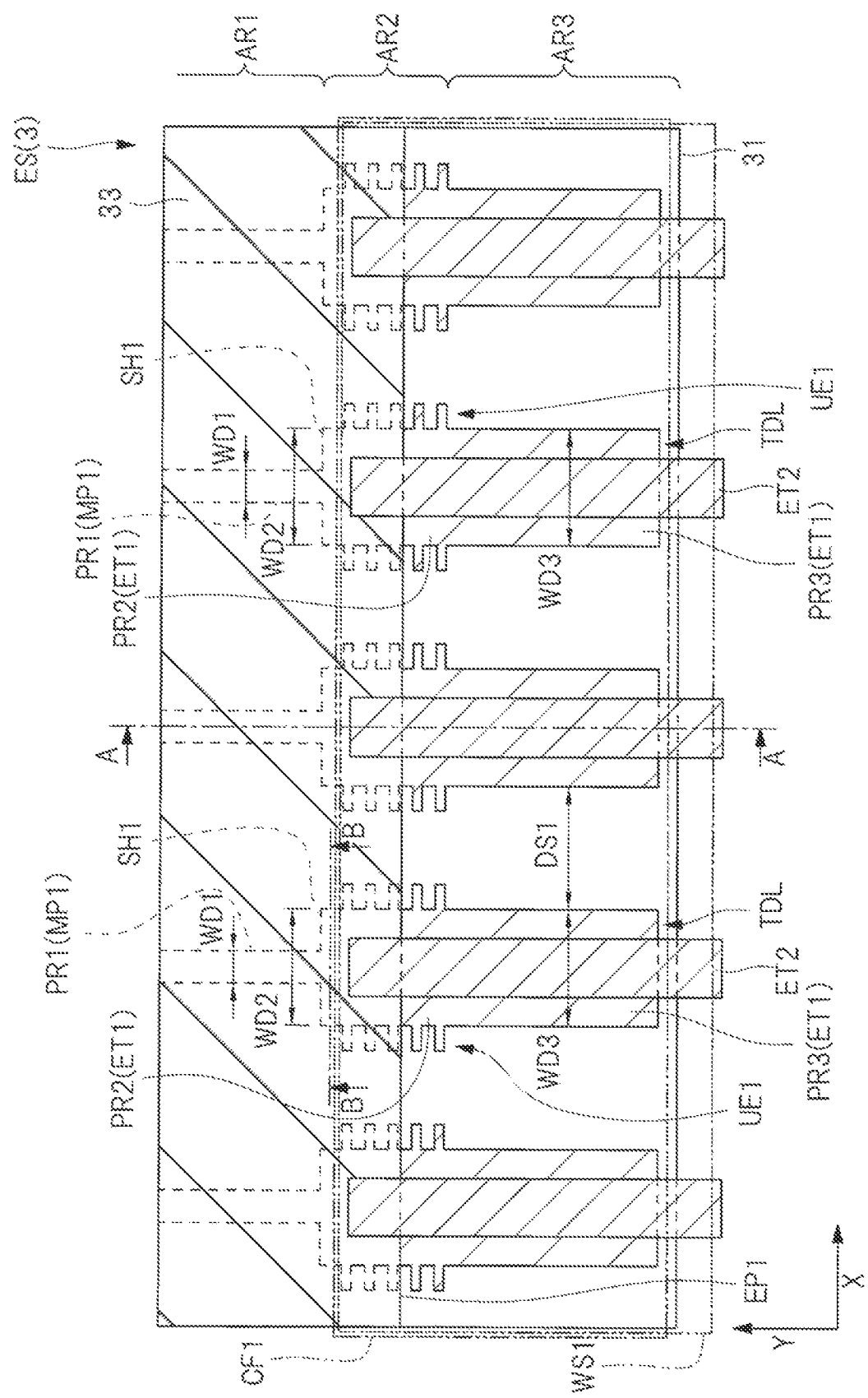
FIG. 12 is a plan view illustrating an electrode substrate according to the first embodiment.
Figure 13:
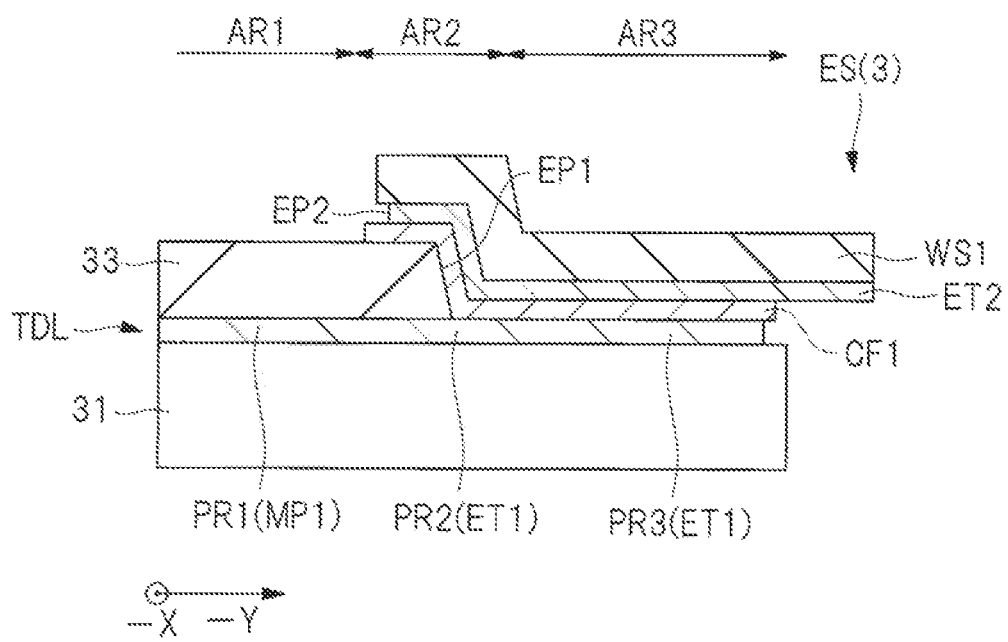
FIG. 13 is a cross-sectional view illustrating the electrode substrate according to the first embodiment.
Figure 14:
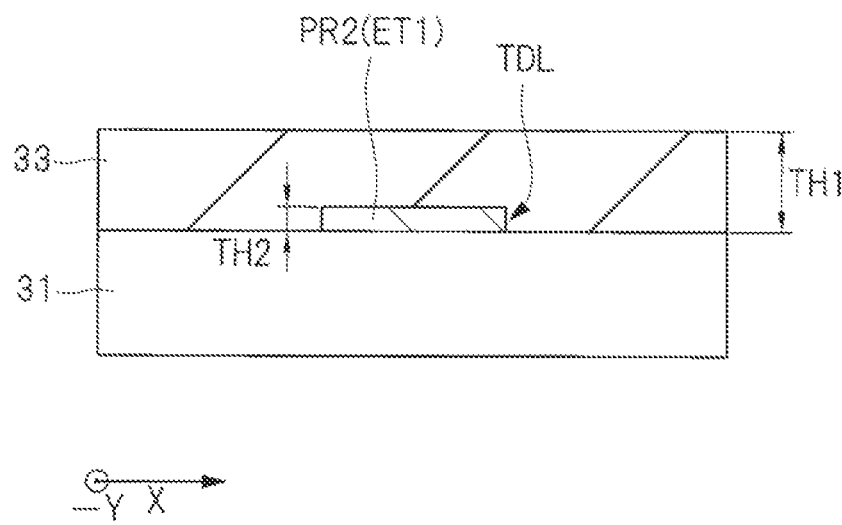
FIG. 14 is a cross-sectional view illustrating the electrode substrate according to the first embodiment.
Figure 15:
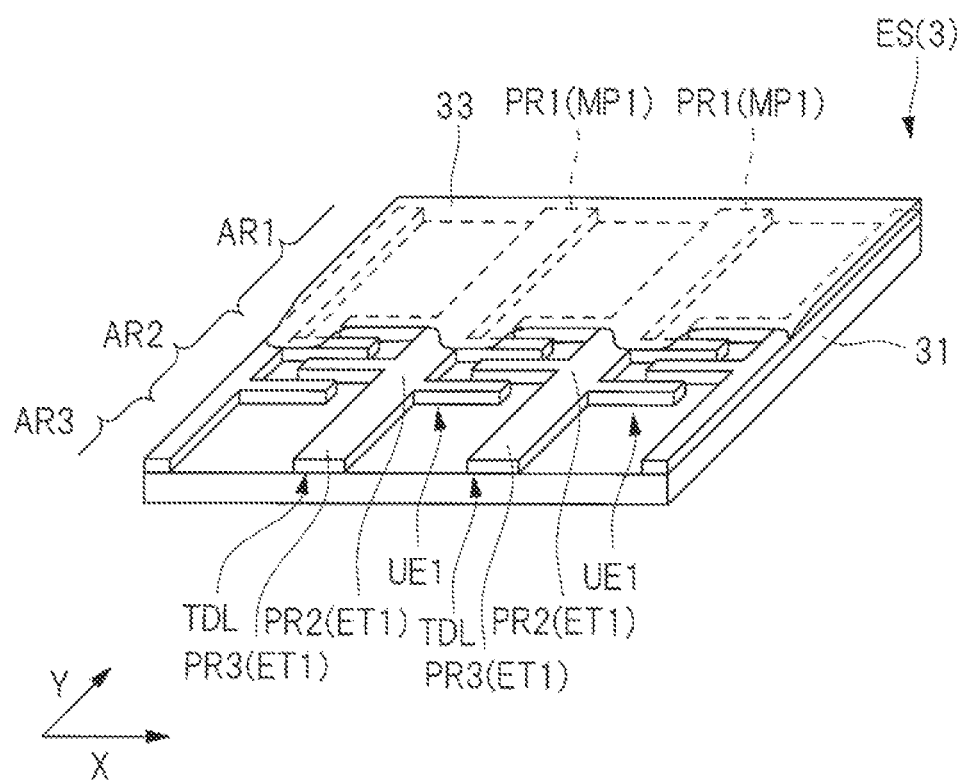
FIG. 15 is a perspective view illustrating the electrode substrate according to the first embodiment.

FIG. 12 is a plan view illustrating the electrode substrate according to the first embodiment. FIGS. 13 and 14 are cross-sectional views illustrating an electrode substrate according to the first embodiment. FIG. 15 is a perspective view illustrating an electrode substrate according to the first embodiment. FIG. 13 is a cross-sectional view taken along the line A-A of FIG. 12, and FIG. 14 is a cross-sectional view taken along the line B-B of FIG. 12. Note that, in FIG. 12, a perspective state in which the wiring substrate WS1 and the anisotropic conductive film CF1 are eliminated is illustrated and the outer peripheries of the wiring substrate WS1 and the anisotropic conductive film CF1 are represented by a dashed-two dotted line. In addition, in FIG. 15, the illustration of the wiring substrate WS1 is omitted. Further, FIG. 15 illustrates the similar example of the first modification example of a concave/convex pattern UE1 described later by using FIG. 19.

The electrode substrate ES as the opposing substrate 3 includes the second substrate 31, the sensing electrode TDL, the protective film 33, and a concave/convex pattern UE1.

Note that, in the present specification, the "concave/convex pattern" means a pattern formed of concave portions, a pattern formed of convex portions, or a pattern formed of concave portions and convex portions.

The second substrate 31 includes a region (first region) AR1, a region (second region) AR2, and a region (third region) AR3 as regions on an upper surface serving as a main surface of the second substrate 31. Hereinafter, two directions which mutually intersect, preferably orthogonally, with each other within the upper surface serving as a main surface of the second substrate 31 are defined to be an X axis direction and a Y axis direction. Here, the regions AR1, AR2, and AR3 are sequentially arranged in the Y axis direction when seen in a plan view.

Note that, as described above, the expression "when seen in a plan view" in the present specification indicates the case in which components are seen from a direction perpendicular to the upper surface serving as the main surface of the first substrate 21 (see FIG. 9) or the upper surface serving as the main surface of the second substrate 31.

Also, various substrates such as a transparent glass substrate or a film made of a resin can be used as the second substrate 31.

The sensing electrode TDL is continuously formed on the second substrate 31 from the region AR1 on the upper surface of the second substrate 31 via the region AR2 on the upper surface of the second substrate 31 over the region AR3 on the upper surface of the second substrate 31. Preferably, the sensing electrode TDL extends in the Y axis direction when seen in a plan view.

A portion of the sensing electrode TDL formed in the region AR1 is taken as a portion PR1. The portion PR1 is a main body portion MP1 of the sensing electrode TDL. Also, a portion of the sensing electrode TDL formed in the region AR2 is taken as a portion PR2. Furthermore, a portion of the sensing electrode TDL formed in the region AR3 is taken as a portion PR3. The portion PR3 is an electrode terminal ET1 electrically connected to the wiring substrate WS1. In other words, the portion PR3 is an electrode pad electrically connected to the wiring substrate WS1. The sensing electrode TDL is formed of a conductive film.

Preferably, the sensing electrode TDL is formed of a single-layer or a multi-layer film of a conductive film having a metal layer or an alloy layer made of one or more metals selected from a group including aluminum (Al), copper (Cu), silver (Ag), molybdenum (Mo), chrome (Cr) and tungsten (W). In this manner, conductivity of the sensing electrode TDL can be improved and thus the sensing sensitivity or sensing speed of the sensing electrode TDL can be improved.

Note that the first embodiment shows an example in which the portion PR2 is included in the electrode terminal ET1 as a portion of the electrode ET1 on a main body portion MP1 side. However, the portion PR2 may be included in the main body portion MP1 as a portion of the main body portion MP1 on an electrode terminal ET1 side.

Also, while the plan shape of the electrode terminal ET1 is a rectangular shape in the example illustrated in FIG. 12, the plan shape of the electrode terminal ET1 may be various shapes such as a circular shape.

The sensing electrode TDL may include a plurality of conductive lines arrayed in the X axis direction in the region AR1. Here, each of the plurality of conductive lines may have a zigzag shape extending in the Y axis direction as a whole while being alternately bent in opposite directions when seen in a plan view. Alternatively, the sensing electrode TDL may have a mesh shape formed of the plurality of conductive lines when seen in a plan view.

The opposing substrate 3 has a plurality of sensing electrodes TDL. The plurality of sensing electrodes TDL are arrayed in, for example, the X axis direction.

The protective film 33 is formed so as to cover the sensing electrodes TDL in the regions AR1 and AR2. The protective film 33 protects the sensing electrodes TDL formed of the conductive film by preventing moisture in the air, an acid organic substance, or the like from contacting the sensing electrodes TDL so that the sensing electrodes TDL are not corroded. As the protective film 33, for example, a resin film formed of ultraviolet (UV) setting resin, thermosetting resin, or both of them each made of acryl resin, epoxy resin, polyimide resin, or else may be used. Note that the protective film 33 has also a function of flattening the upper surface of the second substrate 31 in which the sensing electrodes TDL are formed.

The concave/convex pattern UE1 is formed on a surface of the portion PR2 or in a portion of the region AR2 positioned in periphery of the sensing electrode TDL on the second substrate 31. In other words, the concave/convex pattern UE1 is formed in the sensing electrode TDL or the second substrate 31.

In addition, an end portion of the protective film 33 on the region AR3 side terminates on the concave/convex pattern UE1. In other words, an end portion EP1 of the protective film 33 on the region AR3 side is positioned on the concave/convex pattern UE1.

As described above, the concave/convex pattern UE1 includes, for example, concave portions or convex portions. More specifically, the concave/convex pattern UE1 includes step portions made up of a high-level portion and a low-level portion. When applying the coating liquid for forming a protective film 33 onto the regions AR1 and AR2, the coating liquid easily spreads along the step portion, but it is difficult for the coating liquid to spread in the direction intersecting the step portion. Therefore, by adjusting the shape of the concave/convex pattern UE1, a length of the step portion can be adjusted, so that the position of the end portion of the coating liquid applied on the region AR2 can be accurately adjusted. More specifically, the concave/convex pattern UE1 is a position adjustment pattern for adjusting the position of the end portion EP1 of the protective film 33.

As illustrated in FIG. 14, a thickness TH1 of the protective film 33 can be made thicker than a thickness TH2 of the sensing electrode TDL. For example, the thickness TH2 of the sensing electrode TDL can be 10 nm to 2000 nm, and the thickness TH1 of the protective film 33 can be 500 nm to 10000 nm. Also, when the thickness TH1 of the protective film 33, that is, the thickness of the coating liquid for forming a protective film, is twice as large as the thickness TH2 of the sensing electrode TDL or larger, an effect of highly accurately adjusting the position of the end portion the coating liquid applied on the region AR2 is enhanced by the provision of the concave/convex pattern UE1.

Note that, in the example illustrated in FIG. 12, the concave/convex pattern UE1 is formed on the second substrate 31 in a portion of the region AR2 positioned on the periphery of the sensing electrode TDL. Also, the protective film 33 is terminated on the concave/convex pattern UE1 and on the portion PR2. In other words, the end portion EP1 of the protective film 33 on the region AR3 side is positioned on the concave/convex pattern UE1 and on the portion PR2.

Here, it is assumed that the X axis direction and the Y axis direction are orthogonal to each other and the portion PR1 has a width WD1 in the X axis direction, the portion PR2 has a width WD2 in the X axis direction, and the portion PR3 has a width WD3 in the X axis direction. Here, preferably, the width WD2 of the portion PR2 in the X axis direction is larger than the width WD1 of the portion PR1 in the X axis direction. With this, the portion PR2 has a shoulder portion SH1 and, it is possible to prevent or suppress the coating liquid for forming a protective film applied on the region AR1 from spreading toward the region AR2 by the shoulder portion SH1. Consequently, the position of the end portion of the coating liquid applied on the region AR2 can be highly accurately adjusted.

Note that FIG. 12 illustrates an example in which the width WD2 of the portion PR2 in the X axis direction is larger than the width WD1 of the portion PR1 in the X axis direction, and FIG. 15 illustrates an example in which the width WD2 of the portion PR2 in the X axis direction is equal to the width WD1 of the portion PR1 in the X axis direction. Also, FIG. 12 illustrates an example in which the width WD3 the portion PR3 in the X axis direction is equal to the width WD2 of the portion PR2 in the X axis direction, and FIG. 15 illustrates an example in which the width the portion PR3 in the X axis direction is equal to the width of the portion PR2 in the X axis direction.

For example, in the case illustrated in FIG. 12, that is, when the width WD2 is larger than the width WD1 and is equal to the width WD3, the widths WD2 and WD3 are, for example, 50 μm to 1000 μm each. Also, for example, in the case illustrated in FIG. 12, a space DS1 between two electrode terminals ET1 adjacent to each other is, for example, 50 μm to 1000 μm. With the space DS1 within such a range, it is possible to prevent or suppress the two electrode terminals ET1 adjacent to each other from being short-circuited by an anisotropic conductive film CF1 described later.

Also, the electrode substrate ES serving as the opposing substrate 3 may have the anisotropic conductive film (ACF) CF1 and a wiring substrate WS1. The anisotropic conductive film CF1 is disposed in the regions AR2 and AR3 so as to cover the sensing electrode TDL. The wiring substrate WS1 is disposed on the anisotropic conductive film CF1. As the wiring substrate WS1, for example, a flexible printed wiring board also referred to as flexible printed circuits (FPC) can be used. Hereinafter, an example of using FPC as the wiring substrate WS1 is described.

On a lower surface of the wiring substrate WS1 serving as a main surface thereof, a plurality of electrode terminals ET2 are formed. That is, the wiring substrate WS1 includes the plurality of electrode terminals ET2 formed on the lower surface serving as the main surface of the wiring substrate WS1. The plurality of electrode terminals ET2 are disposed so as to correspond to each of the electrode terminals ET1 of the plurality of sensing electrodes TDL, respectively. The wiring substrate WS1 is disposed on the anisotropic conductive film CF1 so that the plurality of electrode terminals ET2 are opposed to the electrode terminals ET1, respectively, which are portions of the plurality of sensing electrodes TDL formed in the region AR3, via the anisotropic conductive film CF1.

The anisotropic conductive film CF1 is a film formed by shaping a mixture of thermosetting resin with conductive fine metal particles into a film. With the anisotropic conductive film CF1 interposed between the electrode terminals ET1 of the sensing electrode TDL and the electrode terminals ET2 of the wiring substrate WS1, the wiring substrate WS1 is pressed onto the second substrate 31 by, for example, a heat treatment. With this, the metal particles in the anisotropic conductive film CF1 contact each other in a thickness direction of the anisotropic conductive film CF1 to form a conductive path in the thickness direction of the anisotropic conductive film CF1. The electrode terminals ET1 and the electrode terminals ET2 opposed to each other are electrically connected to each other via the anisotropic conductive film CF1.

Preferably, an end portion EP2 of the anisotropic conductive film CF1 on the region AR1 side overrides the protective film 33 to be terminated on the protective film 33. In other words, the end portion EP2 of the anisotropic conductive film CF1 on the region AR1 side is positioned on the protective film 33.

With this, any portion of the portion PR2 is covered with either one of the protective film 33 and the anisotropic conductive film CF1, and moisture in the air can be prevented from contacting any portion of the portion PR2. Therefore, the sensing electrode TDL formed of a conductive film can be reliably protected from corrosion.

<Concave/Convex Pattern>

Figure 16:
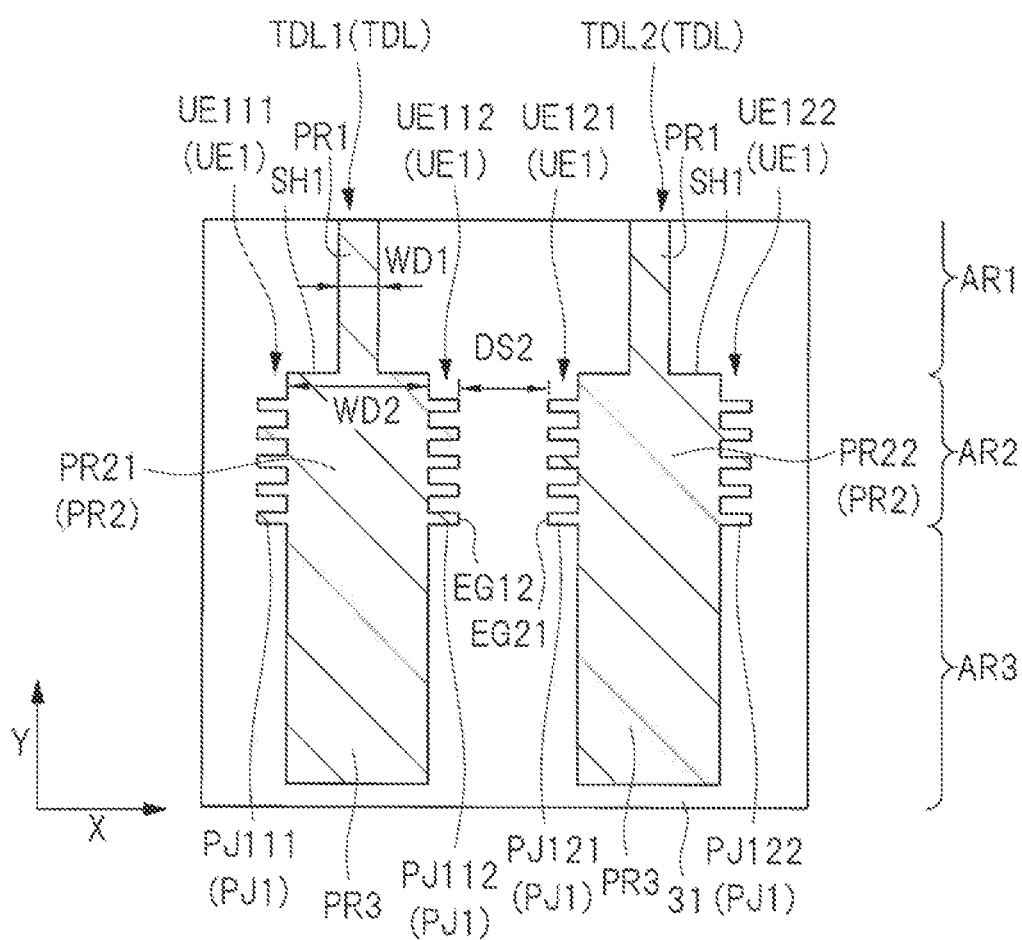
FIG. 16 is a plan view illustrating concave/convex patterns of the electrode substrate according to the first embodiment.

FIG. 16 is a plan view illustrating the concave/convex pattern in the electrode substrate of the first embodiment.

As illustrated in FIG. 16, in the first embodiment, the concave/convex pattern UE1 includes a projecting portion PJ1. The projecting portion PJ1 is formed so as to project and extend from a side surface of the portion PR2 of the sensing electrode TDL extending in the Y axis direction formed in the region AR2 toward the X axis direction, when seen in a plan view. Therefore, the concave/convex pattern UE1 is formed on the side surface of the portion PR2 and the protective film 33 is terminated on the concave/convex pattern UE1 and on the portion PR2 as illustrated in FIG. 12 and FIG. 13. In other words, the end portion EP1 of the protective film 33 on the region AR3 side is positioned on the concave/convex pattern UE1 and on the portion PR2. Note that the projecting portion PJ1 is also a convex portion formed on the second substrate 31.

In this manner, the projecting portion PJ1 serving as a step portion can increase the length of the outer periphery of the portion PR2 of the sensing electrode TDL formed in the region AR2, and the projecting portion PJ1 serving as a side wall of the step portion can increase the area of the side surface of the portion PR2 of the sensing electrode TDL formed in the region AR2. That is, the length of the step portion can be increased. Consequently, it is possible to prevent or suppress the coating liquid for forming a protective film applied on the region AR2 from spreading toward the region AR3 side, and the position of the end portion of the coating liquid applied on the region AR2 can be highly accurately adjusted.

Preferably, the concave/convex pattern UE1 includes a plurality of projecting portions PJ1. The plurality of projecting portions PJ1 are formed so as to extend in the X axis direction as projecting from the side surface of the portion PR2 of the sensing electrode TDL extending in the Y axis direction formed in the region AR2, and are arrayed in the Y axis direction, when seen in a plan view. With this, it is possible to easily prevent or suppress the coating liquid for forming a protective film applied on the region AR2 from spreading toward the region AR3 side. Consequently, the position of the end portion of the coating liquid applied on the region AR2 can be easily highly accurately adjusted.

Also, in the first embodiment, sensing electrodes TDL1 and TDL2 are provided as two sensing electrodes TDL each extending in the Y axis direction and adjacent to each other in the X axis direction when seen in a plan view. As illustrated in FIG. 12 and FIG. 13, in the regions AR1 and AR2, the protective film 33 is formed so as to cover the two sensing electrodes TDL and also cover a portion of the second substrate 31 positioned between the two sensing electrodes TDL.

A concave/convex pattern UE111 serving as the concave/convex pattern UE1 provided so as to correspond to the sensing electrode TDL1 includes a plurality of projecting portions PJ111 serving as the projecting portion PJ1, and a concave/convex pattern UE112 serving as the concave/convex pattern UE1 provided so as to correspond to the sensing electrode TDL1 includes a plurality of projecting portions PJ112 serving as the projecting portion PJ1. The plurality of projecting portions PJ111 each project and extend in the X axis direction from a side surface opposite to a sensing electrode TDL2 side of a portion PR21 serving as the portion PR2 of the sensing electrode TDL1 formed in the region AR2 to a side opposite to the sensing electrode TDL2 side, and are arrayed in the Y axis direction. The plurality of projecting portions PJ112 each project and extend in the X axis direction from a side surface of the portion PR21 on the sensing electrode TDL2 side to the sensing electrode TDL2 side, and are arrayed in the Y axis direction.

Also, a concave/convex pattern UE121 serving as the concave/convex pattern UE1 provided so as to correspond to the sensing electrode TDL2 includes a plurality of projecting portions PJ121 serving as the projecting portion PJ1, and a concave/convex pattern UE122 serving as the concave/convex pattern UE1 provided so as to correspond to the sensing electrode TDL2 includes a plurality of projecting portions PJ122 serving as the projecting portion PJ1. The plurality of projecting portions PJ121 each project and extend in the X axis direction from a side surface on a sensing electrode TDL1 side of a portion PR22 serving as the portion PR2 of the sensing electrode TDL2 formed in the region AR2, and are arrayed in the Y axis direction. The plurality of projecting portions PJ122 each project and extend in the X axis direction from a side surface opposite to a sensing electrode TDL1 side of the portion PR22 toward a side opposite to the sensing electrode TDL1 side, and are arrayed in the Y axis direction. Note that the plurality of projecting portions PJ112 and the plurality of projecting portions PJ121 may be disposed in a staggered configuration in the Y axis direction as similar to an example described later by using FIG. 19.

As illustrated in FIG. 16, when the projecting portions PJ112 and the projecting portions PJ121 are provided, a minimum distance between two sensing electrodes TDL1 and TDL2 adjacent to each other is equal to a minimum distance DS2 between the projecting portions PJ112 and the projecting portions PJ121 in the X axis direction. In this case, preferably, the minimum distance DS2 between the projecting portions PJ112 and the projecting portions PJ121 in the X axis direction is larger than an average particle diameter of the conductive particles contained in the anisotropic conductive film CF1 (see FIG. 12 and FIG. 13). With this, it is possible to prevent or suppress the projecting portions PJ112 and the projecting portions PJ121 from being short-circuited by the conductive particles contained in the anisotropic conductive film CF1 (see FIG. 12 and FIG. 13).

More preferably, the minimum distance DS2 between the projecting portions PJ112 and the projecting portions PJ121 in the X axis direction is three times as large as the average particle diameter of the conductive particles contained in the anisotropic conductive film CF1 or larger (see FIG. 12 and FIG. 13). Alternatively, when the average particle diameter of the conductive particles is, for example, smaller than 5000 nm, the minimum distance DS2 between the projecting portions PJ112 and the projecting portions PJ121 in the X axis direction is preferably, for example, 15000 nm to 50000 nm. With this, it is possible to easily prevent or suppress the projecting portions PJ112 and the projecting portions PJ121 from being short-circuited by the conductive particles contained in the anisotropic conductive film CF1 (see FIG. 12 and FIG. 13).

Note that, for example, when the plurality of projecting portions PJ112 are provided but the plurality of projecting portions PJ121 are not provided, the minimum distance between two sensing electrodes TDL1 and TDL2 adjacent to each other is equal to a minimum distance between a side surface of the sensing electrode TDL2 on a sensing electrode TDL1 side and the projecting portions PJ112 in the X axis direction. Also in this case, preferably, a minimum distance between the side surface of the sensing electrode TDL2 on the sensing electrode TDL1 side and the projecting portions PJ112 in the X axis direction is larger than the average particle diameter of the conductive particles contained in the anisotropic conductive film CF1 (see FIG. 12 and FIG. 13). Furthermore, more preferably, the minimum distance between the side surface of the sensing electrode TDL2 on the sensing electrode TDL1 side and the projecting portions PJ112 in the X axis direction is three times as large as the average particle diameter of the conductive particles contained in the anisotropic conductive film CF1 (see FIG. 12 and FIG. 13) or larger.

In this manner, the adjacent sensing electrodes TDL1 and TDL2 are preferably disposed so as to have a similar minimum distance between any portions thereof in not only the X axis direction and the Y axis direction but also any direction.

Note that, as similar to the description by using FIG. 12, the width WD2 of the portion PR2 in the X axis direction is larger than the width WD1 of the portion PR1 in the X axis direction. With this, the shoulder portion SH1 can prevent or suppress the coating liquid for forming a protective film applied on the region AR1 from spreading toward the region AR2.

Figure 17:
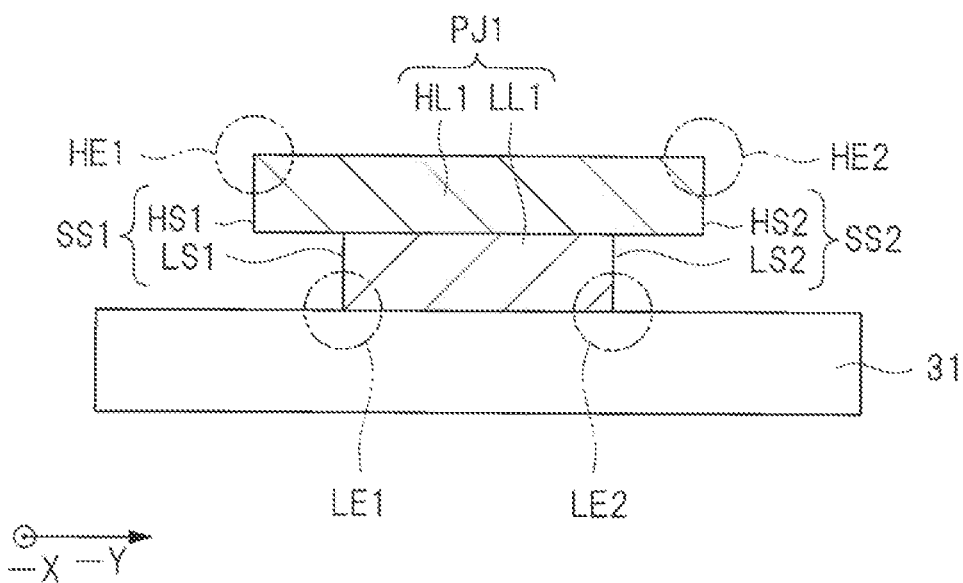
FIG. 17 is a cross-sectional view illustrating another example of the concave/convex patterns of the electrode substrate according to the first embodiment.
Figure 18:
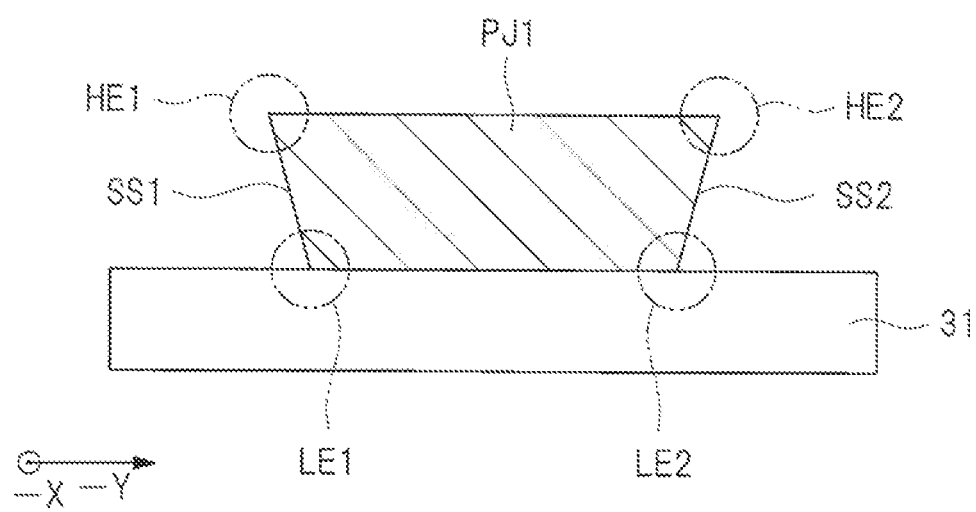
FIG. 18 is a cross-sectional view illustrating another example of the concave/convex patterns of the electrode substrate according to the first embodiment.

FIG. 17 and FIG. 18 are cross-sectional views illustrating other examples of the concave/convex pattern in the electrode substrate of the first embodiment. FIG. 17 and FIG. 18 are cross-sectional views when seen from a direction in which the projecting portion PJ1 extends. Also, illustration of the protective film 33 is omitted in FIG. 17 and FIG. 18.

As illustrated in FIG. 17 and FIG. 18, the projecting portion PJ1 as a convex portion includes a side surface portion SS1 positioned, for example, on one side (left side in FIG. 17) in the Y axis direction orthogonal to the X axis direction when seen in a plan view, and an upper end portion HE1 of the side surface portion SS1 is positioned closer to the one side (left side in FIG. 17) than a lower end portion LE1 of the side surface portion SS1 in the Y axis direction. Also, the projecting portion PJ1 includes a side surface portion SS2 positioned, for example, on the other side (right side in FIG. 17) in the Y axis direction orthogonal to the X axis direction when seen in a plan view, and an upper end portion HE2 of the side surface portion SS2 is positioned closer to the other side (right side in FIG. 17) than a lower end portion LE2 of the side surface portion SS2 in the Y axis direction.

In the example illustrated in FIG. 17, the projecting portion PJ1 includes a lower layer portion LL1 formed on the second substrate 31 and an upper layer portion HL1 formed on the lower layer portion LL1. A side surface portion LS1 of the lower layer portion LL1 on one side (left side in FIG. 17) in the Y axis direction is retreated in the Y axis direction to a side opposite to the one side (left side in FIG. 17) further than a side surface portion HS1 of the upper layer portion HL1 on one side (left side in FIG. 17) in the Y axis direction. Also, a side surface portion LS2 of the lower layer portion LL1 on the other side (right side in FIG. 17) in the Y axis direction is retreated in the Y axis direction to a side opposite to the other side (right side in FIG. 17) further than a side surface portion HS2 of the upper layer portion HL1 on the other side (right side in FIG. 17) in the Y axis direction. With this, the upper end portion HE1 of the side surface portion SS1 is positioned closer to one side (left side in FIG. 17) than the lower end portion LE1 of the side surface portion SS1 in the Y axis direction, and the upper end portion HE2 of the side surface portion SS2 is positioned closer to the other side (right side in FIG. 17) than the lower end portion LE2 of the side surface portion SS2 in the Y axis direction.

Also, in the example illustrated in FIG. 18, a cross-sectional shape perpendicular to the direction in which the projecting portion PJ1 extends is an inverted trapezoidal shape. That is, in a cross section perpendicular to the direction in which the projecting portion PJ1 extends, either one or both of the side surfaces of the projecting portion PJ1 are tilted so that the width of the projecting portion PJ1 is decreased from the upper surface of the projecting portion PJ1 toward the lower surface of the projecting portion PJ1.

Figure 31:
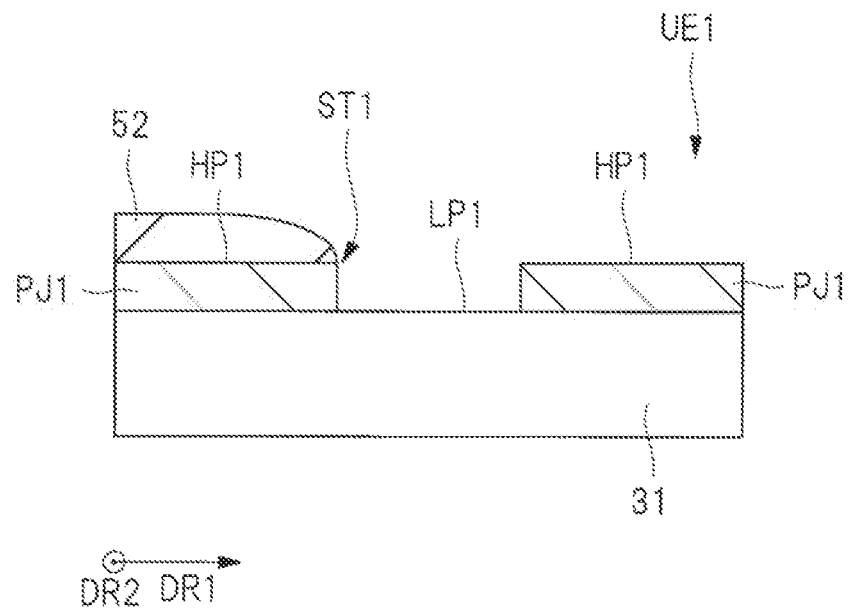
FIG. 31 is a cross-sectional view illustrating the electrode substrate according to the first embodiment during the manufacturing process thereof.

The projecting portion PJ1 as the convex portion has such a cross-sectional shape, so that the effect of stopping the coating liquid on the upper side of the step portion ST1 described later by using FIG. 31 is enhanced. Consequently, the position of the end portion of the coating liquid can be further highly accurately adjusted.

In the example illustrated in FIG. 17, after the lower layer portion LL1 and the upper layer portion HL1 are laminated so that, for example, the etching speed of the lower layer portion LL1 with respect to an etchant is higher than the etching speed of the upper layer portion HL1 with respect to that etchant, etching is performed by using that etchant. With this, the projecting portion PJ1 can be formed so that the upper end portion HE1 of the side surface portion SS1 is positioned closer to one side (left side in FIG. 17) than the lower end portion LE1 of the side surface portion SS1 in the Y axis direction and is positioned closer to the other side (right side in FIG. 17) than the lower end portion LE2 of the side surface portion SS2 in the Y axis direction (the same goes for each of the following modification examples).

Alternatively, a portion of the side surface of the projecting portion PJ1 other than the upper end portion may partially have a constricted portion (the same goes for each of the following modification examples).

First Modification Example of Concave/Convex Pattern

Figure 19:
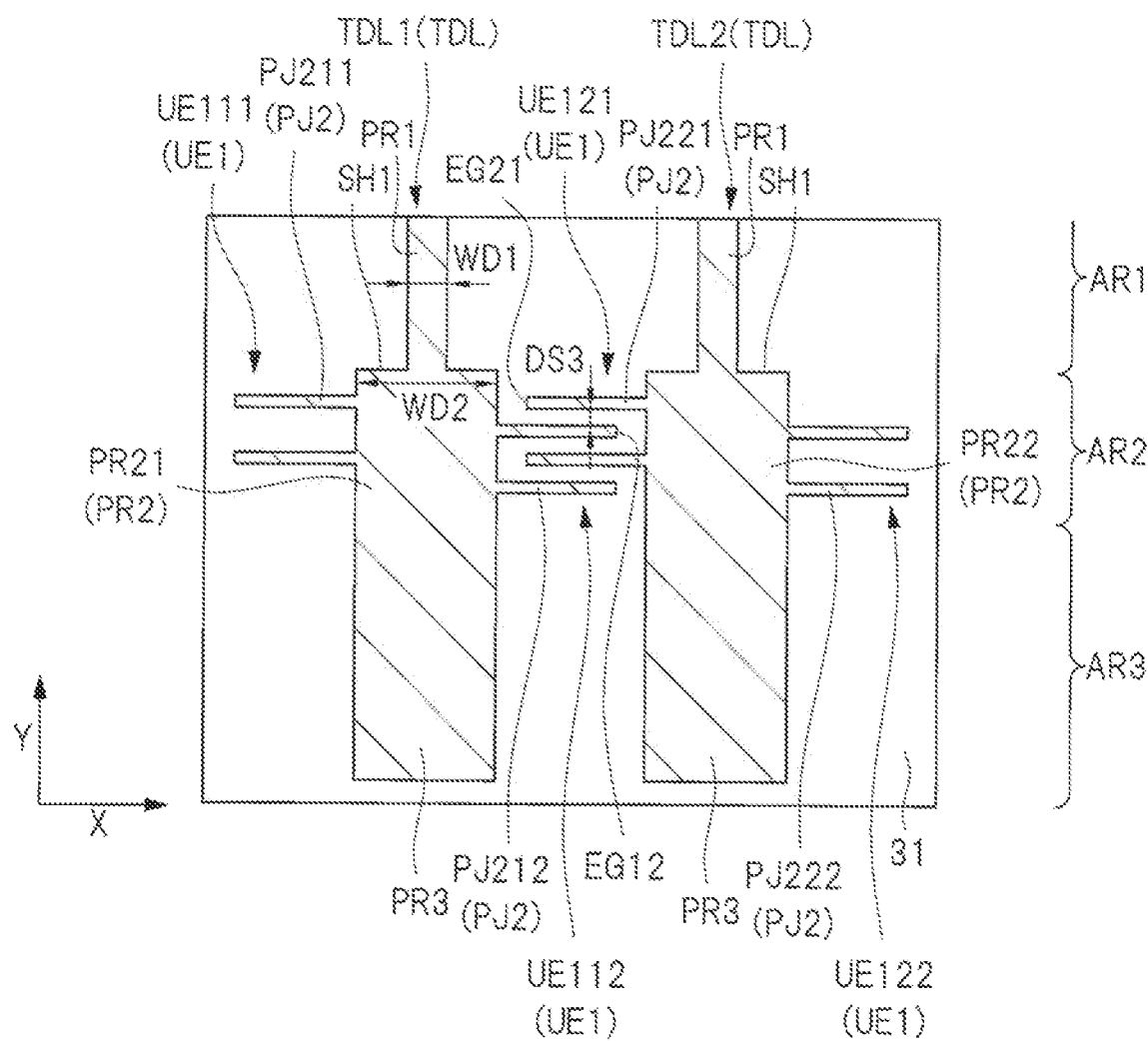
FIG. 19 is a cross-sectional view illustrating a first modification example of the concave/convex patterns of the electrode substrate according to the first embodiment.

FIG. 19 is a plan view illustrating a first modification example of the concave/convex pattern in the electrode substrate of the first embodiment.

As illustrated in FIG. 19, in the first modification example, the concave/convex pattern UE1 includes a projecting portion PJ2. The projecting portion PJ2 is formed so as to project and extend from a side surface of the portion PR2 of the sensing electrode TDL extending in the Y axis direction formed in the region AR2 toward the X axis direction, when seen in a plan view. Therefore, the concave/convex pattern UE1 is formed on the side surface of the portion PR2 and the protective film 33 is terminated on the concave/convex pattern UE1 and on the portion PR2 as illustrated in FIG. 12, FIG. 13, and FIG. 15. In other words, the end portion EP1 of the protective film 33 on a region AR3 side is positioned on the concave/convex pattern UE1 and on the portion PR2. Note that the projecting portion PJ2 is also a convex portion formed on the second substrate 31.

In this manner, the projecting portion PJ2 serving as a step portion can increase the length of the outer periphery of the portion PR2 of the sensing electrode TDL formed in the region AR2, and the projecting portion PJ2 serving as a side wall of the step portion can increase the area of the portion PR2 of the sensing electrode TDL formed in the region AR2. That is, the length of the step portion can be increased. Consequently, it is possible to prevent or suppress the coating liquid for forming a protective film applied on the region AR2 from spreading toward the region AR3 side, and the position of the end portion of the coating liquid applied on the region AR2 can be highly accurately adjusted.

Preferably, the concave/convex pattern UE1 includes a plurality of projecting portions PJ2. The plurality of projecting portions PJ2 are formed so as to extend in the X axis direction as projecting from the side surface of the portion PR2 of the sensing electrode TDL extending in the Y axis direction formed in the region AR2, when seen in a plan view, and are arrayed in the Y axis direction. With this, it is possible to easily prevent or suppress the coating liquid for forming a protective film applied on the region AR2 from spreading toward the region AR3 side. Consequently, the position of the end portion of the coating liquid applied on the region AR2 can be highly accurately adjusted with ease.

Also, in the first modification example, sensing electrodes TDL1 and TDL2 are provided as two sensing electrodes TDL each extending in the X axis direction and adjacent to each other in the Y axis direction when seen in a plan view. As illustrated in FIG. 12, FIG. 13, and FIG. 15, the protective film 33 is formed so as to cover the two sensing electrodes TDL and also cover a portion of the second substrate 31 positioned between the two sensing electrodes TDL in the regions AR1 and AR2.

The concave/convex pattern UE111 serving as the concave/convex pattern UE1 provided so as to correspond to the sensing electrode TDL1 includes a plurality of projecting portions PJ211 serving as the projecting portion PJ2, and the concave/convex pattern UE112 serving as the concave/convex pattern UE1 provided so as to correspond to the sensing electrode TDL1 includes a plurality of projecting portions PJ212 serving as the projecting portion PJ2. The plurality of projecting portions PJ211 each project and extend in the X axis direction from a side surface opposite to a sensing electrode TDL2 side of the portion PR21 serving as the portion PR2 of the sensing electrode TDL1 formed in the region AR2 to a side opposite to the sensing electrode TDL2 side, and are arrayed in the Y axis direction. The plurality of projecting portions PJ212 each project and extend in the X axis direction from a side surface of the portion PR21 on the sensing electrode TDL2 side to the sensing electrode TDL2 side, and are arrayed in the Y axis direction.

Also, the concave/convex pattern UE121 serving as the concave/convex pattern UE1 provided so as to correspond to the sensing electrode TDL2 includes a plurality of projecting portions PJ221 serving as the projecting portion PJ2, and the concave/convex pattern UE122 serving as the concave/convex pattern UE1 provided so as to correspond to the sensing electrode TDL2 includes a plurality of projecting portions PJ222 serving as the projecting portion PJ2. The plurality of projecting portions PJ221 each project and extend in the X axis direction from a side surface on a sensing electrode TDL1 side of a portion PR22 serving as the portion PR2 of the sensing electrode TDL2 formed in the region AR2, and are arrayed in the Y axis direction. The plurality of projecting portions PJ222 each project and extend in the X axis direction from a side surface of the portion PR22 opposite to a sensing electrode TDL1 side toward a side opposite to the sensing electrode TDL1 side, and are arrayed in the Y axis direction.

In the first modification example, as illustrated in FIG. 19, an end portion EG12 of the projecting portion PJ212 on the sensing electrode TDL2 side is disposed closer to a sensing electrode TDL2 side than an end portion EG21 of the projecting portion PJ221 on a sensing electrode TDL1 side in the X axis direction. Also, each of the plurality of projecting portions PJ212 and the each of the plurality of projecting portions PJ221 are alternately disposed along the Y axis direction. Therefore, the plurality of projecting portions PJ212 and the plurality of projecting portions PJ221 are disposed in a staggered configuration in the Y axis direction.

With this, when the coating liquid for forming a protective film applied on a portion of the second substrate 31 positioned between two sensing electrodes TDL adjacent to each other in the region AR2 spreads toward the region AR3 side, the number of intersecting step portions is increased. With this, it is possible to easily prevent or suppress the coating liquid for forming a protective film applied on the region AR2 from spreading toward the region AR3 side. Consequently, the position of the end portion of the coating liquid applied on the region AR2 can be highly accurately adjusted with ease.

As illustrated in FIG. 19, when the projecting portions PJ212 and the projecting portions PJ221 are provided, a minimum distance between two sensing electrodes TDL1 and TDL2 adjacent to each other is equal to a minimum distance DS3 between the projecting portions PJ212 and the projecting portions PJ221 in the Y axis direction. In this case, preferably, the minimum distance DS3 between the projecting portions PJ212 and the projecting portions PJ221 in the Y axis direction is larger than the average particle diameter of the conductive particles contained in the anisotropic conductive film CF1 (see FIG. 12 and FIG. 13). With this, it is possible to prevent or suppress the projecting portions PJ212 and the projecting portions PJ221 from being short-circuited by the conductive particles contained in the anisotropic conductive film CF1 (see FIG. 12 and FIG. 13).

More preferably, the minimum distance DS3 between the projecting portions PJ212 and the projecting portions PJ221 in the Y axis direction is three times as large as the average particle diameter of the conductive particles contained in the anisotropic conductive film CF1 or larger (see FIG. 12 and FIG. 13). Alternatively, when the average particle diameter of the conductive particles is, for example, smaller than 5000 nm, the minimum distance DS3 between the projecting portions PJ212 and the projecting portions PJ221 in the Y axis direction is preferably, for example, 15000 nm to 50000 nm. With this, it is possible to easily prevent or suppress the projecting portions PJ212 and the projecting portions PJ221 from being short-circuited by the conductive particles contained in the anisotropic conductive film CF1 (see FIG. 12 and FIG. 13).

Note that, for example, when the plurality of projecting portions PJ212 are provided but the plurality of projecting portions PJ221 are not provided, the minimum distance between two sensing electrodes TDL1 and TDL2 adjacent to each other is equal to a minimum distance between a side surface of the sensing electrode TDL2 on a sensing electrode TDL1 side and the projecting portions PJ212 in the X axis direction. Also in this case, preferably, a minimum distance between the side surface of the sensing electrode TDL2 on the sensing electrode TDL1 side and the projecting portions PJ212 in the X axis direction is larger than the average particle diameter of the conductive particles contained in the anisotropic conductive film CF1 (see FIG. 12 and FIG. 13). Furthermore, more preferably, the minimum distance between the side surface of the sensing electrode TDL2 on the sensing electrode TDL1 side and the projecting portions PJ212 in the X axis direction is three times as large as the average particle diameter of the conductive particles contained in the anisotropic conductive film CF1 or larger (see FIG. 12 and FIG. 13).

In this manner, the adjacent sensing electrodes TDL1 and TDL2 are preferably disposed so as to have a similar minimum distance between any portions thereof in not only the X axis direction and the Y axis direction but also any direction.

In the first modification example, the end portion EG12 of the projecting portion PJ212 on the sensing electrode TDL2 side is disposed in the X axis direction closer to the sensing electrode TDL2 side than the end portion EG21 of the projecting PJ221 on the sensing electrode TDL1 side. Consequently, the effect of preventing or suppressing the coating liquid for forming a protective film applied on the region AR2 from spreading toward the region AR3 side is enhanced more than the first embodiment (see FIG. 16) in which the end portion EG12 of the projecting portion PJ112 on the sensing electrode TDL2 side is disposed in the X axis direction closer to the sensing electrode TDL1 side than the end portion EG21 of the projecting portion PJ121 on the sensing electrode TDL1 side.

Note that, also in the first modification example, as similar to the first embodiment described by using FIG. 12, the width WD2 of the portion PR2 in the X axis direction is larger than the width WD1 of the portion PR1 in the X axis direction. With this, the shoulder portion SH1 can prevent or suppress the coating liquid for forming a protective film applied on the region AR1 from spreading toward the region AR2 (the same goes for each of the following modification examples, although illustration of the widths WD1 and WD2 is omitted).

Second Modification Example of Concave/Convex Pattern

Figure 20:
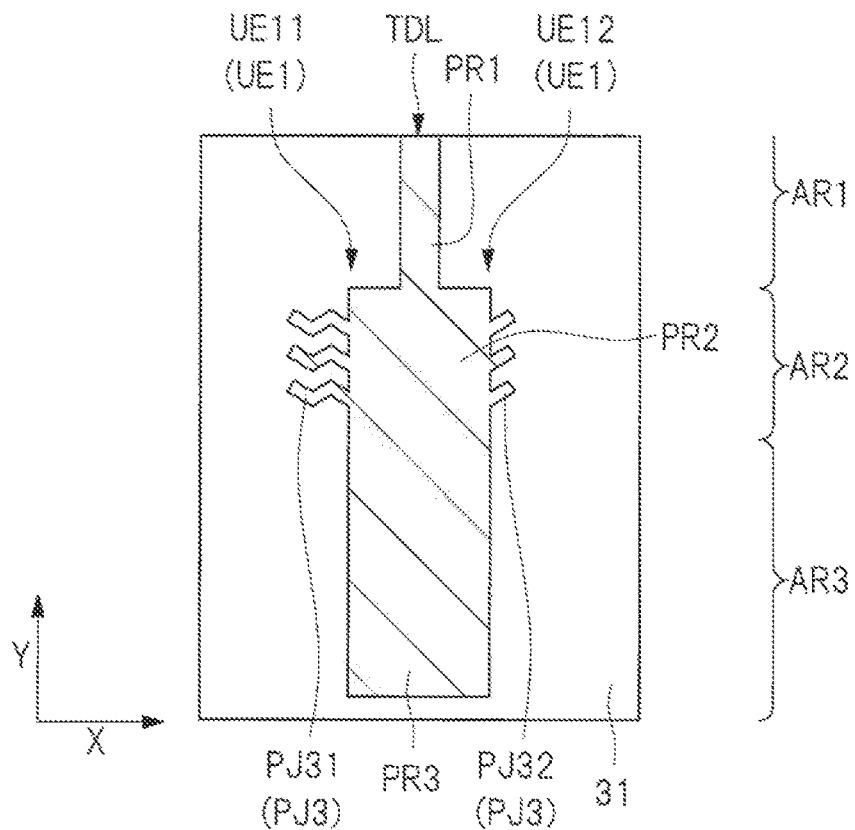
FIG. 20 is a cross-sectional view illustrating a second modification example of the concave/convex patterns of the electrode substrate according to the first embodiment.

FIG. 20 is a plan view of a second modification example of the concave/convex pattern in the electrode substrate of the first embodiment.

As illustrated in FIG. 20, in the second modification example, the concave/convex pattern UE1 includes a projecting portion PJ3 formed so as to project from a side surface of the portion PR2 of the sensing electrode TDL extending in the Y axis direction formed in the region AR2, when seen in a plan view. Therefore, the concave/convex pattern UE1 is formed on the side surface of the portion PR2 and the protective film 33 is terminated on the concave/convex pattern UE1 and on the portion PR2 as illustrated in FIG. 12, FIG. 13, and FIG. 15. In other words, the end portion EP1 of the protective film 33 on a region AR3 side is positioned on the concave/convex pattern UE1 and on the portion PR2. Note that the projecting portion PJ3 is also a convex portion formed on the first substrate 21.

In this manner, the projecting portion PJ3 serving as a step portion can increase the length of the outer periphery of the portion PR2, and the area of the side surface of the projecting portion PJ3 serving as a step portion can increase the area of the side surface of the portion PR2. That is, the length of the step portion can be increased. Consequently, it is possible to prevent or suppress the coating liquid for forming a protective film applied on the region AR2 from spreading toward the region AR3 side, and the position of the end portion of the coating liquid applied on the region AR2 can be highly accurately adjusted.

Preferably, the concave/convex pattern UE1 includes a plurality of projecting portions PJ3. The plurality of projecting portions PJ3 are formed so as to project from the side surface of the portion PR2 of the sensing electrode TDL extending in the Y axis direction formed in the region AR2, and are arrayed in the Y axis direction, when seen in a plan view. With this, it is possible to easily prevent or suppress the coating liquid for forming a protective film applied on the region AR2 from spreading toward the region AR3 side. Consequently, the position of the end portion of the coating liquid applied on the region AR2 can be highly accurately adjusted with ease.

In the second modification example, a concave/convex pattern UE11 serving as the concave/convex pattern UE1 includes a plurality of projecting portions PJ31 serving as the projecting portion PJ3, and a concave/convex pattern UE12 serving as the concave/convex pattern UE1 includes a plurality of projecting portions PJ32 serving as the projecting portion PJ3. The plurality of projecting portions PJ31 may each extend in the X axis direction as a whole, as being alternately bent in opposite directions to each other, when seen in a plan view. Alternatively, the plurality of projecting portions PJ31 may each be bent once in the middle. Also, the plurality of projecting portions PJ32 may extend in a direction intersecting both of the X axis direction and the Y axis direction, when seen in a plan view.

Third Modification Example of Concave/Convex Pattern

Figure 21:
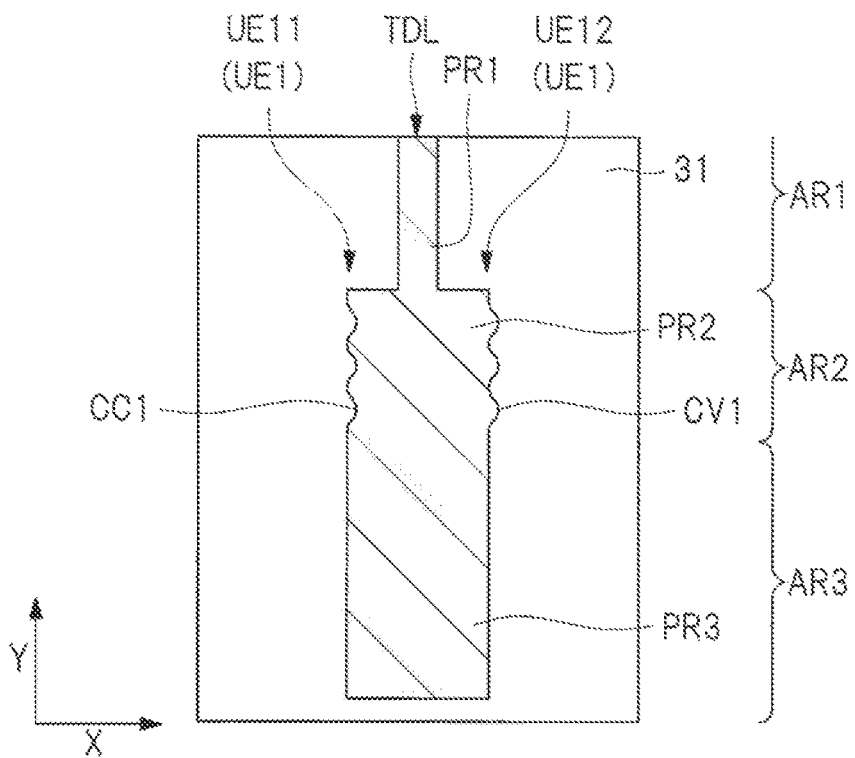
FIG. 21 is a cross-sectional view illustrating a third modification example of the concave/convex patterns of the electrode substrate according to the first embodiment.

FIG. 21 is a plan view of a third modification example of the concave/convex pattern in the electrode substrate of the first embodiment.

As illustrated in FIG. 21, in the third modification example, the concave/convex pattern UE11 serving as the concave/convex pattern UE1 includes a plurality of concave portions CC1. The plurality of concave portions CC1 are formed on a side surface of the portion PR2 of the sensing electrode TDL extending in the Y axis direction formed in the region AR2 when seen in a plan view. The plurality of concave portions CC1 are arrayed in the Y axis direction.

Also, in the third modification example, the concave/convex pattern UE12 serving as the concave/convex pattern UE1 includes a plurality of convex portions CV1. The plurality of convex portions CV1 are formed on a side surface of the portion PR2 of the sensing electrode TDL extending in the Y axis direction formed in the region AR2, and are arrayed in the Y axis direction when seen in a plan view.

In this manner, the concave portions CC1 as a step portion can increase the length of the outer periphery of the portion PR2, and the area of the side surfaces of the concave portions CC1 as a step portion can increase the area of the side surface of the portion PR2. That is, the length of the step portion can be increased. Consequently, it is possible to prevent or suppress the coating liquid for forming a protective film applied on the region AR2 from spreading toward the region AR3 side, and the position of the end portion of the coating liquid applied on the region AR2 can be easily highly accurately adjusted.

Fourth Modification Example of Concave/Convex Pattern

Figure 22:
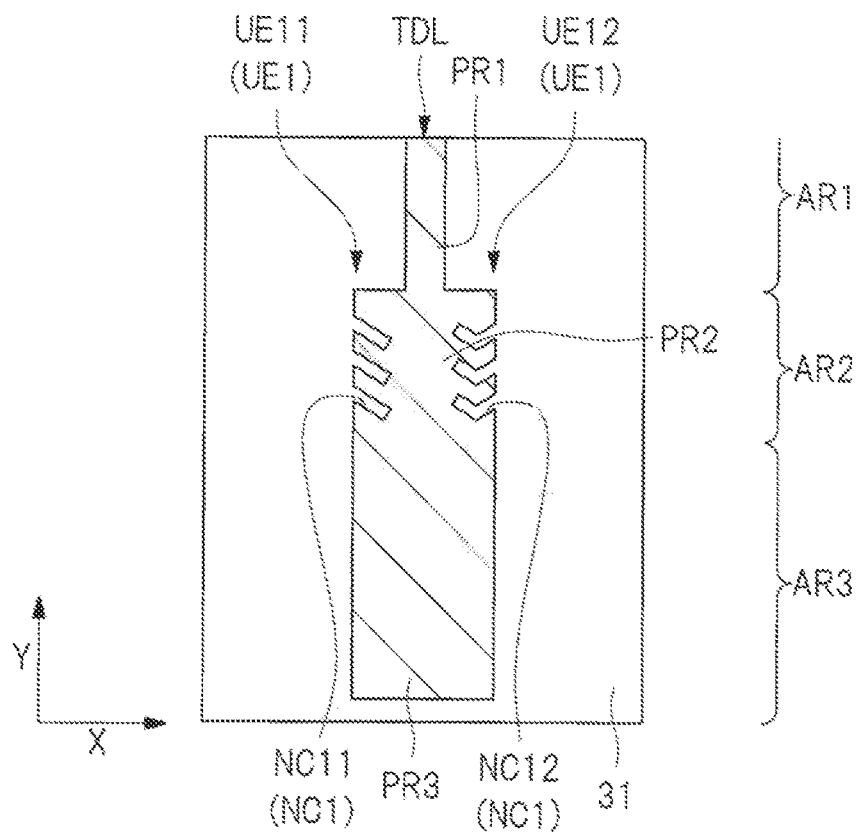
FIG. 22 is a cross-sectional view illustrating a fourth modification example of the concave/convex patterns of the electrode substrate according to the first embodiment.

FIG. 22 is a plan view of a fourth modification example of the concave/convex pattern in the electrode substrate of the first embodiment.

As illustrated in FIG. 22, in the fourth modification example, the concave/convex pattern UE1 includes a notch portion NC1. The notch portion NC1 is formed by the cut from the side surface of the portion PR2 of the sensing electrode TDL extending in the Y axis direction formed in the region AR2 when seen in a plan view. Therefore, the concave/convex pattern UE1 is formed on the side surface and the upper surface of the portion PR2 and the protective film 33 is terminated on the concave/convex pattern UE1 and on the portion PR2 as illustrated in FIG. 12, FIG. 13, and FIG. 15. In other words, the end portion EP1 of the protective film 33 on the region AR3 side is positioned on the concave/convex pattern UE1 and on the portion PR2. Note that the notch portion NC1 is also a concave portion formed in the upper surface of the sensing electrode TDL. Also, the notch portion NC1 is a concave portion formed from the side surface of the sensing electrode TDL toward the center axis in the extending direction of the sensing electrode TDL.

In this manner, the notch portion NC1 serving as a step portion can increase the length of the outer periphery of the portion PR2, and the area of the side surface of the notch portion NC1 serving as a step portion can increase the area of the side surface of the portion PR2. That is, the length of the step portion can be increased. Consequently, it is possible to prevent or suppress the coating liquid for forming a protective film applied on the region AR2 from spreading toward the region AR3 side, and the position of the end portion of the coating liquid applied on the region AR2 can be highly accurately adjusted.

Preferably, the concave/convex pattern UE1 includes a plurality of notch portions NC1. The plurality of notch portions NC1 are formed by the cut from the side surface of the portion PR2 of the sensing electrode TDL extending in the Y axis direction formed in the region AR2, and are arrayed in the Y axis direction, when seen in a plan view. With this, the length of the outer periphery of the portion PR2 serving as a step portion can be further increased. Consequently, it is possible to easily prevent or suppress the coating liquid for forming a protective film applied on the region AR2 from spreading toward the region AR3 side, and the position of the end portion of the coating liquid applied on the region AR2 can be easily highly accurately adjusted.

Note that, in the fourth modification example, a concave/convex pattern UE11 serving as the concave/convex pattern UE1 includes a plurality of notch portions NC11 serving as the notch portion NC1, and a concave/convex pattern UE12 serving as the concave/convex pattern UE1 includes a plurality of notch portions NC12 serving as the notch portion NC1. Each of the plurality of notch portions NC11 may extend in a direction intersecting both of the X axis direction and the Y axis direction, when seen in a plan view. Also, each of the plurality of notch portions NC12 may each extend in the X axis direction as a whole as being alternately bent in opposite directions to each other when seen in a plan view. Alternatively, each of the plurality of notch portions NC12 may be bent once in the middle.

Figure 23:
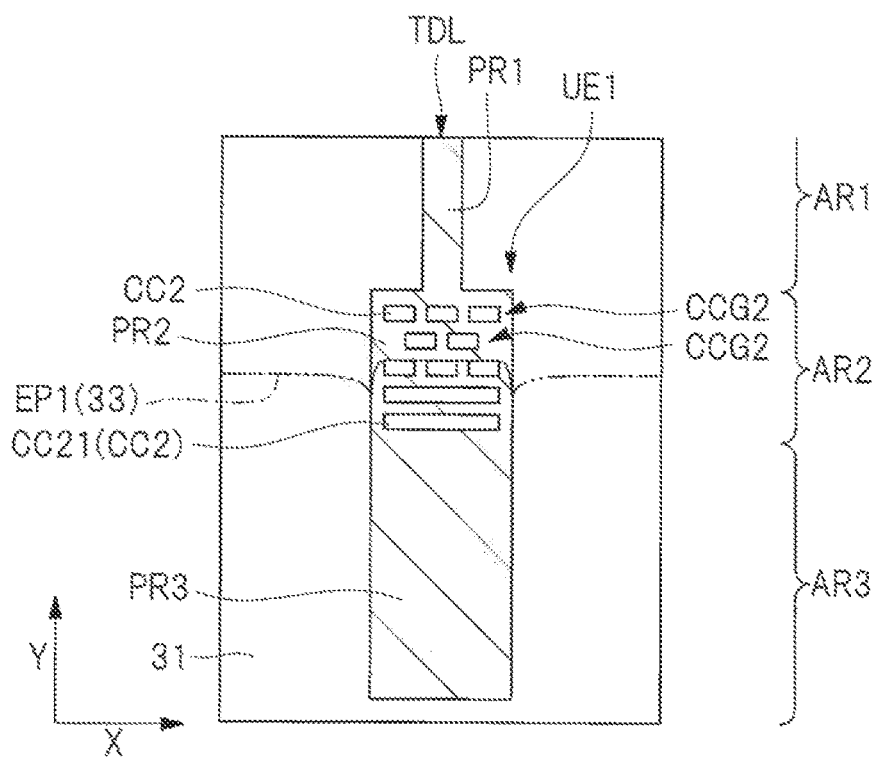
FIG. 23 is a cross-sectional view illustrating a fifth modification example of the concave/convex patterns of the electrode substrate according to the first embodiment.
Figure 24:
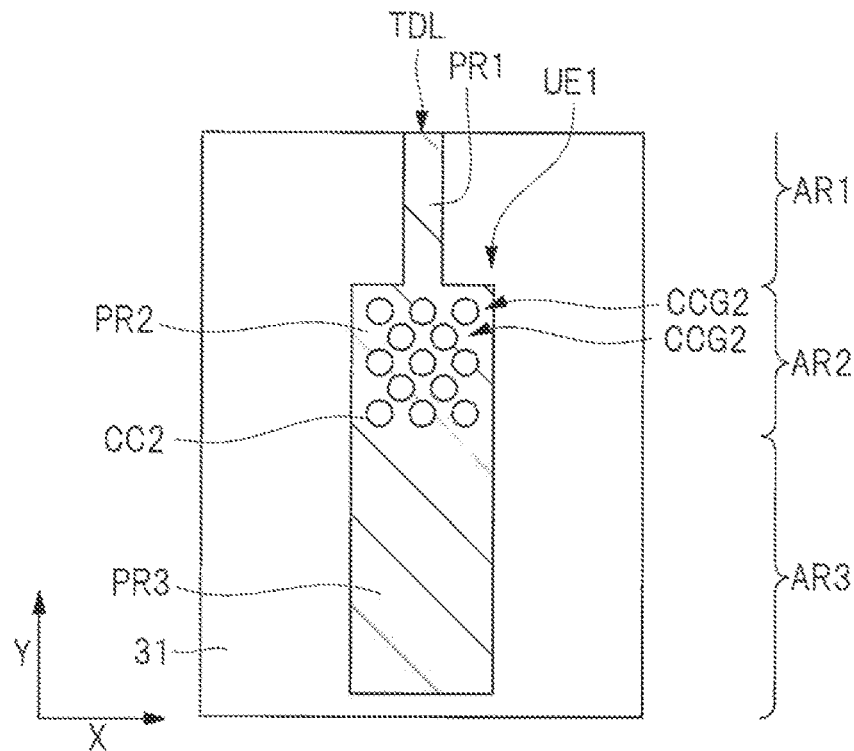
FIG. 24 is a cross-sectional view illustrating a sixth modification example of the concave/convex patterns of the electrode substrate according to the first embodiment.

Fifth Modification Example and Sixth Modification Example of Concave/Convex Pattern FIG. 23 is a plan view illustrating a fifth modification example of the concave/convex pattern in the electrode substrate of the first embodiment. FIG. 24 is a plan view illustrating a sixth modification example of the concave/convex pattern in the electrode substrate of the first embodiment. Note that FIG. 23 illustrates the end portion of the protective film 33 represented by a dashed-two dotted line.

As illustrated in FIG. 23 and FIG. 24, in the fifth modification example and the sixth modification example, the concave/convex pattern UE1 includes a concave portion CC2. The concave portion CC2 is formed on the upper surface of the portion PR2 of the sensing electrode TDL extending in the Y axis direction formed in the region AR2. Therefore, the concave/convex pattern UE1 is formed on the upper surface of the portion PR2 and the protective film 33 is terminated on the concave/convex pattern UE1 as illustrated in FIG. 23. In other words, the end portion EP1 of the protective film 33 on the region AR3 side is positioned on the concave/convex pattern UE1.

In this manner, the concave portion CC2 can increase the length of the step portion included in the concave/convex pattern UE1. Consequently, it is possible to prevent or suppress the coating liquid for forming a protective film applied on the region AR2 from spreading toward the region AR3 side, and the position of the end portion of the coating liquid applied on the region AR2 can be highly accurately adjusted.

Note that a concave portion reaching a middle point in the thickness direction of the portion PR2 may be formed as the concave portion CC2, and a concave portion penetrating through the portion PR2 to reach the surface of the second substrate 31 may be formed.

Preferably, the concave/convex pattern UE1 includes a plurality of concave portions CC2. The plurality of concave portions CC2 are each formed on the upper surface of the portion PR2 of the sensing electrode TDL extending in the Y axis direction formed in the region AR2. Also, the plurality of concave portions CC2 are disposed in a staggered configuration in the X axis direction. In other words, the plurality of concave portions CC2 form concave portion groups CCG2 arrayed in the X axis direction, and the plurality of these concave portion groups CCG2 are arrayed in a direction intersecting both of the X axis direction and the Y axis direction. That is, the plurality of concave portion groups CCG2 are arrayed between two concave portion groups CCG2 adjacent to each other in the Y axis direction so that the positions of the concave portions CC2 in the X axis direction are different from each other.

With this, the coating liquid spreading toward a region AR3 side in the Y axis direction through a portion of the upper surface of the portion PR2 between two concave portions CC2 adjacent to each other in the X axis direction included in the concave portion group CCG2 is stopped by a concave portion CC2 included in a concave portion group CCG2 positioned closer to the region AR3 side than the concave portion group CCG2 in the Y axis direction. Consequently, it is possible to easily prevent or suppress the coating liquid for forming a protective film applied on the region AR2 from spreading toward the region AR3 side, and the position of the end portion of the coating liquid applied on the region AR2 can be easily highly accurately adjusted. Also, as compared with the case in which the plurality of concave portions CC2 each continuously extend in the X axis direction, a current tends to flow in the Y axis direction through the portion between two concave portions CC2 adjacent to each other in the X axis direction.

Note that, as illustrated in FIG. 23, in the fifth modification example, the plurality of concave portions CC2 each have a rectangular shape when seen in a plan view. On the other hand, as illustrated in FIG. 24, in the sixth modification example, the plurality of concave portions CC2 each have a circular shape when seen in a plan view. However, the length of the portion of the step portion included in the concave/convex pattern UE1 extending in the X axis direction is larger in the fifth modification example illustrated in FIG. 23 than the sixth modification example illustrated in FIG. 24. The length of the portion of the step portion included in the concave/convex pattern UE1 extending in the X axis direction is preferably large in view of preventing or suppressing the coating liquid for forming a protective film applied on the region AR2 from spreading toward the region AR3 side, that is, in the Y axis direction. Therefore, the effect of preventing or suppressing the coating liquid applied on the region AR2 from spreading toward the region AR3 side is larger in the fifth modification example illustrated in FIG. 23 than the sixth modification example illustrated in FIG. 24.

Note that the shape of each of the plurality of concave portions CC2 when seen in a plan view may be a circular shape and may be any of various shapes such as an oval shape or a polygonal shape.

Also, as illustrated as the concave portion CC21 in a part of FIG. 23, the plurality of concave portions CC2 may only each continuously extend in the X axis direction and be arrayed in the Y axis direction when seen in a plan view. However, the effect of enhancing the performance of the electrode substrate is larger in view of the fact that the current tends to flow along the Y axis direction when the plurality of concave portions CC2 are disposed in the X axis direction in a staggered configuration.

Seventh Modification Example of Concave/Convex Pattern

Figure 25:
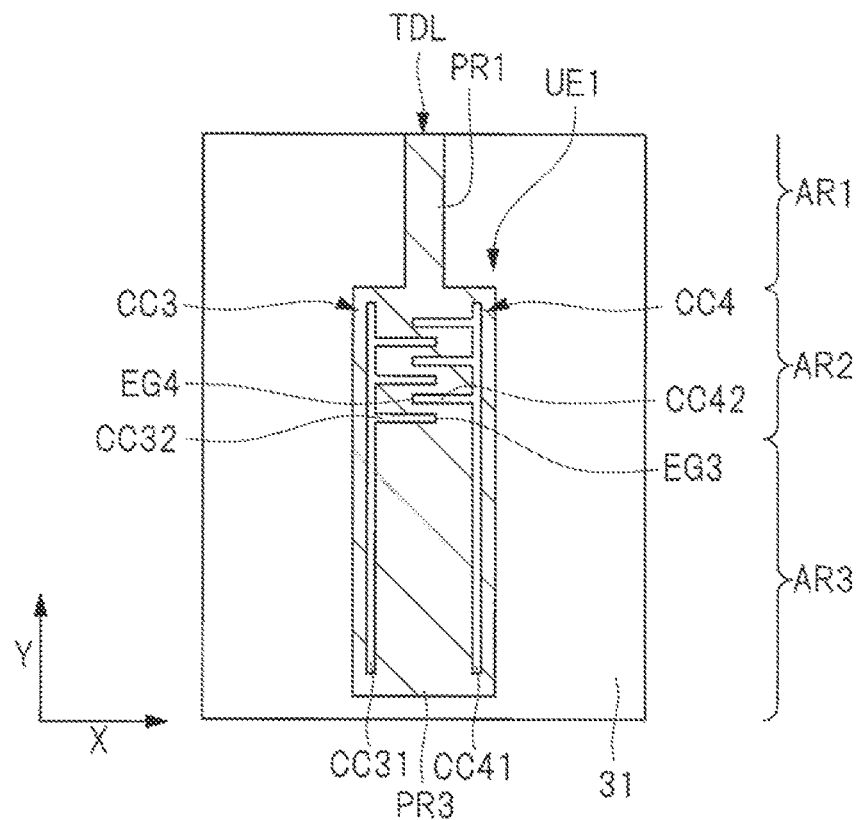
FIG. 25 is a cross-sectional view illustrating a seventh modification example of the concave/convex patterns of the electrode substrate according to the first embodiment.
Figure 29:
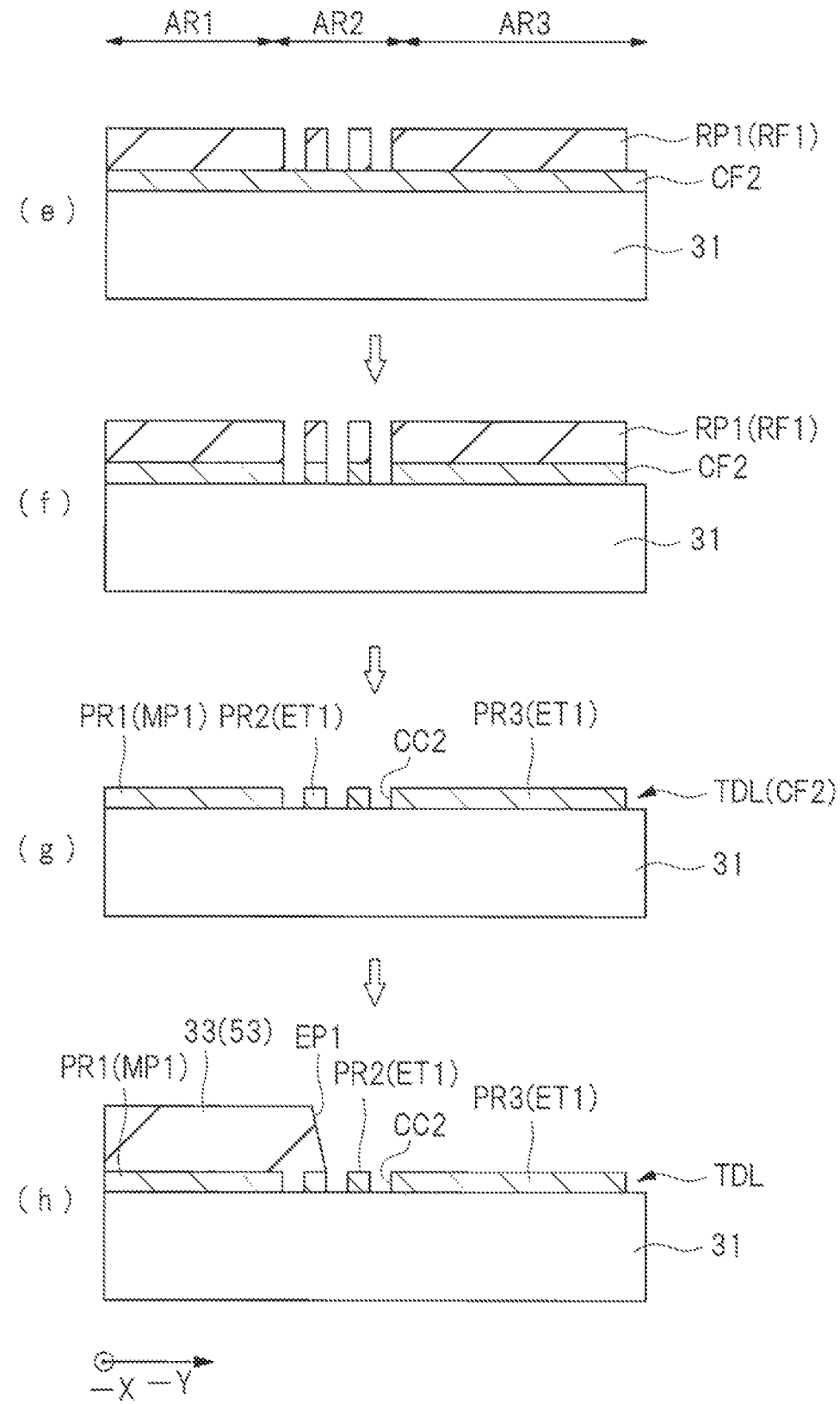
FIG. 29 is a cross-sectional view illustrating the electrode substrate according to the first embodiment during the manufacturing process thereof.

FIG. 25 is a plan view illustrating a seventh modification example of the concave/convex pattern in the electrode substrate of the first embodiment.

As illustrated in FIG. 25, in the seventh modification example, the concave/convex pattern UE1 includes a concave portion CC3 and a concave portion CC4. The concave portion CC3 and the concave portion CC4 are formed on the upper surface of the portion PR2 of the sensing electrode TDL formed in the region AR2. Therefore, the concave/convex pattern UE1 is formed on the upper surface of the portion PR2 and the protective film 33 is terminated on the concave/convex pattern UE1 as illustrated in FIG. 23. In other words, the end portion EP1 of the protective film 33 on a region AR3 side is positioned on the concave/convex pattern UE1.

Note that, as the concave portion CC3 and the concave portion CC4, a concave portion reaching a middle point in the thickness direction of the portion PR2 may be formed, and a concave portion penetrating through the portion PR2 to reach the surface of the second substrate 31 may be formed.

The concave portion CC3 includes an extending portion CC31 and a plurality of extending portions CC32. The extending portion CC31 is a concave portion formed on the upper surface of the portion PR2 on one side (left side in FIG. 25) in the X axis direction and extending in the Y axis direction. The plurality of extending portions CC32 are concave portions each extending in the X axis direction and arrayed in the Y axis direction. The plurality of extending portions CC32 are disposed on the other side (right side in FIG. 25) of the extending portion CC31 in the X axis direction, and an end portion of each of the plurality of extending portions CC32 on one side (left side in FIG. 25) in the X axis direction is connected to the extending portion CC31.

The concave portion CC4 includes an extending portion CC41 and a plurality of extending portions CC42. The extending portion CC41 is a concave portion formed on the upper surface of the portion PR2 on the other side (right side in FIG. 25) in the X axis direction and extending in the Y axis direction. The plurality of extending portions CC42 are concave portions each extending in the X axis direction and arrayed in the Y axis direction. The plurality of extending portions CC42 are disposed on one side (left side in FIG. 25) of the extending portion CC41 in the X axis direction, and an end portion of each of the plurality of extending portions CC42 on the other side (right side in FIG. 25) in the X axis direction is connected to the extending portion CC41.

The extending portions CC32 and the extending portions CC42 are alternately disposed along the Y axis direction. Also, an end portion EG3 of each of the extending portions CC32 on the other side (right side in FIG. 25) in the X axis direction is disposed closer to the other side (right side in FIG. 25) in the X axis direction than an end portion EG4 of each of the extending portions CC42 on one side (left side in FIG. 25) in the X axis direction.

The plurality of extending portions CC32 and the plurality of extending portions CC42 can increase the length of the step portion included in the concave/convex pattern UE1. Consequently, it is possible to prevent or suppress the coating liquid applied on the region AR2 from spreading toward the region AR3 side.

On the other hand, the extending portions CC31 and CC41 can prevent or suppress the coating liquid applied onto a portion of the second substrate 31 positioned on the periphery of the sensing electrode TDL in the region AR2 from overriding the portion PR2 of the sensing electrode TDL.

As illustrated in FIG. 25, note that the extending portions CC31 and CC41 may be formed from the region AR2 over the region AR3. That is, the extending portions CC31 and CC41 may be formed from the upper surface of the portion PR2 of the sensing electrode TDL formed in the region AR2 over the upper surface of the portion PR3 of the sensing electrode TDL formed in the region AR3.

Eighth Modification Example of Concave/Convex Pattern

FIG. 26 is a plan view illustrating an eighth modification example of the concave/convex pattern in the electrode substrate of the first embodiment. Note that FIG. 26 illustrates the end portion of the protective film 33 represented by a dashed-two dotted line.

In the example illustrated in FIG. 26, the concave/convex pattern UE1 includes a convex portion CV2. The convex portion CV2 is a portion of the region AR2 positioned on the periphery of the sensing electrode TDL extending in the Y axis direction when seen in a plan view, and is formed on the second substrate 31 away from the sensing electrode TDL. In other words, the convex portion CV2 is a portion of the region AR2 positioned between two sensing electrodes TDL adjacent to each other, and is formed on the second substrate 31 away from both of these two sensing electrodes TDL. Therefore, the concave/convex pattern UE1 is formed on the second substrate 31 in a portion of the region AR2 positioned on the periphery of the sensing electrode TDL. As illustrated in FIG. 26, the protective film 33 is terminated on the concave/convex pattern UE1 and on the portion PR2 of the sensing electrode TDL formed in the region AR2. In other words, the end EP1 of the protective film 33 on a region AR3 side is positioned on the concave/convex pattern UE1 and on the portion PR2.

In this manner, the convex portion CV2 can increase the length of the step portion included in the concave/convex pattern UE1. Consequently, it is possible to prevent or suppress the coating liquid for forming a protective film applied on the region AR2 from spreading toward the region AR3 side, and the position of the end portion of the coating liquid applied on the region AR2 can be highly accurately adjusted.

Preferably, the concave/convex pattern UE1 includes a plurality of convex portions CV2. Each of the plurality of convex portions CV2 is a portion of the region AR2 positioned on the periphery of the sensing electrode TDL extending in the Y axis direction when seen in a plan view, and is formed on the second substrate 31 away from the sensing electrode TDL. Also, the plurality of concave portions CV2 are disposed in a staggered configuration in the X axis direction. In other words, the plurality of convex portions CV2 form convex portion groups CVG2 arrayed in the X axis direction when seen in a plan view, and the plurality of convex portion groups CVG2 are arrayed in a direction intersecting both of the X axis direction and the Y axis direction. That is, the plurality of convex portion groups CVG2 are arrayed between two convex portion groups CVG2 adjacent to each other in the Y axis direction so that the positions of the convex portions CV2 in the X axis direction are different from each other.

With this, the coating liquid spreading toward a region AR3 side in the Y axis direction through a portion of the upper surface of the second substrate 31 included in the convex portion group CVG2 and between two convex portions CV2 adjacent to each other in the X axis direction is stopped by a convex portion CV2 included in the convex portion group CVG2 positioned closer to the region AR3 side than the convex portion group CVG2 in the Y axis direction. Consequently, it is possible to easily prevent or suppress the coating liquid for forming a protective film applied on the region AR2 from spreading toward the region AR3 side, and the position of the end portion of the coating liquid applied on the region AR2 can be easily highly accurately adjusted. Also, two sensing electrodes TDL adjacent to each other are more difficult to be short-circuited via the convex portion CV2 than those in the case in which the plurality of convex portions CV2 each continuously extend in the X axis direction.

Preferably, in order to prevent two sensing electrodes TDL adjacent to each other from being short-circuited, the convex portion CV2 is made of such a low-conductive material that a current does not flow through the convex portion CV2. Alternatively, in order to prevent two sensing electrodes TDL adjacent to each other from being short-circuited, preferably, a minimum distance between the convex portions CV2 or a minimum distance between the sensing electrode TDL and the convex portion CV2 is three times as large as the average particle diameter of the conductive particles contained in the anisotropic conductive film CF1 or larger (see FIG. 12 and FIG. 13).

As illustrated as a convex portion CV21 in a part of FIG. 26, note that the plurality of convex portions CV2 may only each continuously extend in the X axis direction and be arrayed in the Y axis direction when seen in a plan view. However, the effect of enhancing the performance of the electrode substrate is large in view of the fact that two sensing electrodes TDL adjacent to each other are difficult to be short-circuited when the plurality of convex portions CV2 are disposed in the X axis direction in a staggered configuration.

Also, a plurality of types of various concave/convex patterns of the first embodiment and the first modification example to the eighth modification example described above can be used in combination. With this, the effects caused by the various combined concave/convex patterns overlap with each other, and therefore, it is possible to further easily prevent or suppress the coating liquid for forming a protective film applied on the region AR2 from spreading toward the region AR3 side.

Ninth Modification Example of Concave/Convex Pattern

FIG. 27 is a plan view illustrating a ninth modification example of the concave/convex pattern in the electrode substrate of the first embodiment.

As illustrated in FIG. 27, also in the ninth modification example, the concave/convex pattern UE1 includes a plurality of convex portions CV3 as similar to the eighth modification example illustrated in FIG. 26. The plurality of convex portions CV3 are portions of the region AR2 positioned on the periphery of the sensing electrode TDL extending in the Y axis direction when seen in a plan view, and are formed on the second substrate 31 away from the sensing electrode TDL.

On the other hand, in the ninth modification example illustrated in FIG. 27, the plurality of convex portions CV3 each extend in the Y axis direction and are arrayed in the X axis direction when seen in a plan view as different from the eighth modification example illustrated in FIG. 26.

The coating liquid for forming a protective film includes the one having extremely low fluidity. In such a case, there is a risk that the coating liquid applied onto the second substrate 31 so as to cover the sensing electrode TDL in the regions AR1 and AR2 does not spread to a desired position in the Y axis direction so that the end portion of the protective film 33 is positioned closer to the region AR1 side than the desired position in the Y axis direction in the region AR2. Consequently, in the region AR2, there is a risk that a portion of the sensing electrode TDL more than necessary is exposed from the protective film 33.

On the other hand, in the ninth modification example illustrated in FIG. 27, the concave/convex pattern UE1 formed of a plurality of convex portions CV3 each extending in the Y axis direction and arrayed in the X axis direction is formed in the region AR2 between two sensing electrodes TDL adjacent to each other in the X axis direction. With this, the fluidity of the coating liquid in the Y axis direction can be increased more than that in the case without the formation of the concave/convex pattern UE1. Consequently, the coating liquid applied onto the second substrate 31 so as to cover the sensing electrode TDL in the regions AR1 and AR2 is easy to spread to the desired position in the Y axis direction, and therefore, the position of the end portion of the coating liquid applied on the region AR2 can be highly accurately adjusted.

Preferably, in order to prevent the two adjacent sensing electrodes TDL from being short-circuited, the convex portion CV3 is formed of such a low-conductive material that a current does not flow through the convex portion CV3. Alternatively, in order to prevent the two adjacent sensing electrodes TDL from being short-circuited, preferably, a minimum distance between the convex portions CV3 or a minimum distance between the sensing electrode TDL and the convex portion CV3 is three times as large as the average particle diameter of the conductive particles contained in the anisotropic conductive film CF1 (see FIG. 12 and FIG. 13) or larger.

As illustrated as the convex portions CV31 in a part of FIG. 27, note that the plurality of convex portions CV3 may not be continuously formed in the Y axis direction when seen in a plan view, and may be divided into, for example, two along the Y axis direction.

Also, in FIG. 16, FIG. 19, FIG. 20, FIG. 22, FIG. 23, and FIG. 25 to FIG. 27, the case of the concave/convex pattern UE1 having the rectangular shape when seen in a plan view has been exemplarily described. However, in the first embodiment and each modification example of the first embodiment described by using FIG. 16, FIG. 19, FIG. 20, FIG. 22, FIG. 23, and FIG. 25 to FIG. 27, the concave/convex pattern UE1 may have some or all of sides curved.

<Method for Manufacturing Electrode Substrate>

Next, a method for manufacturing an electrode substrate is described with reference to FIG. 28 to FIG. 32.

Figure 30:
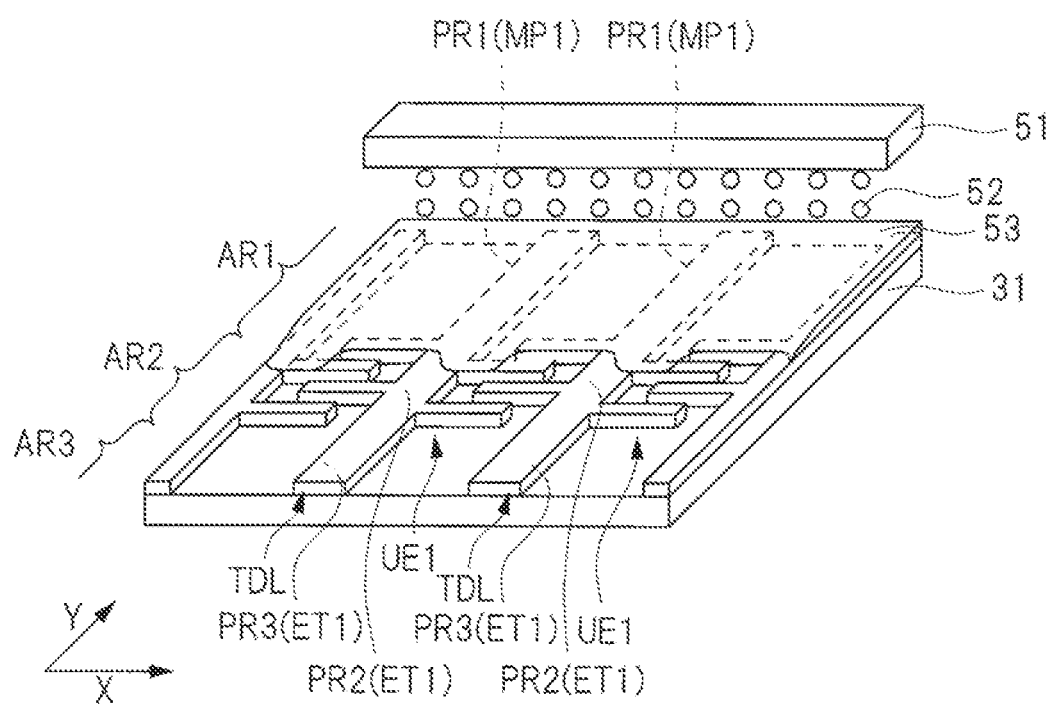
FIG. 30 is a perspective view illustrating the electrode substrate according to the first embodiment during the manufacturing process thereof.
Figure 32:
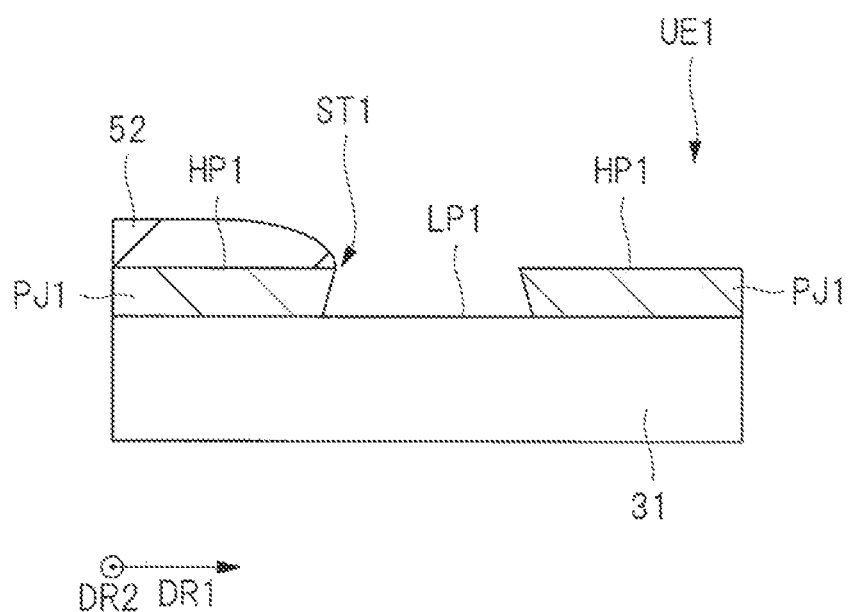
FIG. 32 is a cross-sectional view illustrating the electrode substrate according to the first embodiment during the manufacturing process thereof.

FIG. 28, FIG. 29, FIG. 31, and FIG. 32 are cross-sectional views in a manufacturing process of the electrode substrate according to the first embodiment. FIG. 30 is a perspective view in the manufacturing process of the electrode substrate according to the first embodiment. In FIG. 31 and FIG. 32, the periphery of a step portion included in the concave/convex pattern is illustrated so as to be enlarged.

First, as illustrated in FIG. 28A, the second substrate 31 is prepared. The second substrate 31 has regions AR1, AR2, and AR3 serving as regions on an upper surface as a main surface of the second substrate 31. The regions AR1, AR2, and AR3 are sequentially disposed in the Y axis direction when seen in a plan view.

Note that various substrates such as a transparent glass substrate or a film made of, for example, resin can be used as the second substrate 31 as described above.

Next, as illustrated in FIGS. 28B and 29G, the sensing electrode TDL is formed. In this step of forming the sensing electrode TDL, first, a conductive film CF2 is deposited on the second substrate 31 as illustrated in FIG. 28B. In this step of depositing the conductive film CF2, for example, a conductive film formed of a metal film can be deposited by sputtering or chemical vapor deposition (CVD). Preferably, as the conductive film CF2, a conductive film including a metal layer or an alloy layer made of one or more metals selected from a group including aluminum (Al), copper (Cu), silver (Ag), molybdenum (Mo), chrome (Cr), and tungsten (W) can be deposited, the conductive film being formed of a single- or multi-layered film.

Note that, after performing the step of forming a conductive film and before performing a patterning step described later, in order to make wettability of the coating liquid to be applied by the ink jet method or the electric field jet method uniform, a surface processing can be performed to the substrate on which the conductive film has been formed. As such a surface processing, a surface processing by UV light, a surface processing by atmospheric pressure (AP) plasma, or a surface processing by hexamethyldisiloxane (HMDS) can be performed.

Next, the conductive film CF2 is patterned. In the step of patterning this conductive film CF2, the conductive film CF2 can be patterned by using, for example, photolithography and etching techniques. Note that the following is the explanation for the exemplary case of the formation of the concave/convex pattern UE1 including the concave portions CC2 of the sixth modification example of the first embodiment illustrated in FIG. 24, the case being in the formation of the concave/convex pattern UE1 including the concave portions CC2 by using the same step as the step of forming the sensing electrode TDL. Also, the following is the explanation for the exemplary case in which the concave portions CC2 penetrate through the conductive film CF2 to reach the surface of the second substrate 31.

Specifically, firstly, as illustrated in FIG. 28C, a resist film RF1 is applied onto the conductive film CF2. Next, as illustrated in FIG. 28D, the resist film RF1 is patterned and exposed by exposure light EL1 by using a photomask having a light-shielding pattern SP1 formed in a region where, for example, the sensing electrode TDL is to be formed other than the region where the concave portions CC2 are to be formed. Note that FIG. 28D illustrates only the light-shielding pattern SP1 of the photomask.

Next, as illustrated in FIG. 29E, the patterned and exposed resist film RF1 is developed so as to form a resist pattern RP1 formed of the resist film RF1 left in the region where the sensing electrode TDL is to be formed other than the region where the concave portions CC2 are to be formed. Next, as illustrated in FIG. 29F, the conductive film CF2 is etched by using the resist pattern RP1 as an etching mask. Then, as illustrated in FIG. 29G, for example, ashing is performed, so that the resist pattern RP1 is removed. With this, the sensing electrode TDL formed of the conductive film CF2 and the concave portions CC2 provided in the upper surface of the sensing electrode TDL are formed.

The sensing electrode TDL is continuously formed on the second substrate 31 from the region AR1 of the upper surface of the second substrate 31 via the region AR2 of the upper surface of the second substrate 31 over the region AR3 of the upper surface of the second substrate 31. Preferably, the sensing electrode TDL extends in the Y axis direction when seen in a plan view.

A portion of the sensing electrode TDL formed in the region AR1 is regarded as a portion PR1. The portion PR1 is the main body portion MP1 of the sensing electrode TDL (see FIG. 12). Also, a portion of the sensing electrode TDL formed in the region AR2 is regarded as a portion PR2. On the upper surface of the portion PR2 of the sensing electrode TDL formed in the region AR2, the concave portions CC2 are formed. Furthermore, a portion of the sensing electrode TDL formed in the region AR3 is regarded as a portion PR3. The portion PR3 is the electrode terminal ET1 electrically connected to the wiring substrate (see FIG. 12). Note that the portion PR2 is also included in a part of the electrode terminal ET1 in the example illustrated in FIG. 29G.

Also, in the example illustrated in FIG. 28B to FIG. 29G, the concave/convex pattern UE1 including the concave portions CC2 illustrated in FIG. 24 is formed by the same step as the step of forming the sensing electrode TDL. Alternatively, in place of the concave/convex pattern illustrated in FIG. 24, the concave/convex pattern UE1 illustrated in any of FIG. 16, FIG. 19 to FIG. 23, and FIG. 25 to FIG. 27 can be formed. In this step of forming the concave/convex pattern UE1, the concave/convex pattern UE1 is formed on the surface of the portion PR2 of the sensing electrode TDL formed in the region AR2, or the concave/convex pattern UE1 is formed on the second substrate 31 in a portion of the region AR2 positioned on the periphery of the sensing electrode TDL. In other words, the concave/convex pattern UE1 is formed on the sensing electrode TDL or the second substrate 31 in the region AR2.

Here, as the concave/convex pattern UE1, a concave/convex pattern UE1 formed of a conductive film formed on the same layer as the conductive film CV2 included in the sensing electrode TDL is formed. Also, by forming the concave/convex pattern UE1 in the same step as the step of forming the sensing electrode TDL, the number of manufacturing processes can be reduced. Note that the concave/convex pattern UE1 illustrated in any of FIG. 16 and FIG. 19 to FIG. 27 can also be formed by patterning the conductive film CF2 by performing not the same step as the step of forming the sensing electrode TDL but a step similar to the step of forming the sensing electrode TDL.

Furthermore, as the example illustrated in FIG. 28B to FIG. 29G, the formation of the concave/convex pattern UE1 formed of the conductive film on the same layer as the conductive film included in the sensing electrode TDL as the concave/convex pattern UE1 is exemplified. However, a concave/convex pattern UE1 formed of a film of a type different from that of the conductive film included in the sensing electrode TDL can be formed.

Next, as illustrated in FIG. 29H, the protective film 33 is formed. In this step of forming the protective film 33, coating liquid for forming a protective film is first applied. In this step of applying the coating liquid, the coating liquid is applied by a coating method. Preferably, the coating liquid is applied by a printing method of partially applying the coating liquid containing a solvent. In other words, the protective film 33 is formed by a printing mode of partially applying a solution. That is, as a method of forming the protective film 33, any of printing methods of partially forming a film with a solvent can be applied in general. As such a printing method, various printing methods such as an ink jet method, an electric field jet method, screen printing, flexographic printing, offset printing, or gravure printing can be used. Also, the following is the explanation for the exemplary case of the application of the coating liquid for forming a protective film by the ink jet method or the electric field jet method.

As the protective film 33, for example, a resin film formed of a UV setting resin or a thermosetting resin made of acryl resin, epoxy resin, polyimide resin, or others can be formed. Therefore, as the coating liquid for forming a protective film, coating liquid containing the above-described UV setting resin or thermosetting resin can be used.

When the coating liquid is applied by the ink jet method or the electric field jet method, as illustrated in FIG. 30, the coating liquid 52 is discharged from a nozzle provided to a nozzle head 51 as the nozzle head 51 provided so as to be relatively removable with respect to the second substrate 31 is relatively moved with respect to the second substrate 31. With this, the coating liquid 52 is applied in the regions AR1 and AR2 so as to cover the sensing electrode TDL.

Also, as illustrated in FIG. 30, the coating liquid 52 is discharged simultaneously from the plurality of nozzles by using the nozzle head 51 having a plurality of nozzles arrayed in a certain direction, so that time required for the step of applying the coating liquid 52 can be reduced.

That is, after the coating liquid 52 is applied onto the second substrate 31 by use of the ink jet method or the electric field jet method so as to cover the sensing electrode TDL to form the coating film 53, the formed coating film 53 is cured, so that a protective film with a desired pattern can be formed without increasing the number of manufacturing processes.

In addition, when the coating liquid is applied by using a printing method such as the ink jet method or the electric field jet method, it is not necessary to prepare a photomask for forming the pattern formed of the coating film that is formed by applying the coating liquid by using photolithography and etching, and thus a desired pattern can be formed each time. Further, when the coating liquid is applied by using the printing method such as the ink jet method or the electric field jet method, the coating liquid can be efficiently used, and thus the manufacturing cost can be reduced. Moreover, when the printing method such as the ink jet method or the electric field jet method is used, the film can be deposited under the atmospheric pressure and it is not necessary to use the deposition apparatus provided with a vacuum chamber, and thus the deposition apparatus can be downsized.

In the first embodiment, the concave/convex pattern UE1 is formed on the surface of the portion PR2 of the sensing electrode TDL formed in the region AR2 or the concave/convex pattern UE1 is formed on the second substrate 31 in a portion of the region AR2 positioned on the periphery of the sensing electrode TDL. In other words, the concave/convex pattern UE1 is formed on the sensing electrode TDL or the second substrate 31 in the region AR2. With this, the length of the step portion formed in the region AR2 can be increased. Consequently, it is possible to prevent or suppress the coating liquid for forming a protective film applied on the region AR2 from spreading toward the region AR3 side, and the position of the end portion of the coating liquid applied on the region AR2 can be easily highly accurately adjusted.

The case in which a step portion ST1 included in the concave/convex pattern UE1 and formed of a high-level portion HP1 and a low-level portion LP1 formed of, for example, a projecting portion PJ1 extends in a direction DR2 intersecting a direction DR1 in which the coating liquid 52 spreads as illustrated in FIG. 31 is assumed. In such a case, a coating liquid 52 spreading in the direction DR1 on the high-level portion HP1 stops at, for example, the peripheral edge of the high-level portion HP1, that is, on the upper surface of the step portion ST1 and does not spread up to the low-level portion LP1. Thus, it is possible to prevent or suppress the coating liquid 52 from spreading further in the direction DR1 beyond the step portion ST1.

More specifically, in the step of applying the coating liquid 52, the coating liquid 52 is applied so that the applied coating liquid 52 is terminated on the concave/convex pattern UE1. In other words, in the step of applying the coating liquid 52, the coating liquid 52 on the region AR3 side is applied so that an end portion of the applied coating liquid 52 is positioned on the concave/convex pattern UE1.

Here, the case of the cross-sectional shape of the projecting portion PJ1 as a convex portion included in the concave/convex pattern UE1 as described by using FIG. 17 and FIG. 18 is considered. That is, the case with such a cross-sectional shape having the upper end portion RE1 of the side surface portion SS1 positioned closer to one side than the lower end portion LE1 of the side surface portion SS1 in the Y axis direction and having the upper end portion HE2 of the side surface portion SS2 positioned closer to the other side than the lower end portion LE2 of the side surface portion SS2 in the Y axis direction is considered. FIG. 32 illustrates a case having, for example, an inverted trapezoidal cross-sectional shape perpendicular to the direction DR2 in which the projecting portion PJ1 extends. Such a case enhances an effect of stopping the coating liquid 52 spreading on the high level portion HP1 in the direction DR1 at an upper side of the step portion ST1. Consequently, the position of the end portion of the coating liquid 52 can be further highly accurately adjusted.

When the projecting portion PJ1 with such a cross-sectional shape is formed, note that the conductive film CF2 having the lower layer portion LL1 (see FIG. 17) and the upper layer portion HL1 (see FIG. 17) is formed in the step of forming the conductive film CF2 described by using FIG. 28B. Here, as described by using FIG. 17, the lower layer portion LL1 and the upper layer portion HL1 are laminated so that, for example, the etching speed of the lower layer portion LL1 with respect to an etchant is higher than the etching speed of the upper layer portion HL1 with respect to that etchant. Then, in the step of etching the conductive film CF2 described by using FIG. 29F, etching is performed by using that etchant. With this, the projecting portion PJ1 can be formed so that the upper end portion HE1 of the side surface portion SS1 is positioned closer to one side (left side in FIG. 17) than the lower end portion LE1 of the side surface portion SS1 in the Y axis direction and the upper end portion HE2 of the side surface portion SS2 is positioned closer to the other side (right side in FIG. 17) than the lower end portion LE2 of the side surface portion SS2 in the Y axis direction.

Next, the protective film 33 is formed by curing the coating film 53 formed of the applied coating liquid 52. When the coating liquid containing the UV setting resin is used as the coating liquid 52, the formed coating film 53 is irradiated with light formed of UV, that is, UV light, so that the coating film 53 is cured. Alternatively, when the coating liquid containing the thermosetting resin is used as the coating liquid 52, the formed coating film 53 is thermally treated, so that the coating film 53 is cured. With this, as illustrated in FIG. 29H, the protective film 33 formed of the cured coating film 53 is formed.

Here, as described above, when the applied coating liquid 52 is terminated on the concave/convex pattern UE1, that is, the formed coating film 53 is terminated on the concave/convex pattern UE1, the protective film 33 formed of the cured coating film 53 is also terminated on the concave/convex pattern UE1. In other words, when an end portion of the coating film 53 on the region AR3 side is positioned on the concave/convex pattern UE1, the end portion EP1 of the protective film 33 on the region AR3 side is also positioned on the concave/convex pattern UE1.

Next, the wiring substrate WS1 (see FIG. 13) is electrically connected. In this step of electrically connecting the wiring substrate WS1, the wiring substrate WS1 is disposed on the second substrate 31 via the anisotropic conductive film (ACF) CF1 (see FIG. 13). On the lower surface of the wiring substrate WS1 as a main surface thereof, a plurality of electrode terminals ET2 (see FIG. 13) are formed. The plurality of electrode terminals ET2 (see FIG. 13) are disposed so as to correspond to the electrode terminals ET1 of the plurality of sensing electrodes TDL, respectively. As described above, a flexible printed wiring board also referred to as flexible printed circuit (FPC) can be used as the wiring substrate WS1.

The anisotropic conductive film CF1 is disposed in the regions AR2 and AR3 so as to cover the sensing electrode TDL. Also, the wiring substrate WS1 is disposed on the second substrate 31 via the anisotropic conductive film CF1 so that the plurality of electrode terminals ET2 are opposed to the electrode terminals ET1 via the anisotropic conductive film CF1, respectively.

The anisotropic conductive film CF1 is a film formed by shaping a mixture of a thermosetting resin with conductive fine metal particles into a film. In a state in which the anisotropic conductive film CF1 is interposed between the electrode terminals ET1 of the sensing electrode TDL and the electrode terminals ET2 of the wiring substrate WS1, the wiring substrate WS1 is pressed onto the second substrate 31 by, for example, a heat treatment. With this, the metal particles in the anisotropic conductive film CF1 contact each other in a thickness direction of the anisotropic conductive film CF1 to form a conductive path in the thickness direction of the anisotropic conductive film CF1. The electrode terminals ET1 and the electrode terminals ET2 opposed to each other are electrically connected to each other via the anisotropic conductive film CF1.

<Regarding Position Adjustment of End Portion of Protective Film>

Next, position adjustment of the end portion of the protective film is described while comparing with position adjustment of the end portion of the protective film in a comparative example.

Figure 33:
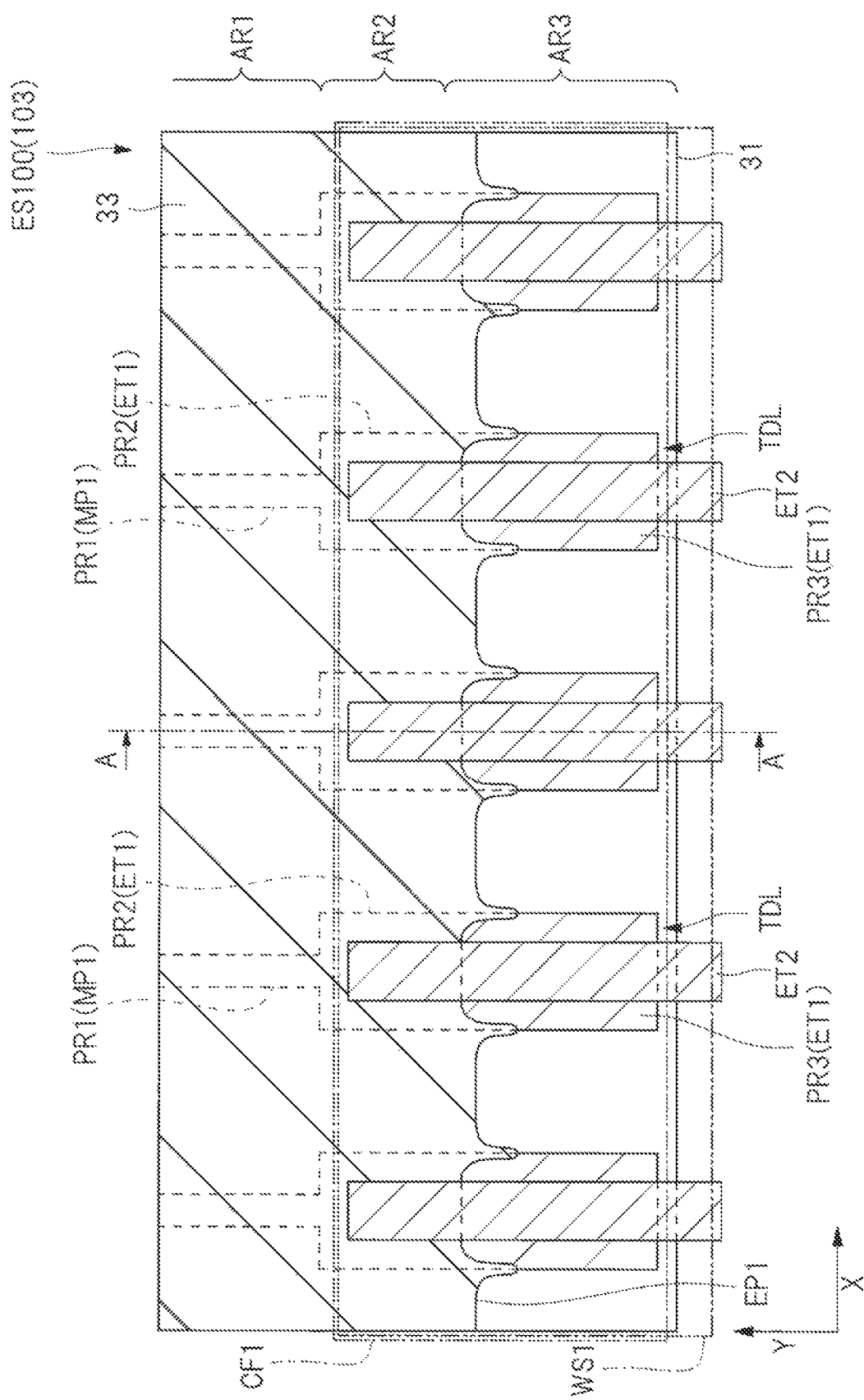
FIG. 33 is a plan view illustrating an electrode substrate according to a comparative example.
Figure 34:
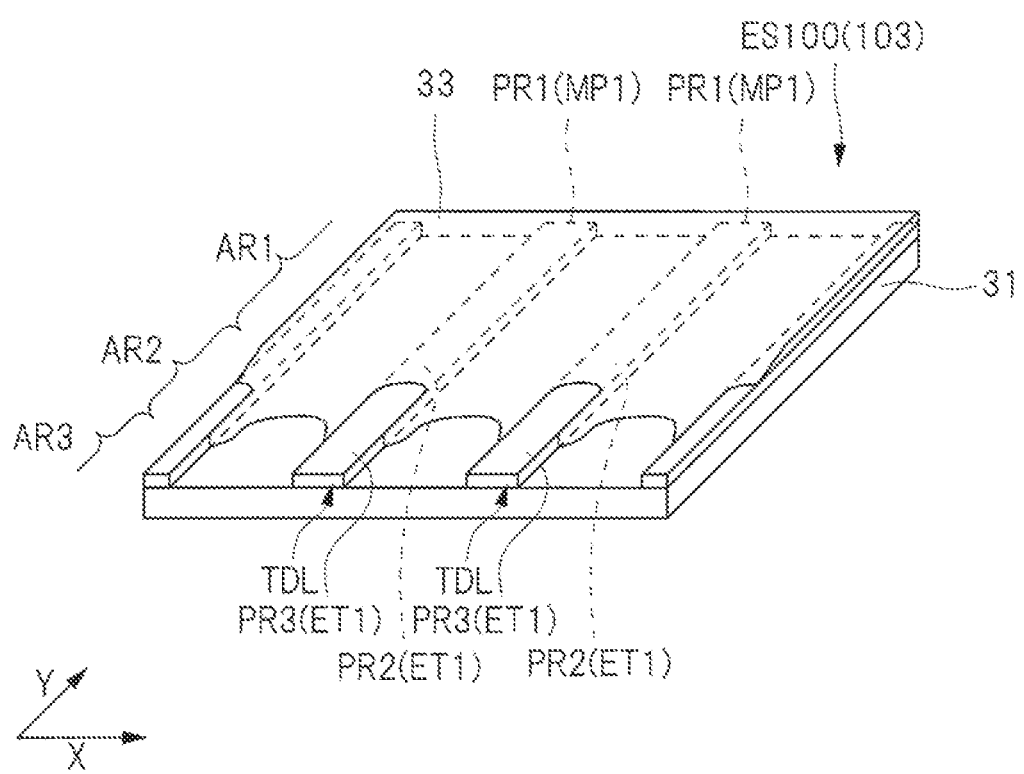
FIG. 34 is a perspective view illustrating the electrode substrate according to the comparative example.
Figure 35:
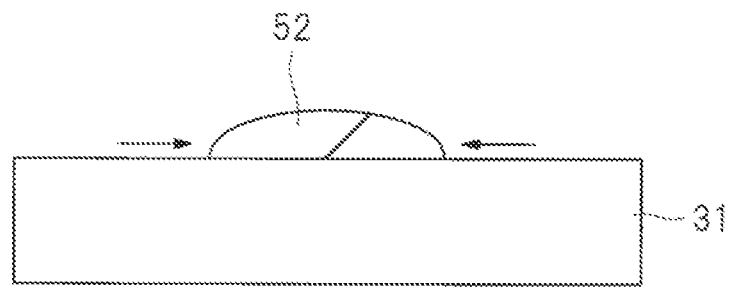
FIG. 35 is a cross-sectional view schematically illustrating a shape of the applied liquid on the glass substrate.
Figure 36:
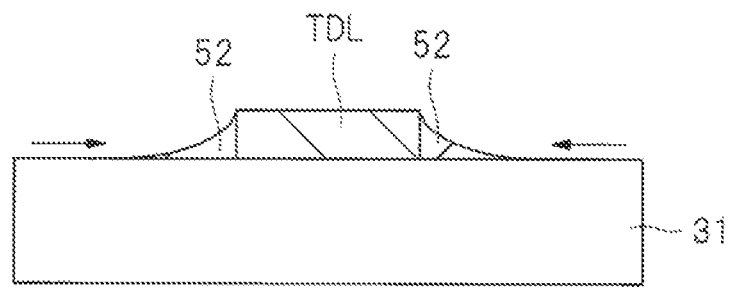
FIG. 36 is a cross-sectional view schematically illustrating a shape of the applied liquid in periphery of the sensing electrode formed on the glass substrate.

FIG. 33 is a plan view illustrating an electrode substrate according to the comparative example. FIG. 34 is a perspective view illustrating the electrode substrate of the comparative example. FIG. 35 is a cross-sectional view schematically illustrating the shape of the coating liquid on a glass substrate. FIG. 36 is a cross-sectional view schematically illustrating the shape of the coating liquid on the periphery of a sensing electrode formed on the glass substrate.

In the comparative example, an electrode substrate ES100 serving as an opposing substrate 103 includes the second substrate 31, the sensing electrode TDL, and the protective film 33. Also, the second substrate 31 has regions AR1, AR2, and AR3 serving as regions on an upper surface as a main surface of the second substrate 31. The areas AR1, AR2, and AR3 are sequentially disposed in the Y axis direction when seen in a plan view.

Also in the comparative example, the sensing electrode TDL is sequentially formed on the second substrate 31 from the region AR1 of the upper surface of the second substrate 31 via the region AR2 of the upper surface of the second substrate 31 over the region AR3 of the upper surface of the second substrate 31. Alternatively, the sensing electrode TDL extends in the Y axis direction when seen in a plan view.

Also in the comparative example, a portion of the sensing electrode TDL formed in the region AR1 is regarded as a portion PR1. The portion PR1 is a main body MP1 of the sensing electrode TDL. Also, a portion of the sensing electrode TDL formed in the region AR2 is regarded as a portion PR2. Furthermore, a portion of the sensing electrode TDL formed in the region AR3 is regarded as a portion PR3. The portion PR3 and the portion PR2 are the electrode terminal ET1 electrically connected to the electrode terminal ET2 formed on the wiring substrate WS1.

The protective film 33 is formed so as to cover the sensing electrode TDL in the regions AR1 and AR2. Also in the comparative example, the protective film 33 is formed on the second substrate 31 by applying the coating liquid by the ink jet method or the electric field jet method.

On the other hand, in the comparative example, the concave/convex pattern is not formed on the surface of the portion PR2 of the sensing electrode TDL formed in the region AR2. Also, the concave/convex pattern is not formed on the second substrate 31 in a portion of the region AR2 positioned on the periphery of the sensing electrode TDL, either.

However, when the coating liquid is applied onto the second substrate 31 by the ink jet method or the electric field jet method, it is difficult to highly accurately adjust the position of the end portion of the coating liquid spreading on the second substrate 31.

For example, in the case in which the coating liquid is applied by the ink jet method or the electric field jet method onto a surface of the second substrate 31 and the surface of the second substrate 31 is lyophilic to the coating liquid to some extent, the coating liquid applied to the surface of the second substrate 31 easily spreads and thus it is difficult to highly accurately adjust the position of the end portion of the coating liquid. The spreadability of the coating liquid applied on the second substrate 31 is varied depending on the surface tension acting on the coating liquid.

For example, the interfacial tension exists as the force acting on an interface between the liquid phase and the gas phase or between the liquid phase and the solid phase. For example, the reason why a droplet dropped onto a surface of a flat substrate remains in a hemisphere state is that water molecules in the droplet are pulled inside by the van der Waals' force to each other and interfacial tension acts so as to reduce the surface area of the droplet. In addition, when the interfacial tension acting so as to reduce the surface area as an interface is acting on a liquid, this interfacial tension is referred to also as surface tension of the liquid.

The larger the van der Waals's force of liquid is, the larger such surface tension of liquid is. Thus, the more the atomic weight or molecular weight of the materials contained in the liquid, the larger the surface tension is. Therefore, surface tension of the coating liquid applied on the second substrate 31 is varied depending on the type of the coating liquid.

On the other hand, the spreadability of the coating liquid applied on the second substrate 31 is varied depending on the shape of the surface of the second substrate 31 other than the type of the coating liquid.

For example, surface tension is uniformly applied from the periphery of the coating liquid 52 to the coating liquid 52 applied onto a portion of the second substrate 31 away from the sensing electrode TDL as illustrated in the cross-sectional view of FIG. 35. Therefore, the coating liquid 52 is relatively difficult to spread. On the other hand, surface tension is applied only from one side of the coating liquid 52 to the coating liquid 52 applied onto a portion of the second substrate 31 positioned on the periphery of the sensing electrode TDL and in contact with the side surface of the sensing electrode TDL, as illustrated in the cross-sectional view of FIG. 36. Therefore, the coating liquid 52 is easy to spread along the side surface of the sensing electrode TDL.

In this manner, when the coating liquid 52 is easy to spread along the side surface of the sensing electrode TDL, the coating liquid 52 is easy to spread also on a portion of the upper surface of the sensing electrode TDL closer to the side surface.

Consequently, the protective film 33 formed by curing the coating film formed of the applied coating liquid 52 is not terminated on the portion PR2, and is formed from the portion PR1 via the portion PR2 over the portion PR3.

That is, in the comparative example, the position of the end portion of the coating liquid 52 applied on the region AR2 cannot be highly accurately adjusted. Consequently, it is difficult to highly accurately adjust the position of the end portion EP1 of the protective film 33 formed by curing the coating film formed of the applied coating liquid 52. Therefore, there is a risk that the end portion EP1 of the formed protective film 33 exceeds a desired position or does not reach the desired position. That is, there is a risk that an area of a portion of the electrode terminal ET1 of the sensing electrode TDL exposed from the protective film 33 varies among the plurality of sensing electrodes TDL.

Also in the comparative example, as similar to the first embodiment, the portion PR3 of the sensing electrode TDL formed in the region AR3 is electrically connected to the electrode terminal ET2 formed on the wiring substrate WS1 via the anisotropic conductive film CF1. That is, a portion of the electrode terminal ET1 of the sensing electrode TDL exposed from the protective film 33 is electrically connected to the wiring substrate WS1.

Therefore, as described above, when the area of the portion of the electrode terminal ET1 of the sensing electrode TDL exposed from the protective film 33 varies among the plurality of sensing electrodes TDL, connection resistance between the sensing electrode TDL and the wiring substrate WS1 varies among the plurality of sensing electrodes TDL, and therefore, there is a risk of decrease in the performance as the electrode substrate.

For example, when the end portion EP1 of the protective film 33 exceeds the desired position, the protective film 33 is formed on the portion PR3 of the sensing electrode TDL formed in the region AR3, and the area of the portion of the electrode terminal ET1 of the sensing electrode TDL exposed from the protective film 33 is decreased. In this case, connection resistance between the sensing electrode TDL and the wiring substrate WS1 is increased, and therefore, there is a risk of decrease in the performance as the electrode substrate.

On the other hand, when the coating liquid is difficult to flow depending on the type of the coating liquid, there is a risk that the end portion EP1 of the protective film 33 does not reach the desired position of the portion PR2 of the sensing electrode TDL formed in the region AR2. In this case, the portion PR2 of the sensing electrode TDL formed in the region AR2 is partially exposed from both of the wiring substrate WS1 and the protective film 33, and therefore, for example, moisture in the air enters the exposed portion of the sensing electrode TDL, and therefore, there is a risk of corrosion of the sensing electrode TDL.

In the techniques described in the Patent Documents 1 to 3, a lyophilic region and a repellant region need to be formed on a surface of a substrate in order to adjust spreading of the applied coating liquid, so that the number of steps of the manufacturing process may be increased due to the addition of steps of forming the lyophilic region and the repellant region. In addition, since it is not easy to form the lyophilic region and the repellant region on the surface of the electrode formed on the substrate, the spreading of the coating liquid applied to the surface of the electrode formed on the substrate cannot be highly accurately adjusted.

In the technique described in the Patent Document 4, since a film to be quickly dried is applied like a frame as a stopper and a film which is dried slowly but good at leveling effect is then applied, the number of steps of the manufacturing process may be increased. In addition, since the material of the coating liquid is limited in order to obtain a desired drying rate, it cannot be widely used in practical manufacturing processes.

Note that it is difficult to adjust the position of an end portion of the applied coating liquid also in various electrode substrates on which a protective film is formed so as to partially cover the electrodes formed on a substrate by applying the coating liquid by the ink jet method or the electric field jet method with the inclusion of the first substrate 21 in which the common electrode COML.

Main Features and Effects of Present Embodiment

On the other hand, in the first embodiment, the electrode substrate ES includes the concave/convex pattern UE1. The concave/convex pattern UE1 is formed on the surface of the portion PR2 of the sensing electrode TDL formed in the region AR2, or is formed on the second substrate 31 in the portion of the region AR2 positioned on the periphery of the sensing electrode TDL. That is, the concave/convex pattern UE1 is formed on the sensing electrode TDL or the second substrate 31 in the region AR2. Also, the end portion EP1 of the protective film 33 on the region AR3 side formed so as to cover the sensing electrode TDL is positioned on the concave/convex pattern UE1.

With this, when the protective film 33 is formed so as to cover the sensing electrode TDL, the position of the end portion EP1 of the protective film 33 can be highly accurately adjusted. Therefore, it is possible to prevent or suppress the variation of the area of the portion of the electrode terminal ET1 of the sensing electrode TDL exposed from the protective film 33 among the plurality of sensing electrodes TDL. Consequently, it is possible to prevent or suppress the variation of the connection resistance between the sensing electrode TDL and the wiring substrate WS1 among the plurality of sensing electrodes TDL, so that the performance as the electrode substrate can be improved. In addition, the performance of the display device including such an electrode substrate can be improved.

For example, it is possible to prevent or suppress the protective film 33 from being formed on the portion PR3 of the sensing electrode TDL formed in the region AR3, and it is possible to prevent or suppress the area of the portion of the electrode terminal ET1 of sensing electrode TDL exposed from the protective film 33 from being decreased. Consequently, it is possible to prevent or suppress connection resistance between the sensing electrode TDL and the electrode terminal ET2 from being increased, so that the performance as the electrode substrate can be improved.

On the other hand, even if the coating liquid is difficult to flow, by the formation of the concave/convex pattern UE1, the protective film 33 can be formed so that the position of the end portion EP1 of the protective film 33 reaches the desired position of the portion PR2 of the sensing electrode TDL formed in the region AR2. Therefore, it is possible to prevent or suppress the portion PR2 of the sensing electrode TDL formed in the region AR2 from being partially exposed from both of the wiring substrate WS1 and the protective film 33, so that it is possible to prevent or suppress the sensing electrode TDL from corroding due to the entrance of, for example, the moisture in the air into the sensing electrode TDL of the exposed portion.

Also, in the first embodiment, it is not necessary to form a lyophilic region and a repellant region on the surface of the second substrate 31 in order to adjust spreading of the applied coating liquid. Thus, it is not necessary to perform a step of forming a lyophilic region and a repellant region and the number of steps of the manufacturing process can be reduced.

Further, in the first embodiment, since it is not necessary to apply a film to be quickly dried like a frame as a stopper and then apply a film which is slowly dried but good at leveling, the number of steps of the manufacturing process can be reduced. Also, the material of the coating liquid for obtaining a desired drying rate is not limited, and it can be widely used in practical manufacturing processes.

Note that, in the first embodiment, an electrode substrate used as the opposing substrate 3 in which the sensing electrode TDL is formed in a display device with an input device has been exemplified as the electrode substrate ES. However, the electrode substrate ES according to the first embodiment can be applied to various electrode substrates on which a protective film is formed so as to partially cover the electrodes formed on the substrate by applying the coating liquid by the printing method such as the ink jet method or the electric field jet method with the inclusion of the first substrate 21 in which the common electrode COML (same goes for the following respective embodiments).

Second Embodiment

In the first embodiment, an example in which a display device provided with a touch panel as an input device is applied to an in-cell liquid crystal display device with a touch sensing function in which a common electrode COML of the display device serves also as a driving electrode of the input device has been described. Meanwhile, in the second embodiment, an example in which a display device provided with a touch panel as an input device is applied to an in-cell liquid crystal display device with a touch sensing function in which a common electrode COML of the display device and a driving electrode of the input device are separately formed will be described.

Note that the display device of the second embodiment can be applied to an in-cell display device in which an input device is integrally provided for various display devices such as an organic EL display device as well as a liquid crystal display device.

<Display Device with Touch-Sensing Function>

Figure 37:
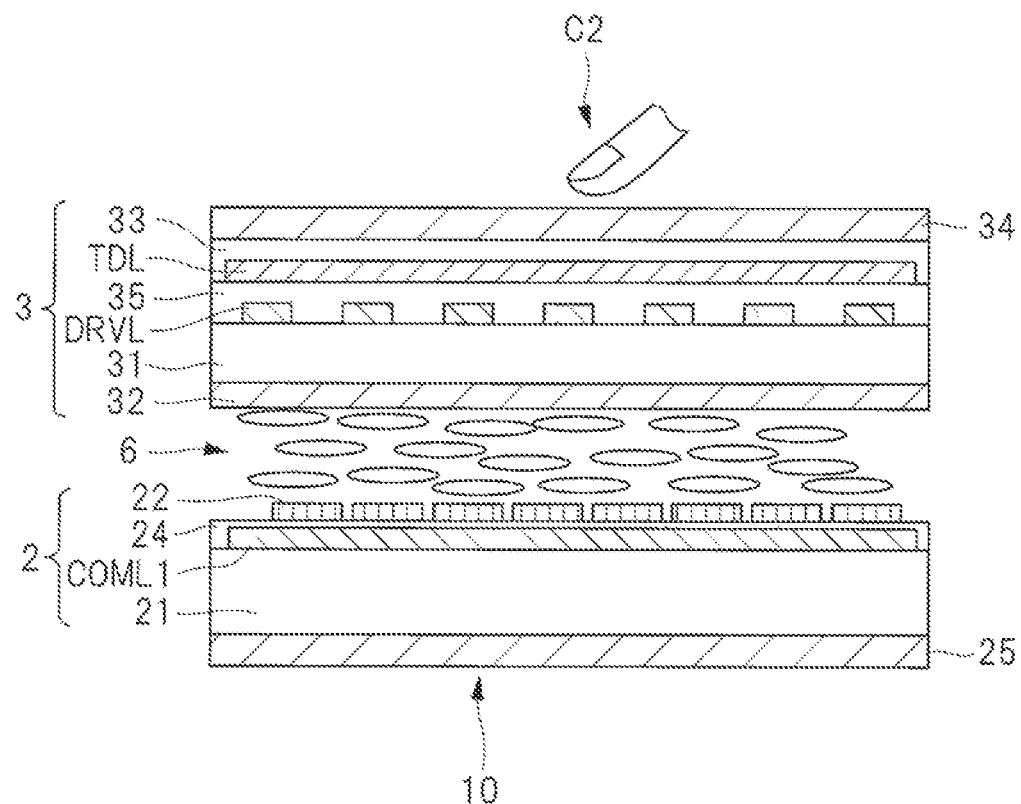
FIG. 37 is a cross-sectional view illustrating a display device with a touch sensing function in a display device according to a second embodiment.

FIG. 37 is a cross-sectional view illustrating a display device with a touch sensing function in the display device of the second embodiment.

In the display device according to the second embodiment, respective components other than the cross-sectional structure of the opposing substrate 3, for example, the shape and arrangement of the concave/convex pattern UE1 (see FIG. 12) in a plan view are similar to the respective components of the display device of the first embodiment other than the cross-sectional structure of the opposing substrate 3. Therefore, the descriptions thereof will be omitted. Accordingly, parts which differ from those described in the first embodiment with reference to FIG. 9 and FIG. 10 will be mainly described with reference to FIG. 37.

The display device 10 with a touch sensing function includes the pixel substrate 2, the opposing substrate 3 and the liquid crystal layer 6. The opposing substrate 3 is disposed so that an upper surface serving as a main surface of the pixel substrate 2 and a lower surface serving as a main surface of the opposing substrate 3 are opposed to each other. The liquid crystal layer 6 is provided between the pixel substrate 2 and the opposing substrate 3.

In the second embodiment, the pixel substrate 2 includes common electrodes COML1. The common electrodes COML1 operate as driving electrodes of the liquid crystal display device 20 (see FIG. 1), but do not operate as driving electrodes of the touch sensing device (see FIG. 1). Accordingly, unlike the first embodiment, a plurality of common electrodes need not to be provided as the common electrodes COML1, and it is also possible to provide one common electrode obtained by, for example, coupling and integrating the common electrodes COML of the first embodiment.

Since parts of the pixel substrate 2 and the liquid crystal layer 6 of the display device of the second embodiment other than the common electrodes COML1 are similar to respective parts of the pixel substrate 2 and the liquid crystal layer 6 of the display device of the first embodiment, the descriptions thereof will be omitted. Also, the circuit diagram corresponding to the plurality of pixels of the display device of the second embodiment is similar to the circuit diagram corresponding to the plurality of pixels of the display device of the first embodiment illustrated in FIG. 10 except for the point that the common electrodes COML1 are provided instead of the common electrodes COML. Therefore, the descriptions of the parts of the display device of the second embodiment which are similar to the parts described with reference to FIG. 10 in the first embodiment will be omitted.

In the second embodiment, the opposing substrate 3 includes a second substrate 31, a color filter 32, a driving electrode DRVL, an insulating film 35, a sensing electrode TDL, and a protective film 33. The second substrate 31 has an upper surface serving as a main surface and a lower surface serving as a main surface opposed to the upper surface. The color filter 32 is formed on the lower surface of the second substrate 31 serving as one main surface. The driving electrode DRVL is a driving electrode of a touch sensing device 30 and is formed on the upper surface of the second substrate 31 serving as the other main surface. The insulating film 35 is formed on the upper surface of the second substrate 31 so as to cover the driving electrode DRVL. The sensing electrode TDL is the sensing electrode of the touch sensing device 30, and is formed on the insulating film 35. More specifically, the sensing electrode TDL is formed on the upper surface of the second substrate 31 serving as the other main surface via the driving electrode DRVL and the insulating film 35. The protective film 33 is formed on the insulating film 35 so as to cover the sensing electrodes TDL.

The sensing electrode TDL and the concave/convex pattern UE1 (see FIG. 12) in the second embodiment can be the same as those described in the first embodiment except for the point that the sensing electrode TDL and the concave/convex pattern UE1 are formed on the insulating film 35. In addition, the protective film 33 in the second embodiment can be the same as that in the first embodiment except for the point that the protective film 33 is formed on the insulating film 35.

In the second embodiment, the common electrodes COML1 operate as driving electrodes of the liquid crystal display device 20, but do not operate as driving electrodes of the touch sensing device 30. The driving electrodes DRVL operate as driving electrodes of the touch sensing device 30, but do not operate as driving electrodes of the liquid crystal display device 20. Therefore, it is possible to independently perform the display operations by the common electrodes COML1 and the touch sensing operations by the driving electrodes DRVL in parallel to each other.

Note that the concave/convex pattern may be formed on the surface of a portion of the electrode terminal of the driving electrode DRVL on a main body portion side of the driving electrode DRVL. Alternatively, the concave/convex pattern may be formed on the second substrate 31 in a portion of the electrode terminal of the driving electrode DRVL positioned on the periphery of the portion on the main body portion side of the driving electrode DRVL. Here, the end portion of the insulating film 35 serving as a protective film is positioned on the concave/convex pattern. In this manner, by the provision of the concave/convex pattern, the position of the end portion of the insulating film 35 can be highly accurately adjusted when the insulating film 35 is formed.

Main Features and Effects of Present Embodiment

Also in the second embodiment, as similar to the first embodiment, the electrode substrate ES has the concave/convex pattern UE1. The concave/convex pattern UE1 is formed on the surface of the portion PR2 of the sensing electrode TDL formed in the region AR2 or is formed on the second substrate 31 in a portion of the region AR2 positioned on the periphery of the sensing electrode TDL. That is, the concave/convex pattern UE1 is formed on the sensing electrode TDL or the second substrate 31 in the region AR2. Also, in the regions AR1 and AR2 the end portion EP1 of the protective film 33 on the region AR3 side formed so as to cover the sensing electrode TDL is positioned on the concave/convex pattern UE1.

With this, such effects that, as similar to those of the first embodiment, the position of the end portion EP1 of the protective film 33 can be highly accurately adjusted when the protective film 33 is formed so as to cover the sensing electrode TDL, and the variation of the connection resistance between the sensing electrode TDL and the electrode terminal ET2 among the plurality of sensing electrodes TDL can be prevented or suppressed can be obtained. Also, as similar to the first embodiment, the performance of a display device including such an electrode substrate can be improved.

Further, in the second embodiment, the common electrode COML1 of the display device and the driving electrode DRVL of the input device are separately formed. Consequently, since it is not necessary to separate the display period in which display operations are performed by the common electrodes COML1 and the touch sensing period in which touch sensing operations are performed by the driving electrodes DRVL, the detection performance of touch sensing can be improved, for example, the sensing speed of touch sensing can be apparently improved.

In the first and second embodiments, an example in which a display device provided with a touch panel as an input device is applied to an in-cell liquid crystal display device with a touch sensing function has been described. However, the display device provided with a touch panel as an input device may be applied to an on-cell liquid crystal display device with a touch sensing function. The on-cell liquid crystal display device with a touch sensing function indicates a liquid crystal display device with a touch sensing function in which neither the driving electrodes nor the sensing electrodes included in the touch panel are incorporated in the liquid crystal display device.

<Input Device>

Figure 38:
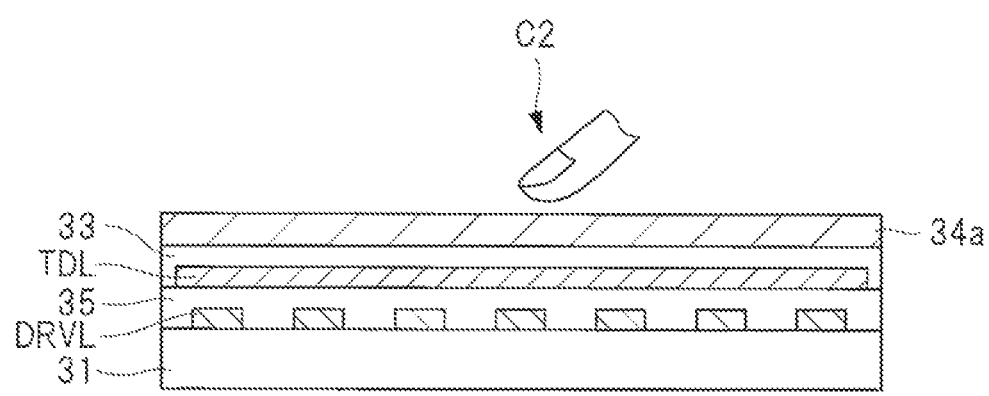
FIG. 38 is a cross-sectional view illustrating an input device as a first modification example of the second embodiment.

FIG. 38 is a cross-sectional view illustrating an input device as a first modification example of the second embodiment. In the example illustrated in FIG. 38, the input device has a structure substantially similar to that of the second substrate 31 and a portion positioned upper than the second substrate 31 in the display device with a touch sensing function illustrated in FIG. 37.

As illustrated in FIG. 38, the input device as the first modification example of the second embodiment includes a second substrate 31, a driving electrode DRVL, an insulating film 35, a sensing electrode TDL, and a protective film 33. Also in FIG. 38, in place of the polarizing plate 34 illustrated in FIG. 37, a third substrate 34a formed of a cover glass is provided. Furthermore, although omitted in FIG. 38, the sensing electrode TDL is connected to, for example, the touch sensing unit 40 illustrated in FIG. 1. Therefore, the input device as the first modification example of the second embodiment includes the second substrate 31, the driving electrode DRVL, the sensing electrode TDL, and the sensing circuit as, for example, a touch sensing unit 40 illustrated in FIG. 1, the protective film 33, and the third substrate 34a.

Also in this input device, when the protective film 33 is formed so as to cover the sensing electrode TDL, the position of the end portion EP1 of the protective film 33 can be highly accurately adjusted, and therefore, effects similar to the effects included in the display device of the second embodiment can be provided.

<Self-Capacitance-Type Touch Sensing Function>

In the first embodiment, the second embodiment, and the first modification example of the second embodiment, the explanation has been made for the example in which a mutual-capacitance-type touch panel provided with a common electrode operating as a driving electrode and a sensing electrode is applied as the touch panel. However, a self-capacitance-type touch panel provided with only a sensing electrode can be applied as the touch panel.

Figure 39:
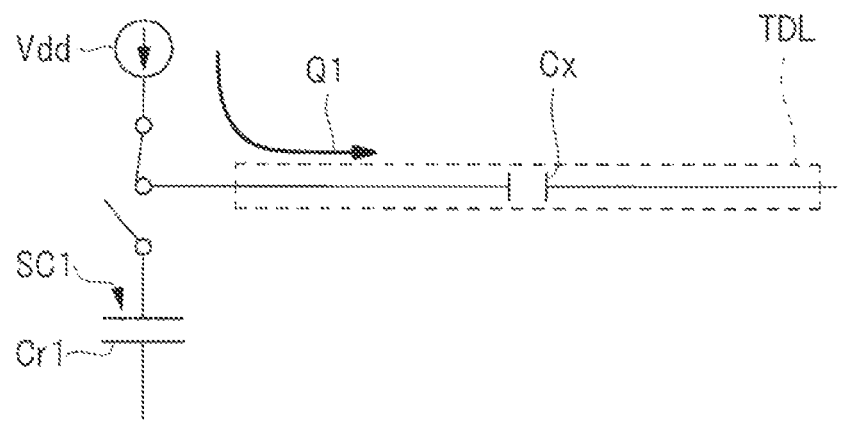
FIG. 39 is an explanatory diagram illustrating an electrical connection state of a self-capacitance-type sensing electrode.
Figure 40:
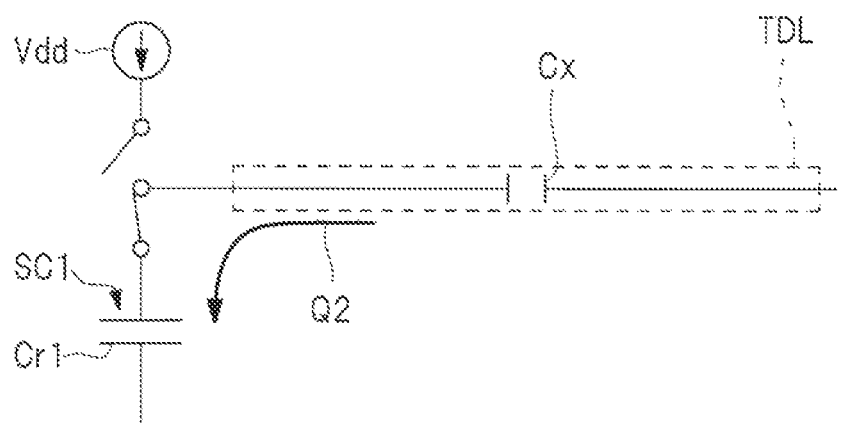
FIG. 40 is an explanatory diagram illustrating an electrical connection state of a self-capacitance-type sensing electrode.

FIG. 39 and FIG. 40 are explanatory diagrams illustrating an electrical connection state of a self-capacitance-type sensing electrode.

In a self-capacitance-type touch panel, as illustrated in FIG. 39, when the sensing electrode TDL with a capacitance Cx is disconnected from a sensing circuit SC1 with a capacitance Cr1 and is electrically connected to a power supply Vdd, a charge quantity Q1 is accumulated in the sensing electrode TDL with the capacitance Cx. Next, as illustrated in FIG. 40, when the sensing electrode TDL with the capacitance Cx is disconnected from the power supply Vdd and is electrically connected to the sensing circuit SC1 with the capacitance Cr1, a charge quantity Q2 flowing to the sensing circuit SC1 is sensed.

Here, when a finger makes contact with or approach the sensing electrode TDL, a capacitance by the finger changes the capacitance Cx of the sensing electrode TDL. When the sensing electrode TDL is connected to the sensing circuit SC1, the charge quantity Q2 flowing out to the sensing circuit SC1 is also changed. Therefore, by measuring the flowing-out charge quantity Q2 by the sensing circuit SC1 to sense a change of the capacitance Cx of the sensing electrode TDL, it can be determined whether a finger makes contact with or approach the sensing electrode TDL.

When the input device described by using FIG. 38 is an input device provided with a self-capacitance-type touch sensing function, the sensing electrode TDL is provided in place of the driving electrode DRVL. When this input device provided with a self-capacitance-type touch sensing function is taken as the input device of the second modification example of the second embodiment, the input device of the second modification example of the second embodiment includes the second substrate 31, the sensing electrode TDL, a sensing circuit such as the touch sensing unit 40 illustrated in FIG. 1, the protective film 33, and the third substrate 34a. Also, the input device of the second modification example of the second embodiment may include a plurality of sensing electrodes TDL each extending in the X axis direction (see FIG. 7) and arrayed so as to be spaced apart from each other in the Y axis direction (see FIG. 7) and a plurality of sensing electrodes TDL each extending in the Y axis direction and arrayed so as to be spaced apart from each other in the X axis direction. In this case, by sensing a change of the capacitance Cx of each of the plurality of sensing electrodes TDL extending in each direction, the input position can be two-dimensionally sensed.

Also in this input device, when the protective film 33 is formed so as to cover the sensing electrode TDL, the position of the end portion EP1 of the protective film 33 can be highly accurately adjusted, and therefore, effects similar to effects included in the display device of the second embodiment can be provided.

Third Embodiment

Next, electronic devices as application examples of the display devices described in the first embodiment and the second embodiment will be described with reference to FIG. 41 to FIG. 47. The display devices of each of the first embodiment and the second embodiment are applicable to electronic devices of all kinds of fields such as in-car apparatus such as HUD (Head Up Display) and a navigation system, television apparatus, digital cameras, notebook PCs, portable terminal devices such as mobile phones and video cameras. In other words, the display devices of the first embodiment and the second embodiment can be applied to electronic devices of all kinds of fields which display video signals input from outside or generated inside as images or video pictures.

<Television Apparatus>

Figure 41:
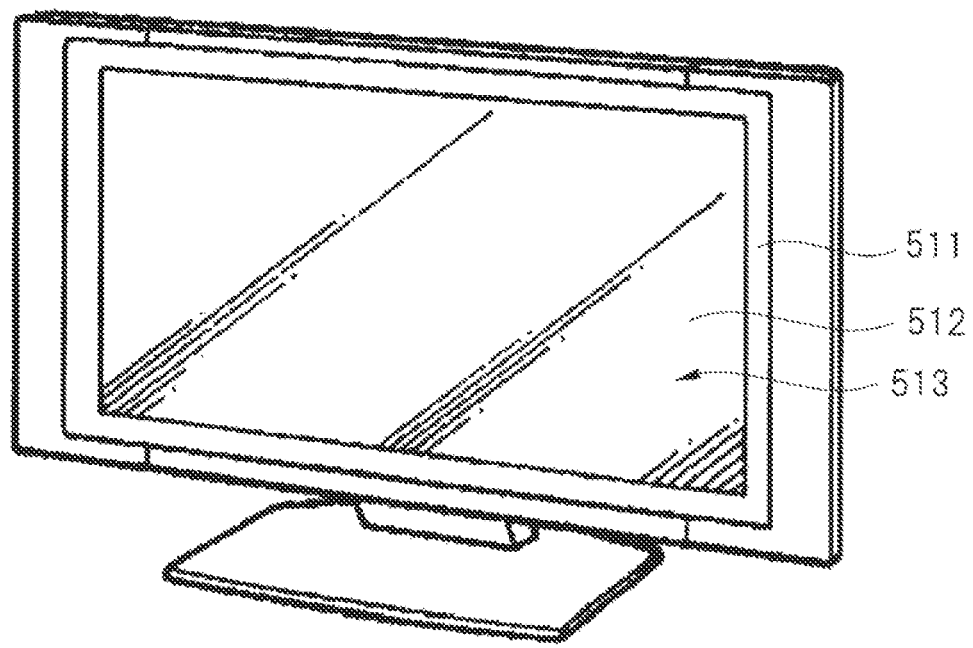
FIG. 41 is a perspective view illustrating an external appearance of a television apparatus as one example of an electronic device according to a third embodiment.

FIG. 41 is a perspective view illustrating an external appearance of a television apparatus as one example of an electronic device of the third embodiment. This television apparatus includes, for example, a video display screen unit 513 including a front panel 511 and a filter glass 512, and the video display screen unit 513 is made up of the in-cell display device with a touch sensing function or the on-cell display device with a touch sensing function described in the first embodiment and the second embodiment.

<Digital Camera>

Figure 42:
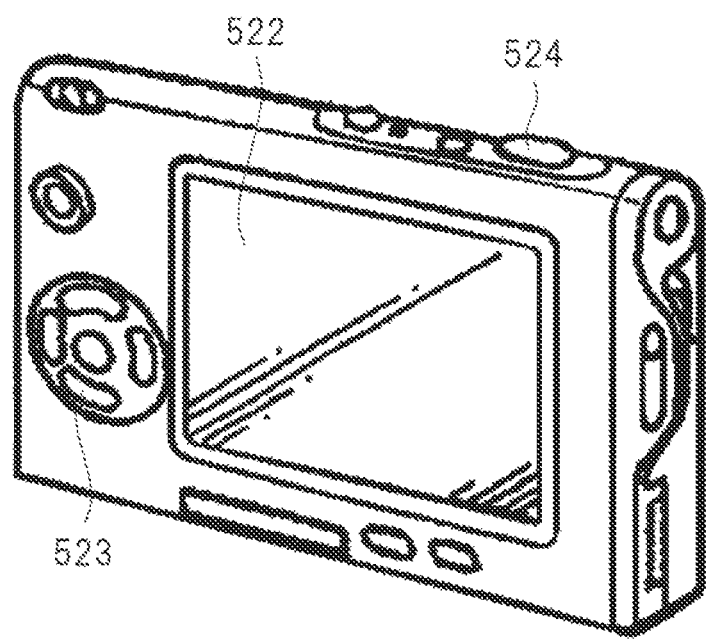
FIG. 42 is a perspective view illustrating an external appearance of a digital camera as one example of an electronic device according to the third embodiment.

FIG. 42 is a perspective view illustrating an external appearance of a digital camera as one example of an electronic device of the third embodiment. The digital camera includes, for example, a display unit 522, a menu switch 523 and a shutter button 524, and the display unit 522 is made up of the in-cell display device with a touch sensing function or the on-cell display device with a touch sensing function described in the first embodiment and the second embodiment.

<Notebook PC>

Figure 43:
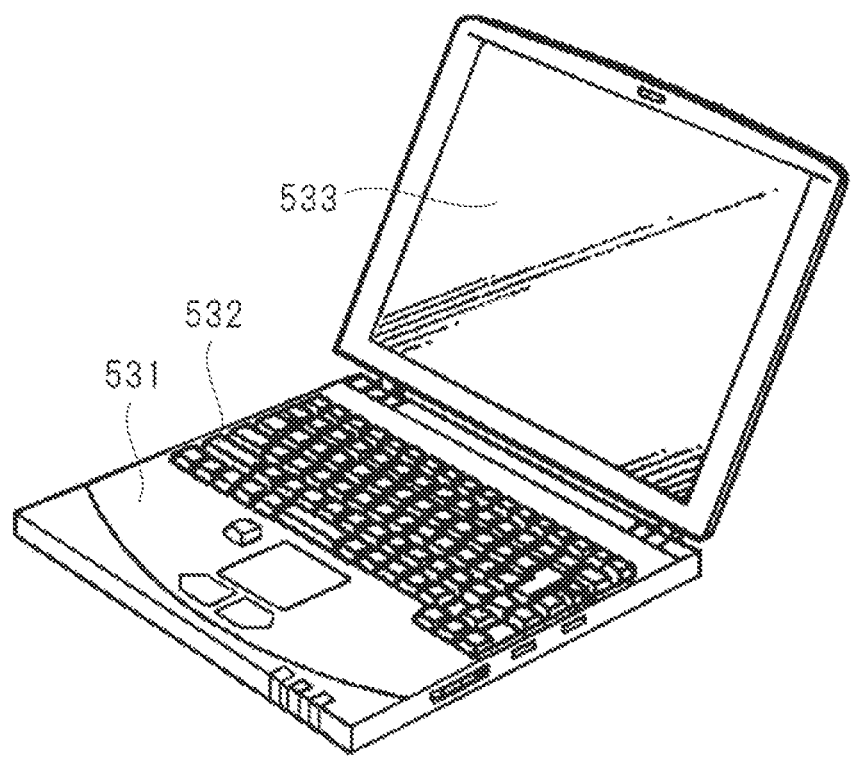
FIG. 43 is a perspective view illustrating an external appearance of a notebook PC as one example of an electronic device according to the third embodiment.

FIG. 43 is a perspective view illustrating an external appearance of a notebook PC as one example of an electronic device of the third embodiment. The notebook PC includes, for example, a main body 531, a keyboard 532 for input operations of characters or the like, and a display unit 533 for displaying images, and the display unit 533 is made up of the in-cell display device with a touch sensing function or the on-cell display device with a touch sensing function described in the first embodiment and the second embodiment.

<Video Camera>

Figure 44:
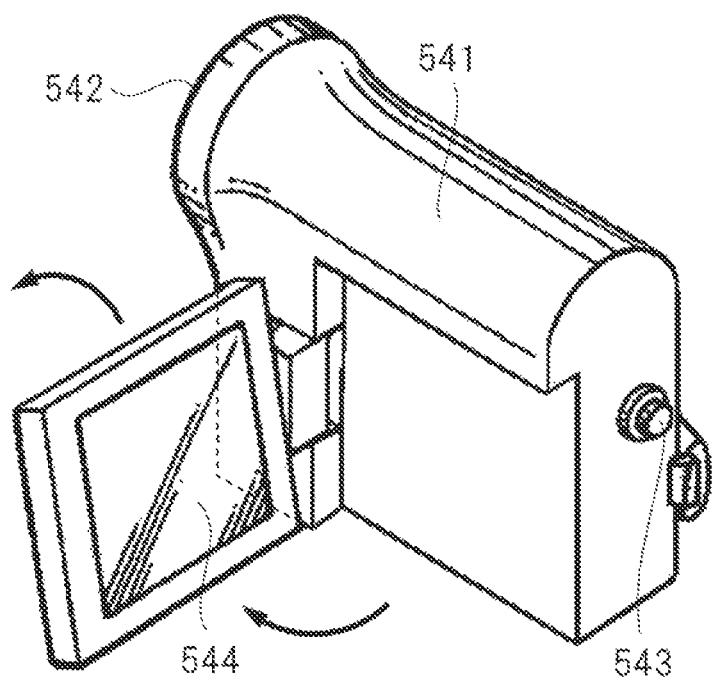
FIG. 44 is a perspective view illustrating an external appearance of a video camera as one example of an electronic device according to the third embodiment.

FIG. 44 is a perspective view illustrating an external appearance of a video camera as one example of an electronic device of the third embodiment. The video camera includes, for example, a main body portion 541, a lens 542 for shooting objects provided on a front surface of the main body portion 541, a start/stop switch 543 for shooting and a display unit 544, and the display unit 544 is made up of the in-cell display device with a touch sensing function or the on-cell display device with a touch sensing function described in the first embodiment and the second embodiment.

<Mobile Phone>

Figure 45:
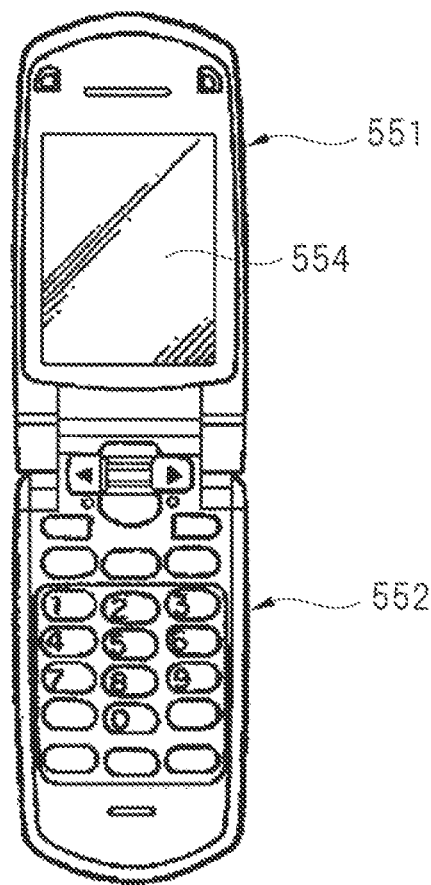
FIG. 45 is a front view illustrating an external appearance of a mobile phone as one example of an electronic device according to the third embodiment.
Figure 46:
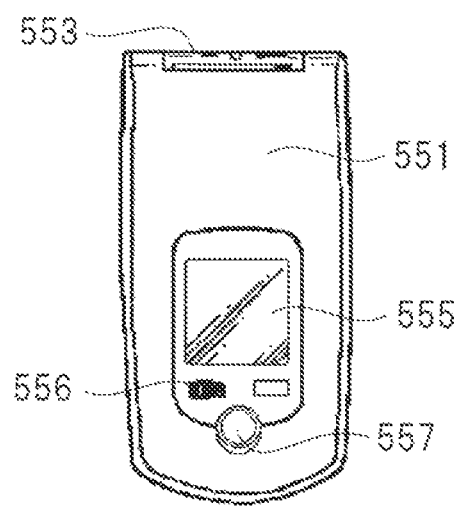
FIG. 46 is a front view illustrating an external appearance of a mobile phone as one example of an electronic device according to the third embodiment.

FIG. 45 and FIG. 46 are front views illustrating an external appearance of a mobile phone as one example of an electronic device of the third embodiment. FIG. 46 illustrates a state in which the mobile phone illustrated in FIG. 45 is folded. The mobile phone is composed of, for example, an upper housing 551 and a lower housing 552 coupled by a coupling portion (hinge portion) 553 and includes a display 554, a sub-display 555, a picture light 556 and a camera 557, and the display 554 or the sub-display 555 is made up of the display device with a touch sensing function described in the first embodiment and the second embodiment.

<Smartphone>

Figure 47:
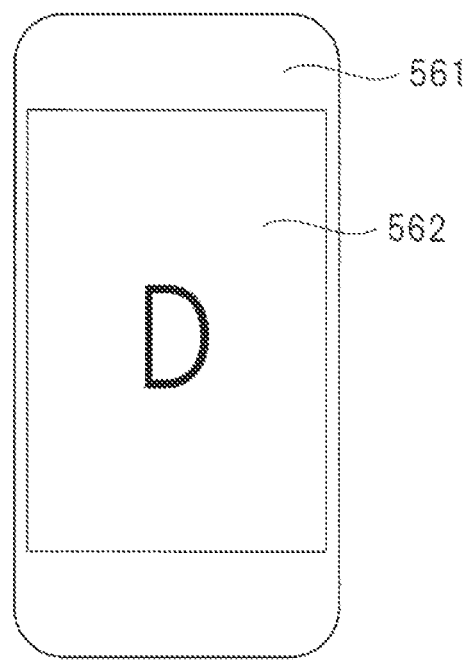
FIG. 47 is a front view illustrating an external appearance of a smartphone as one example of an electronic device according to the third embodiment.

FIG. 47 is a front view illustrating an external appearance of a smartphone as one example of an electronic device of the third embodiment. The mobile phone includes, for example, a housing 561 and a touch screen 562. The touch screen 562 is composed of, for example, a touch panel serving as an input device and a liquid crystal panel serving as a display unit, and is made up of the in-cell display device with a touch sensing function or the on-cell display device with a touch sensing function described in the first embodiment and the second embodiment.

The touch panel of the touch screen 562 is, for example, the touch sensing device 30 provided in the display device 10 with a touch sensing function of the display device 1 described with reference to FIG. 1. When a user makes gesture operations such as a touch operation or a drag operation on the touch panel with a finger or a touch pen, the touch panel of the touch screen 562 senses coordinates of the positions corresponding to the gesture operations and outputs them to a control unit (not shown).

The liquid crystal panel of the touch screen 562 is, for example, the liquid crystal display device 20 provided in the display device 10 with a touch sensing function of the display device 1 described with reference to FIG. 1. Further, the liquid crystal panel of the touch screen 562 made up of the display device 1 includes, for example, the driving electrode driver 14 of the display device 1 described with reference to FIG. 1. The driving electrode driver 14 applies voltage as image signals to the pixel electrodes 22 (see FIG. 9) provided in each of the plurality of sub-pixels SPix (see FIG. 10) arrayed in a matrix form at respectively constant timings, thereby displaying images.

Main Features and Effects of Present Embodiment

In the third embodiment, the display devices of each of the first embodiment and the second embodiment can be used as the display devices provided in the above-described various electronic devices. Consequently, in the display devices provided in the above-described various electronic devices, the same effects as those of the first embodiment and the second embodiment can be obtained. Namely, when forming the protective film 33 so as to cover the sensing electrode TDL, the position of the end portion EP1 of the protective film 33 can be highly accurately adjusted. Accordingly, it is possible to improve the performance of the above-described various electronic devices, or the number of steps of the manufacturing process of the above-described various electronic devices can be reduced.

In the foregoing, the invention made by the inventors of the present invention has been concretely described based on the embodiments. However, it is needless to say that the present invention is not limited to the foregoing embodiments and various modifications and alterations can be made within the scope of the present invention.

Further, in the foregoing embodiments, the cases of a liquid crystal display device have been illustrated as disclosure examples, but all kinds of flat-panel display devices such as an organic EL display device, other self-luminous type display devices and electronic paper display devices having electrophoresis elements may be listed as other application examples. Further, it goes without saying that the present invention is applicable to small, medium and large sized devices without any particular limitation.

In the category of the idea of the present invention, a person with ordinary skill in the art can conceive various modified examples and revised examples, and such modified examples and revised examples are also deemed to belong to the scope of the present invention.

For example, the examples obtained by appropriately making the additions, deletions or design changes of components or the additions, deletions or condition changes of processes to respective embodiments described above by a person with ordinary skill in the art also belong to the scope of the present invention as long as they include the gist of the present invention.

The present invention is effectively applied to an electrode substrate, a display device, an input device, and a method of manufacturing an electrode substrate.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A detection device comprising:
a substrate; and
a detection electrode including a lower layer portion and an upper layer portion which is on and in physical contact with the lower layer portion, the lower layer portion being between the substrate and the upper layer portion,
wherein the upper layer portion has a first region and a second region which are located continuously,
the first region overlaps the lower layer portion in a plan view and is in physical contact with the lower layer portion, and
the second region does not overlap the lower layer portion in a plan view and is not in physical contact with any conductive member in a thickness direction of the detection electrode.

2. The detection device according to claim 1, wherein the second region is a single layer.

3. The detection device according to claim 1, wherein a thickness of the second region is a thickness of an entirety of the detection electrode.

4. The detection device according to claim 1, wherein the second region is not in physical contact with any conductive member except for the first region.

5. The detection device according to claim 1, wherein the detection electrode has other regions which are not the second region, and
the second region does not overlap the other regions.

6. The detection device according to claim 1, wherein the first and second regions are covered with a protective film.

7. The detection device according to claim 1, wherein the second region is located at both sides of the first region in a plan view.

8. The detection device according to claim 1, further comprising a flexible printed circuit with a terminal,
wherein the terminal overlaps the lower layer portion and the upper layer portion in a plan view.

9. The detection device according to claim 8, wherein the upper layer portion has a third region that is a different region from the first and second regions, and
the third region overlaps the terminal via an anisotropic conductive film.

10. The detection device according to claim 9, wherein the first and second regions are covered with a protective film, and
the third region is not covered with the protective film.

11. A detection device comprising:
a substrate; and
a detection electrode including a lower layer portion and an upper layer portion which is on and in physical contact with the lower layer portion, the lower layer portion being between the substrate and the upper layer portion,
wherein the upper layer portion has a first region and a second region which are located continuously,
the first region overlaps the lower layer portion in a plan view and is in physical contact with the lower layer portion,
the second region protrudes from the first region, and
the detection electrode has a portion which does not have the second region, the portion being a part of the detection electrode and including an entirety of the detection electrode in the thickness direction.

12. The detection device according to claim 11, wherein the second region is a single layer.

13. The detection device according to claim 11, wherein a thickness of the second region is a thickness of an entirety of the detection electrode.

14. The detection device according to claim 11, wherein the second region is not in physical contact with any conductive member except for the first region.

15. The detection device according to claim 11, wherein the detection electrode has other regions which are not the second region, and
the second region does not overlap the other regions.

16. The detection device according to claim 11, wherein the first and second regions are covered with a protective film.

17. The detection device according to claim 11, wherein the second region is located at both sides of the first region in a plan view.

18. The detection device according to claim 11, further comprising a flexible printed circuit with a terminal,
wherein the terminal overlaps the lower layer portion and the upper layer portion in a plan view.

19. The detection device according to claim 18, wherein the upper layer portion has a third region that is a different region from the first and second regions, and
the third region overlaps the terminal via an anisotropic conductive film.

20. The detection device according to claim 19, wherein the first and second regions are covered with a protective film, and
the third region is not covered with the protective film.

* * * * *